(12) United States Patent
Lochtefeld et al.

(10) Patent No.: US 7,074,623 B2
(45) Date of Patent: Jul. 11, 2006

(54) METHODS OF FORMING STRAINED-SEMICONDUCTOR-ON-INSULATOR FINFET DEVICE STRUCTURES

(75) Inventors: Anthony J. Lochtefeld, Somerville, MA (US); Thomas A. Langdo, Cambridge, MA (US); Richard Hammond, Harriseahead (GB); Matthew T. Currie, Windham, NH (US); Glyn Braithwaite, Hooksett, NH (US); Eugene A. Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 30 days.

(21) Appl. No.: 10/456,708

(22) Filed: Jun. 6, 2003

(65) Prior Publication Data

US 2004/0031979 A1    Feb. 19, 2004

Related U.S. Application Data

(60) Provisional application No. 60/416,000, filed on Oct. 4, 2002, provisional application No. 60/404,058, filed on Aug. 15, 2002, provisional application No. 60/386,968, filed on Jun. 7, 2002.

(51) Int. Cl.
*H01L 21/335* (2006.01)
*H01L 21/00* (2006.01)
*H01L 21/84* (2006.01)
*H01L 21/8234* (2006.01)
*H01L 21/336* (2006.01)

(52) U.S. Cl. .................. 438/3; 438/142; 438/149; 438/151; 438/156; 438/161; 438/157; 438/159; 438/163; 438/176; 438/195; 438/212; 438/275; 438/279; 438/283; 438/286; 438/294; 438/300; 438/301; 438/303; 438/385; 438/382; 438/574; 438/576; 438/585; 438/589

(58) Field of Classification Search ................ 257/347, 257/349, 192, 194; 438/151
See application file for complete search history.

(56) References Cited

U.S. PATENT DOCUMENTS

| | | |
|---|---|---|
| 4,010,045 A | 3/1977 | Ruehrwein |
| 4,704,302 A | 11/1987 | Bruel et al. |
| 4,710,788 A | 12/1987 | Dämbkes et al. |
| 4,969,031 A | 11/1990 | Kobayashi et al. |
| 4,987,462 A | 1/1991 | Kim et al. |
| 4,990,979 A | 2/1991 | Otto |
| 4,997,776 A | 3/1991 | Harame et al. |
| 5,013,681 A | 5/1991 | Godbey et al. |
| 5,089,872 A | 2/1992 | Ozturk et al. |
| 5,091,767 A | 2/1992 | Bean et al. |

(Continued)

FOREIGN PATENT DOCUMENTS

DE    41 01 167    7/1992

(Continued)

OTHER PUBLICATIONS

IBM Technical Disclosure Bulletin, vol. 32, No. 8A, Jan. 1990, "Optimal Growth Technique and Structure for Strain Relaxation of SI-Ge Layers on Si Substrates", pp. 330-331.

(Continued)

*Primary Examiner*—Carl Whitehead, Jr.
*Assistant Examiner*—James M. Mitchell
(74) *Attorney, Agent, or Firm*—Goodwin Procter LLP

(57) ABSTRACT

The benefits of strained semiconductors are combined with silicon-on-insulator approaches to substrate and device fabrication.

6 Claims, 46 Drawing Sheets

U.S. PATENT DOCUMENTS

| | | |
|---|---|---|
| 5,155,571 A | 10/1992 | Wang et al. |
| 5,166,084 A | 11/1992 | Pfiester |
| 5,177,583 A | 1/1993 | Endo et al. |
| 5,202,284 A | 4/1993 | Kamins et al. |
| 5,207,864 A | 5/1993 | Bhat et al. |
| 5,208,182 A | 5/1993 | Narayan et al. |
| 5,212,110 A | 5/1993 | Pfiester et al. |
| 5,221,413 A | 6/1993 | Brasen et al. |
| 5,240,876 A | 8/1993 | Gaul et al. |
| 5,241,197 A | 8/1993 | Murakami et al. |
| 5,242,847 A | 9/1993 | Ozturk et al. |
| 5,250,445 A | 10/1993 | Bean et al. |
| 5,285,086 A | 2/1994 | Fitzgerald |
| 5,291,439 A | 3/1994 | Kauffmann et al. |
| 5,298,452 A | 3/1994 | Meyerson |
| 5,310,451 A | 5/1994 | Tejwani et al. |
| 5,316,958 A | 5/1994 | Meyerson |
| 5,346,848 A | 9/1994 | Grupen-Shemansky et al. |
| 5,374,564 A | 12/1994 | Bruel |
| 5,399,522 A | 3/1995 | Ohori |
| 5,413,679 A | 5/1995 | Godbey |
| 5,424,243 A | 6/1995 | Takasaki |
| 5,426,069 A | 6/1995 | Selvakumar et al. |
| 5,426,316 A | 6/1995 | Mohammad |
| 5,439,843 A | 8/1995 | Sakaguchi et al. |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitahara et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,548,128 A | 8/1996 | Soref et al. |
| 5,572,043 A | 11/1996 | Shimizu et al. |
| 5,596,527 A | 1/1997 | Tomioka et al. |
| 5,607,876 A | 3/1997 | Biegelsen et al. |
| 5,617,351 A | 4/1997 | Bertin et al. |
| 5,630,905 A | 5/1997 | Lynch et al. |
| 5,659,187 A | 8/1997 | Legoues et al. |
| 5,683,934 A | 11/1997 | Candelaria |
| 5,698,869 A * | 12/1997 | Yoshimi et al. ............. 257/192 |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,821,577 A | 10/1998 | Crabbé et al. |
| 5,847,419 A | 12/1998 | Imai et al. |
| 5,863,830 A | 1/1999 | Bruel et al. |
| 5,877,070 A | 3/1999 | Goesele et al. |
| 5,882,987 A | 3/1999 | Srikrishnan |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,923,046 A | 7/1999 | Tezuka et al. |
| 5,943,560 A | 8/1999 | Chang et al. |
| 5,963,817 A | 10/1999 | Chu et al. |
| 5,966,622 A | 10/1999 | Levine et al. |
| 5,993,677 A | 11/1999 | Biasse et al. |
| 5,998,807 A | 12/1999 | Lustig et al. |
| 6,013,134 A | 1/2000 | Chu et al. |
| 6,013,563 A | 1/2000 | Henley et al. |
| 6,020,252 A | 2/2000 | Aspar et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,074,919 A | 6/2000 | Gardner et al. |
| 6,096,590 A | 8/2000 | Chan et al. |
| 6,103,559 A | 8/2000 | Gardner et al. |
| 6,103,597 A | 8/2000 | Aspar et al. |
| 6,103,599 A | 8/2000 | Henley et al. |
| 6,107,653 A | 8/2000 | Fitzgerald |
| 6,111,267 A | 8/2000 | Fischer et al. |
| 6,117,750 A | 9/2000 | Bensahel et al. |
| 6,130,453 A | 10/2000 | Mei et al. |
| 6,133,799 A | 10/2000 | Favors, Jr. et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,160,303 A | 12/2000 | Fattaruso |
| 6,162,688 A | 12/2000 | Gardner et al. |
| 6,162,705 A | 12/2000 | Henley et al. |
| 6,184,111 B1 | 2/2001 | Henley et al. |
| 6,190,998 B1 | 2/2001 | Bruel et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,210,988 B1 | 4/2001 | Howe et al. |
| 6,218,677 B1 | 4/2001 | Broekaert |
| 6,225,192 B1 | 5/2001 | Aspar et al. |
| 6,228,694 B1 | 5/2001 | Doyle et al. |
| 6,232,138 B1 | 5/2001 | Fitzgerald et al. |
| 6,235,567 B1 | 5/2001 | Huang |
| 6,235,568 B1 | 5/2001 | Murthy et al. |
| 6,242,324 B1 | 6/2001 | Kub et al. |
| 6,249,022 B1 | 6/2001 | Lin et al. |
| 6,251,751 B1 | 6/2001 | Chu et al. |
| 6,251,755 B1 | 6/2001 | Furukawa et al. |
| 6,261,929 B1 | 7/2001 | Gehrke et al. |
| 6,266,278 B1 | 7/2001 | Harari et al. |
| 6,271,551 B1 | 8/2001 | Schmitz et al. |
| 6,271,726 B1 | 8/2001 | Fransis et al. |
| 6,281,532 B1 | 8/2001 | Doyle et al. |
| 6,290,804 B1 | 9/2001 | Henley et al. |
| 6,291,321 B1 | 9/2001 | Fitzgerald |
| 6,303,468 B1 | 10/2001 | Aspar et al. |
| 6,313,016 B1 | 11/2001 | Kibbel et al. |
| 6,316,301 B1 | 11/2001 | Kant |
| 6,323,108 B1 | 11/2001 | Kub et al. |
| 6,326,664 B1 | 12/2001 | Chau et al. |
| 6,326,667 B1 | 12/2001 | Sugiyama et al. |
| 6,329,063 B1 | 12/2001 | Lo et al. |
| 6,335,546 B1 | 1/2002 | Tsuda et al. |
| 6,339,232 B1 | 1/2002 | Takagi |
| 6,344,417 B1 | 2/2002 | Usenko |
| 6,346,459 B1 | 2/2002 | Usenko et al. |
| 6,350,311 B1 | 2/2002 | Chin et al. |
| 6,350,993 B1 | 2/2002 | Chu et al. |
| 6,352,909 B1 | 3/2002 | Usenko |
| 6,355,493 B1 | 3/2002 | Usenko |
| 6,368,733 B1 | 4/2002 | Nishinaga |
| 6,368,938 B1 | 4/2002 | Usenko |
| 6,369,438 B1 | 4/2002 | Sugiyama et al. |
| 6,372,356 B1 | 4/2002 | Thornton et al. |
| 6,372,593 B1 | 4/2002 | Hattori et al. |
| 6,372,609 B1 | 4/2002 | Aga et al. |
| 6,387,829 B1 | 5/2002 | Usenko et al. |
| 6,391,740 B1 | 5/2002 | Cheung et al. |
| 6,399,970 B1 | 6/2002 | Kubo et al. |
| 6,403,975 B1 | 6/2002 | Brunner et al. |

| | | | | | |
|---|---|---|---|---|---|
| 6,407,406 B1 | 6/2002 | Tezuka | 2002/0063292 A1 | 5/2002 | Armstrong et al. |
| 6,410,371 B1 | 6/2002 | Yu et al. | 2002/0084000 A1 | 7/2002 | Fitzgerald |
| 6,425,951 B1 | 7/2002 | Chu et al. | 2002/0096717 A1 | 7/2002 | Chu et al. |
| 6,429,061 B1 | 8/2002 | Rim | 2002/0100942 A1 | 8/2002 | Fitzgerald et al. |
| 6,445,016 B1 | 9/2002 | An et al. | 2002/0123167 A1 | 9/2002 | Fitzgerald |
| 6,448,152 B1 | 9/2002 | Henley et al. | 2002/0123183 A1 | 9/2002 | Fitzgerald |
| 6,455,397 B1 | 9/2002 | Belford | 2002/0123197 A1 | 9/2002 | Fitzgerald et al. |
| 6,458,672 B1 | 10/2002 | Henley et al. | 2002/0125471 A1 | 9/2002 | Fitzgerald et al. |
| 6,475,072 B1 | 11/2002 | Canaperi et al. | 2002/0125497 A1 | 9/2002 | Fitzgerald |
| 6,489,639 B1 | 12/2002 | Hoke et al. | 2002/0167048 A1* | 11/2002 | Tweet et al. ................. 257/347 |
| 6,514,836 B1 | 2/2003 | Belford | 2002/0168864 A1 | 11/2002 | Cheng et al. |
| 6,515,335 B1 | 2/2003 | Christiansen et al. | 2002/0190284 A1 | 12/2002 | Murthy et al. |
| 6,521,041 B1 | 2/2003 | Wu et al. | 2003/0003679 A1 | 1/2003 | Doyle et al. |
| 6,524,935 B1 | 2/2003 | Canaperi et al. | 2003/0006461 A1* | 1/2003 | Tezuka et al. ............... 257/347 |
| 6,534,381 B1 | 3/2003 | Cheung et al. | 2003/0013305 A1 | 1/2003 | Sugii et al. |
| 6,555,839 B1 | 4/2003 | Fitzgerald | 2003/0013323 A1 | 1/2003 | Hammond et al. |
| 6,563,152 B1 | 5/2003 | Roberds et al. | 2003/0025131 A1 | 2/2003 | Lee et al. |
| 6,573,126 B1 | 6/2003 | Cheng et al. | 2003/0034529 A1 | 2/2003 | Fitzgerald et al. |
| 6,583,015 B1 | 6/2003 | Fitzgerald et al. | 2003/0057439 A1 | 3/2003 | Fitzgerald |
| 6,583,437 B1 | 6/2003 | Mizuno et al. | 2003/0077867 A1 | 4/2003 | Fitzgerald |
| 6,591,321 B1 | 7/2003 | Arimilli et al. | 2003/0080361 A1 | 5/2003 | Murthy et al. |
| 6,593,191 B1 | 7/2003 | Fitzgerald | 2003/0102498 A1 | 6/2003 | Braithwaite et al. |
| 6,593,625 B1 | 7/2003 | Christiansen et al. | 2003/0119280 A1 | 6/2003 | Lee et al. |
| 6,596,610 B1 | 7/2003 | Kuwabara et al. | 2003/0127646 A1 | 7/2003 | Christiansen et al. |
| 6,597,016 B1 | 7/2003 | Yuki et al. | 2003/0139000 A1 | 7/2003 | Bedell et al. |
| 6,602,613 B1 | 8/2003 | Fitzgerald | 2003/0157787 A1 | 8/2003 | Murthy et al. |
| 6,603,156 B1 | 8/2003 | Rim | 2003/0160300 A1 | 8/2003 | Takenaka et al. |
| 6,605,498 B1 | 8/2003 | Murthy et al. | 2003/0178677 A1* | 9/2003 | Clark et al. ................. 257/347 |
| 6,607,948 B1 | 8/2003 | Sugiyama et al. | 2003/0178681 A1 | 9/2003 | Clark et al. |
| 6,621,131 B1 | 9/2003 | Murthy et al. | 2003/0178867 A1* | 9/2003 | Clark et al. ................. 257/347 |
| 6,624,047 B1 | 9/2003 | Sakaguchi et al. | 2003/0189229 A1 | 10/2003 | Mouli |
| 6,624,478 B1 | 9/2003 | Anderson et al. | 2003/0199126 A1 | 10/2003 | Chu et al. |
| 6,632,724 B1 | 10/2003 | Henley et al. | 2003/0201458 A1 | 10/2003 | Clark et al. |
| 6,635,909 B1* | 10/2003 | Clark et al. ................. 257/192 | 2003/0203600 A1 | 10/2003 | Chu et al. |
| 6,645,831 B1 | 11/2003 | Shaheen et al. | 2003/0207127 A1 | 11/2003 | Murthy et al. |
| 6,646,322 B1 | 11/2003 | Fitzgerald | 2003/0215990 A1 | 11/2003 | Fitzgerald et al. |
| 6,649,492 B1 | 11/2003 | Chu et al. | 2003/0218189 A1 | 11/2003 | Christiansen et al. |
| 6,656,271 B1 | 12/2003 | Yonchara et al. | 2003/0219957 A1 | 11/2003 | Kuwabara et al. |
| 6,657,223 B1 | 12/2003 | Wang et al. | 2003/0227036 A1 | 12/2003 | Sugiyama et al. |
| 6,664,169 B1 | 12/2003 | Iwasaki et al. | 2003/0227057 A1 | 12/2003 | Fitzgerald et al. |
| 6,674,150 B1 | 1/2004 | Takagi et al. | 2003/0230778 A1 | 12/2003 | Park et al. |
| 6,677,183 B1 | 1/2004 | Sakaguchi et al. | 2003/0232467 A1 | 12/2003 | Anderson et al. |
| 6,677,192 B1 | 1/2004 | Fitzgerald | 2004/0005740 A1 | 1/2004 | Lochtefeld et al. |
| 6,680,240 B1 | 1/2004 | Maszara | 2004/0007715 A1* | 1/2004 | Webb et al. ................. 257/192 |
| 6,680,260 B1 | 1/2004 | Akiyama et al. | 2004/0007724 A1 | 1/2004 | Murthy et al. |
| 6,690,043 B1 | 2/2004 | Usuda et al. | 2004/0009649 A1 | 1/2004 | Kub et al. |
| 6,703,144 B1 | 3/2004 | Fitzgerald | 2004/0012037 A1 | 1/2004 | Venkatesan et al. |
| 6,703,648 B1 | 3/2004 | Xiang et al. | 2004/0012075 A1 | 1/2004 | Bedell et al. |
| 6,703,688 B1 | 3/2004 | Fitzergald | 2004/0014276 A1 | 1/2004 | Murthy et al. |
| 6,706,614 B1 | 3/2004 | An et al. | 2004/0014304 A1 | 1/2004 | Bhattacharyya |
| 6,706,618 B1 | 3/2004 | Takisawa et al. | 2004/0018699 A1 | 1/2004 | Boyd et al. |
| 6,707,106 B1 | 3/2004 | Wristers et al. | 2004/0031990 A1 | 2/2004 | Jin et al. |
| 6,709,903 B1 | 3/2004 | Christiansen et al. | 2004/0041174 A1 | 3/2004 | Okihara |
| 6,709,909 B1 | 3/2004 | Mizuno et al. | 2004/0041210 A1 | 3/2004 | Mouli |
| 6,713,326 B1 | 3/2004 | Cheng et al. | 2004/0048091 A1 | 3/2004 | Sato et al. |
| 6,737,670 B1 | 5/2004 | Cheng et al. | 2004/0048454 A1 | 3/2004 | Sakaguchi |
| 6,743,684 B1 | 6/2004 | Liu | 2004/0051140 A1 | 3/2004 | Bhattacharyya |
| 6,750,130 B1 | 6/2004 | Fitzgerald | 2004/0053477 A1 | 3/2004 | Ghyselen et al. |
| 6,762,483 B1 | 7/2004 | Krivokapic et al. | 2004/0061191 A1 | 4/2004 | Paton et al. |
| 6,767,793 B1 | 7/2004 | Clark et al. | 2004/0070035 A1 | 4/2004 | Murthy et al. |
| 6,794,718 B1 | 9/2004 | Nowak et al. | 2004/0075149 A1 | 4/2004 | Fitzgerald et al. |
| 6,800,910 B1 | 10/2004 | Lin et al. | 2004/0084735 A1 | 5/2004 | Murthy et al. |
| 6,815,738 B1 | 11/2004 | Rim | 2004/0087114 A1 | 5/2004 | Xiang et al. |
| 6,828,214 B1 | 12/2004 | Notsu et al. | 2004/0099903 A1 | 5/2004 | Yeo et al. |
| 6,838,322 B1 | 1/2005 | Pham et al. | 2004/0119101 A1 | 6/2004 | Schrom et al. |
| 6,849,487 B1 | 2/2005 | Taylor, Jr. et al. | 2004/0142545 A1 | 7/2004 | Ngo et al. |
| 6,849,884 B1 | 2/2005 | Clark et al. | 2004/0173815 A1 | 9/2004 | Yeo et al. |
| 6,867,433 B1 | 3/2005 | Yeo et al. | 2004/0188760 A1* | 9/2004 | Skotnicki et al. ........... 257/347 |
| 6,900,502 B1 | 5/2005 | Ge et al. | 2004/0217430 A1 | 11/2004 | Chu |
| 2001/0003364 A1 | 6/2001 | Sugawara et al. | 2004/0256647 A1* | 12/2004 | Lee et al. .................... 257/289 |
| 2001/0007789 A1 | 7/2001 | Aspar et al. | 2005/0153486 A1* | 7/2005 | Xiang et al. ................. 438/149 |
| 2002/0043660 A1 | 4/2002 | Yamazaki et al. | 2005/0205934 A1* | 9/2005 | Lochtefeld et al. ......... 257/347 |
| 2002/0052084 A1 | 5/2002 | Fitzgerald | | | |

FOREIGN PATENT DOCUMENTS

| | | |
|---|---|---|
| EP | 0 514 018 | 11/1992 |
| EP | 0 587 520 | 3/1994 |
| EP | 0 683 522 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| GB | 2 342 777 | 4/2000 |
| JP | 61-141116 | 6/1986 |
| JP | 2-210816 | 8/1990 |
| JP | 3-036717 | 2/1991 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-106446 | 4/1995 |
| JP | 7-240372 | 9/1995 |
| JP | 9-219524 | 8/1997 |
| JP | 10-270685 | 10/1998 |
| JP | 11-233744 | 8/1999 |
| JP | 2000-021783 | 1/2000 |
| JP | 2000-31491 | 1/2000 |
| JP | 2001319935 | 5/2000 |
| JP | 2002-076334 | 3/2002 |
| JP | 2002-164520 | 6/2002 |
| JP | 2002-289533 | 10/2002 |
| WO | WO 98/59365 | 12/1998 |
| WO | WO 99/53539 | 10/1999 |
| WO | WO 00/48239 | 8/2000 |
| WO | WO 00/54338 | 9/2000 |
| WO | WO 01/022482 | 3/2001 |
| WO | WO 01/54202 | 7/2001 |
| WO | WO 01/93338 | 12/2001 |
| WO | WO 01/99169 A2 | 12/2001 |
| WO | WO 02/13262 | 2/2002 |
| WO | WO 02/15244 A2 | 2/2002 |
| WO | WO 02/27783 A1 | 4/2002 |
| WO | WO 02/47168 | 6/2002 |
| WO | WO 02/071488 | 9/2002 |
| WO | WO 02/071491 | 9/2002 |
| WO | WO 02/071495 A1 | 9/2002 |
| WO | WO 02/082514 A1 | 10/2002 |
| WO | WO 04/006311 A2 | 1/2004 |
| WO | WO 04/006326 A1 | 1/2004 |
| WO | WO 04/006327 A2 | 1/2004 |
| WO | WO 04/019403 A2 | 3/2004 |
| WO | WO 04/019404 A2 | 3/2004 |

OTHER PUBLICATIONS

Maszara, "Silicon-On-Insulator by Wafer Bonding: A Review," *Journal of the Electrochemical Society*, No. 1 (Jan. 1991) pp. 341-347.

Chang et al., "Selective Etching of SiGe/Si Heterostructures," *Journal of the Electrochemical*, No. 1 (Jan. 1991) pp. 202-204.

Fitzgerald et al., "Totally Relaxed $Ge_xSi_{1-x}$ Layers with Low Threading Diolocation Densities Grown on Si Substrates," *Applied Physics Letters*, vol. 59, No. 7 (Aug. 12, 1991) pp. 811-813.

Fitzgerald et al., "Relaxed $Ge_xSi_{1-x}$ structures for III-V integration with Si and high mobility two-dimensional electron gases in Si," AT & T Bell Laboratories, Murray Hill, NJ 07974 (1992) *American Vacuum Society*, pp. 1807-1819.

Feijoo et al., "Epitaxial Si-Ge Etch Stop Layers with Ethylene Diamine Pyrocatechol for Bonded and Etchback Silicon-on-Insulator," *Journal of Electronics Materials*, vol. 23, No. 6 (Jun. 1994) pp. 493-496.

Ismail, "Si/SiGe High-Speed Field-Effect Transistors," *Electron Devices Meeting*, Washington, D.C. (Dec. 10, 1995) pp. 20.1.1-20.1.4.

Sadek et al., "Design of Si/SiGe Heterojunction Complementary Metal-Oxide-Semiconductor Transistors," *IEEE Trans, Electron Devices* (Aug. 1996) pp. 1224-1232.

Usami et al., "Spectroscopic study of Si-based quantum wells with neighboring confinement structure," *Semicon. Sci. Technol.* (1997) (abstract).

König et al., "Design Rules for n-Type SiGe Hetero FETs," *Solid State Electronics*, vol. 41, No. 10 (1997), pp. 1541-1547.

Maiti et al., "Strained-Si heterostructure field effect transistors," *Semicond. Sci. Technol.*, vol. 13 (1998) pp. 1225-1246.

.Borenstein et al., "A New Ultra-Hard Etch-Stop Layer for High Precision Micromachining," *Proceedings of the 1999 12th IEEE International Conference on Micro Electro Mechanical Systems (MEMs)* (Jan. 17-21, 1999) pp. 205-210.

Ishikawa et al., "SiGe-on-insulator substrate using SiGe alloy grown Si(001)," *Applied Physics Letters*, vol. 75, No. 7 (Aug. 16, 1999) pp. 983-985.

Mizuno et al., "Electron and Hold Mobility Enhancement in Strained-Si MOSFET's on SiGe-on-Insulator Substrates Fabricated by SIMOX Technology," *IEEE Electron Device Letters*, vol. 21, No. 5 (May 2000) pp. 230-232.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000) pp. 161-163.

Hackbarth et al., "Alternatives to thick MBE-grown relaxed SiGe buffers," *Thin Solid Films*, vol. 369, No. 1-2 (Jul. 2000) pp. 148-151.

Barradas et al., "RBS analysis of MBE-grown SiGe/(001) Si heterostructure with thin, high Ge content SiGe channels for HMOS transistors," *Modern Physics Letters B* (2001) (abstract).

Zhang et al., "Demostration of a GaAs-Based Compliant Substrate Using Wafer Bonding and Substrate Removal Techniques," Electronic Materials and Processing Research Laboratory, Department of Electrical Engineering, University Park, PA 16802 (1998) pp. 25-28.

Bruel, "Silicon on Insulator Material Technology," *Electronic Letters*, vol. 13, No. 14 (Jul. 6, 1995) pp. 1201-1202.

Bruel et al., "®Smart Cut: A Promising New SOI Material Technology," *Proceedings 1995 IEEE International SOI Conference* (Oct. 1995) pp. 178-179.

Ishikawa et al., "Creation of Si-Ge-based SIMOX structures by low energy oxygen implantation," *Proceedings 1997 IEEE International SOI Conference* (Oct. 1997) pp. 16-17.

Huang et al., "High-quality strain-relaxed SiGe alloy grown on implanted silicon-on-insulator substrate," *Applied Physics Letters*, vol. 76, No. 19 (May 8, 2000) pp. 2680-2682.

Armstrong et al., "Design of Si/SiGe Heterojunction Complementary Metal-Oxide-Semiconductor Transistors," *IEDM Technical Digest* (1995) pp. 761-764.

Armstrong, "Technology for SiGe Heterostructure-Based CMOS Devices", Ph.D Thesis, Massachusetts Institute of Technology (1999) pp. 1-154.

Augusto et al., "Proposal for a New Process Flow for the Fabrication of Silicon-Based Complementary MOD-MOSFETs without Ion Implantation," *Thin Solid Films*, vol. 294, No. 1-2 (1997) pp. 254-258.

Bouillon et al., "Search for the optimal channel architecture for 0.18/0.12 µm bulk CMOS Experimental study," *IEEE* (1996) pp. 21.2.1-21.2.4.

Bufler et al., "Hole transport in strained $Si_{1-x}Ge_x$ alloys on Sil-yGey substrates," *Journal of Applied Physics*, vol. 84, No. 10 (Nov. 15, 1998) pp. 5597-5602.

Burghartz et al., "Microwave Inductors and Capacitors in Standard Multilevel Interconnect Silicon Technology", *IEEE Transactions on Microwave Theory and Techniques*, vol. 44, No. 1 (Jan. 1996) pp. 100-104.

Canaperi et al., "Preparation of a relaxed Si-Ge layer on an insulator in fabricating high-speed semiconductor devices with strained epitaxial films," International Business Machines Corporation, USA (2002) (abstract).

Carlin et al., "High-Efficiency GaAs-on-Si Solar Cells with High Voc Using Graded GeSi Buffers," *IEEE* (2000) pp. 1006-1011.

Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001) pp. 321-323.

Cheng et al., "Relaxed Silicon-Germanium on Insulator Substrate by Layer Transfer," *Journal of Electronic Materials*, vol. 30, No. 12 (2001) pp. L37-L39.

Cullis et al, "Growth ripples upon strained SiGe epitaxial layers on Si and misfit dislocation interactions," *Journal of Vacuum Science and Technology A*, vol. 12, No. 4 (Jul./Aug. 1994) pp. 1924-1931.

Currie et al., "Controlling Threading Dislocation in Ge on Si Using Graded SiGe Layers and Chemical-Mechanical Polishing," vol. 72 No. 14 (Apr. 6, 1998) pp. 1718-1720.

Currie et al., "Carrier mobilities and process stability of strained Si n- and p-MOSFETs on SiGe virtual substrates," *J. Vac. Sci. Technol. B.*, vol. 19, No. 6 (Nov./Dec. 2001) pp. 2268-2279.

Eaglesham et al., "Dislocation-Free Stranski-Kranstanow Growth of Ge on Si(100)," *Physical Review Letters*, vol. 64, No. 16 (Apr. 16, 1990) pp. 1943-1946.

Fischetti et al., "Band structure, deformation potentials, and carrier mobility in strained Si, Ge, and SiGe alloys," *J. Appl. Phys.*, vol. 80, No. 4 (Aug. 15, 1996) pp. 2234-2252.

Fischetti, "Long-range Coulomb interactions in small Si devices. Part II. Effective electron mobility in thin-oxide structures," *Journal of Applied Physics*, vol. 89, No. 2 (Jan. 15, 2001) pp. 1232-1250.

Fitzgerald et al., "Dislocation dynamics in relaxed graded compositions semiconductors," *Materials Science and Engineering B67* (1999) pp. 53-61.

Garone et al., "Silicon vapor phase epitaxial growth catalysis by the presence of germane," *Applied Physics Letter*, vol. 56, No. 13 (Mar. 26, 1990) pp. 1275-1277.

Gray and Meyer, "Phase-Locked Loops", *Analysis and Design of Analog Integrated Circuits* (1984) pp. 605-632.

Grützmacher et al., "Ge segregation in SiGe/Si heterostructures and its dependence on deposition technique and growth atmosphere," *Applied Physics Letters*, vol. 63, No. 18 (Nov. 1, 1993) pp. 2531-2533.

Hackbarth et al., "Strain relieved SiGe buffers for Si-based heterostructure field-effect transistors," *Journal of Crystal Growth*, vol. 201/202 (1999) pp. 734-738.

Herzog et al., "SiGe-based FETs: buffer issues and device results," *Thin Solid Films*, vol. 380 (2000) pp. 36-41.

Höck et al., "Carrier mobilities in modulation doped $Si_{1-x}Ge_x$ heterostructures with respect to FET applications," *Thin Solid Films*, vol. 336 (1998) pp. 141-144.

Höck et al., "High hole mobility in $Si_{0.17}Ge_{0.83}$ channel metal-oxide-semiconductor field-effect transistors grown by plasma-enhanced chemical vapor deposition," *Applied Physics Letters*, vol. 76, No. 26 (Jun. 26, 2000) pp. 3920-3922.

Höck et al., "High performance 0.25 µm p-type Ge/SiGe MODFETS," *Electronics Letters*, vol. 34, No. 19 (Sep. 17, 1998) pp. 1888-1889.

Huang et al., "The Impact of Scaling Down to Deep Submicron on CMOS RF Circuits", IEEE Journal of Solid-State Circuits, vol. 33, No. 7, Jul., 1998, pp. 1023-1036.

"2 Bit/Cell EEPROM Cell Using Band to Band Tunneling for Data Read-Out," IBM Technical Disclosure Bulletin, vol. 35, No. 4B (Sep. 1992) pp. 136-140.

Ismail et al., "Modulation-doped n-type Si/SiGe with inverted interface," *Appl. Phys. Lett.*, vol. 65, No. 10 (Sep. 5, 1994) pp. 1248-1250.

Kearney et al., "The effect of alloy scattering on the mobility of holes in a $Si_{1-x}Ge_x$ quantum well," *Semicond. Sci Technol.*, vol. 13 (1998) pp. 174-180.

Kim et al., "A Fully Integrated 1.9-GHz CMOS Low-Noise Amplifier," *IEEE Microwave and Guided Wave Letters*, vol. 8, No. 8 (Aug. 1998) pp. 293-295.

Koester et al., "Extremely High Transconductance Ge/$Si_{0.4}Ge_{0.6}$ p-MODFET's Grown by UHV-CVD," *IEEE Electron Device Letters*, vol. 21, No. 3 (Mar. 2000) pp. 110-112.

König et al., "p-Type Ge-Channel MODFET's with High Transconductance Grown on Si Substrates," *IEEE Electron Device Letters*, vol. 14, No. 4 (Apr. 1993) pp. 205-207.

König et al., "SiGe HBTs and HFETs," *Solid-State Electronics*, vol. 38, No. 9 (1995) pp. 1595-1602.

Kuznetsov et al., "Technology for high-performance n-channel SiGe modulation-doped field-effect transistors," *J. Vac. Sci. Technol.*, B 13(6) (Nov./Dec. 1995) pp. 2892-2896.

Larson, "Integrated Circuit Technology Options for RFIC's—Present Status and Future Directions", *IEEE Journal of Solid-State Circuits*, vol. 33, No. 3, Mar. 1998, pp. 387-399.

Lee et al., "CMOS RF Integrated Circuits at 5 GHz and Beyond", *Proceedings of the IEEE*, vol. 88, No. 10 (Oct. 2000) pp. 1560-1571.

Lee et al., "Strained Ge channel p-type metal-oxide-semiconductor field-effect transistors grown on $Si_{1-x}Ge_x$/Si virtual substrates," *Applied Physics Letters*, vol. 79, No. 20 (Nov. 12, 2001) pp. 3344-3346.

Lee et al., "Strained Ge channel p-type MOSFETs fabricated on $Si_{1-x}Ge_x$/Si virtual substrates," *Mat. Res. Soc. Symp. Proc.*, vol. 686 (2002) pp. A1.9.1-A1.9.5.

Leitz et al., "Channel Engineering of SiGe-Based Heterostructures for High Mobility MOSFETs," *Mat. Res. Soc. Symp. Proc.*, vol. 686 (2002) pp. A3.10.1-A3.10.6.

Leitz et al., "Dislocation glide and blocking kinetics in compositionally graded SiGe/Si," *Journal of Applied Physics*, vol. 90, No. 6 (Sep. 15, 2001) pp. 2730-2736.

Leitz et al., "Hole mobility enhancements in strained Si/Si1-yGey p-type metal-oxide-semiconductor field-effect transistors grown on relaxed $Si_{1-x}Ge_x$ (x<y) virtual substrates," *Applied Physics Letters*, vol. 79, No. 25 (Dec. 17, 2001) pp. 4246-4248.

Li et al., "Design of high speed Si/SiGe heterojunction complementary metal-oxide-semiconductor field effect transistors with reduced short-channel effects," *J. Vac. Sci. Technol.*, vol. 20 No. 3 (May/Jun. 2002) pp. 1030-1033.

Lu et al., "High Performance 0.1 µm Gate-Length P-Type SiGe MODFET's and MOS-MODFET's", *IEEE Transac-* tions on Electron Devices, vol. 47, No. 8 (Aug. 2000) pp. 1645-1652.

Kummer et al., "Low energy plasma enhanced chemical vapor deposition," *Materials Science and Engineering B89* (2002) pp. 288-295.

Meyerson et al., "Cooperative Growth Phenomena in Silicon/Germanium Low-Temperature Epitaxy," *Applied Physics Letters*, vol. 53, No. 25 (Dec. 19, 1988) pp. 2555-2557.

Mizuno et al., "Advanced SOI-MOSFETs with Strained-Si Channel for High Speed CMOS-Electron/Hole Mobility Enhancement," 2000 Symposium on VLSI Technology, Digest of Technical Papers, Honolulu, (Jun. 13-15), IEEE New York, NY, pp. 210-211.

Mizuno et al., "High Performance Strained-Si p-MOSFETs on SiGe-on-Insulator Substrates Fabricated by SIMOX Technology," *IEEE IDEM Technical Digest* (1999) pp. 934-936.

Nayak et al., "High-Mobility Strained-Si PMOSFET's"; *IEEE Transactions on Electron Devices*, vol. 43, No. 10 (Oct. 1996) pp. 1709-1716.

O'Neill et al., "SiGe Virtual substrate N-channel heterojunction MOSFETS," *Semicond. Sci. Technol.*, vol. 14 (1999) pp. 784-789.

Papananos, "Low Noise Amplifiers in MOS Technologies," and "Low Noise Tuned-LC Oscillator," *Radio-Frequency Microelectronic Circuits for Telecommunication Applications* (1999) pp. 115-117, 188-193.

Parker et al., "SiGe heterostructure CMOS circuits and applications," *Solid State Electronics*, vol. 43 (1999) pp. 1497-1506.

Ransom et al., "Gate-Self-Aligned n-channel and p-channel Germanium MOSFET's," *IEEE Transactions on Electron Devices*, vol. 38, No. 12 (Dec. 1991) pp. 2695.

Reinking et al., "Fabrication of high-mobility Ge p-channel MOSFETs on Si substrates," *Electronics Letters*, vol. 35, No. 6 (Mar. 18, 1999) pp. 503-504.

Rim et al., "Enhanced Hole Mobilities in Surface-channel Strained-Si p-MOSFETs"; *IEDM*, 1995, pp. 517-520.

Rim et al., "Fabrication and Analysis of Deep Submicron Strained-Si N-MOSFET's"; *IEEE Transactions on Electron Devices*, vol. 47, No. 7 (Jul. 2000) pp. 1406-1415.

Rim, "Applications of Silicon-Based Heterostructures to Enhanced Mobility Metal-Oxide-Semiconductor Field-Effect Transistors", Ph.D. Thesis, Stanford University (1999) pp. 1-184.

Robbins et al., "A model for heterogeneous growth of $Si_{1-x}Ge_x$ films for hydrides," *Journal of Applied Physics*, vol. 69, No. 6 (Mar. 15, 1991) pp. 3729-3732.

Schäffler, "High-Mobility Si and Ge Structures," *Semiconductor Science and Technology*, vol. 12 (1997) pp. 1515-1549.

Sugimoto et al., "A 2V, 500 MHz and 3V, 920 MHz Low-Power Current-Mode 0.6 μm CMOS VCO Circuit", *IEICE Trans. Electron.*, vol. E82-C, No. 7 (Jul. 1999) pp. 1327-1329.

Ternent et al., "Metal Gate Strained Silicon MOSFETs for Microwave Integrated Circuits", *IEEE* (Oct. 2000) pp. 38-43.

Tweet et al., "Factors determining the composition of strained GeSi layers grown with disilane and germane," *Applied Physics Letters*, vol. 65, No. 20 (Nov. 14, 1994) pp. 2579-2581.

Welser et al., "Electron Mobility Enhancement in Strained-Si N-Type Metal-Oxide-Semiconductor Field-Effect Transistors," *IEEE Electron Device Letters*, vol. 15, No. 3 (Mar. 1994) pp. 100-102.

Welser et al., "Evidence of Real-Space Hot-Electron Transfer in High Mobility, Strained-Si Multilayer MOSFETs," *IEEE IDEM Technical Digest* (1993) pp. 545-548.

Welser et al., "NMOS and PMOS Transistors Fabricated in Strained Silicon/Relaxed Silicon-Germanium Structures," *IEEE IDEM Technical Digest* (1992) pp. 1000-1002.

Welser, "The Application of Strained Silicon/Relaxed Silicon Germanium Heterostructures to Metal-Oxide-Semiconductor Field-Effect Transistors," Ph.D. Thesis, Stanford University (1994) pp. 1-205.

Wolf et al., "Silicon Processing for the VLSI Era," vol. 1 *Process Technology* (1986) pp. 384-386.

Xie et al., "Semiconductor Surface Roughness: Dependence on Sign and Magnitude of Bulk Strain," *The Physical Review Letters*, vol. 73, No. 22 (Nov. 28, 1994) pp. 3006-3009.

Xie et al., "Very high mobility two-dimensional hole gas in Si/ $Ge_xSi_{1-x}$/Ge structures grown by molecular beam epitaxy," *Appl. Phys. Lett.*, vol. 63, No. 16 (Oct. 18, 1993) pp. 2263-2264.

Xie, "SiGe Field effect transistors," *Materials Science and Engineering*, vol. 25 (1999) pp. 89-121.

Ota, Y. et al., "Application of Heterojunction FET to power amplifier for cellular telephone," *Electronics Letters*, vol. 30 No. 11 (May 26, 1994) pp. 906-907.

Tsang et al., "Measurements of alloy composition and strain in thin $Ge_xSi_{1-x}$ layers," *J. Appl. Phys.*, vol. 75 No. 12 (Jun. 15, 1994) pp. 8098-8108.

Sakaguchi et al., "ELTRAN® by Splitting Porous Si Layers," Proc. 195th Int. SOI Symposium, vol. 99-3, *Electrochemical Society* (1999) pp. 117-121.

Yamagata et al., "Bonding, Splitting and Thinning by Porous Si in ELTRAN®; SOI-Epi Wafer™," *Mat. Res. Soc. Symp. Proc.*, vol. 681E (2001) pp. 18.2.1-18.2.10.

Gannavaram, et al., "Low Temperature (≦800° C.) Recessed Junction Selective Silicon-Germanium Source/Drain Technology for sub-70 nm CMOS," *IEEE International Electron Device Meeting Technical Digest*, (2000), pp. 437-440.

Ge et al., "Process-Strained Si (PSS) CMOS Technology Featuring 3D Strain Engineering," *IEEE International Electron Devices Meeting Technical Digest*, (2003) pp. 73-76.

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978-980.

Hamada et al., "A New Aspect of Mechanical Stress Effects in Scaled MOS Devices," *IEEE Transactions on Electron Devices*, vol. 38, No. 4 (Apr. 1991), pp. 895-900.

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448-450.

Iida et al., "Thermal behavior of residual strain in silicon-on-insulator bonded wafer and effects on electron mobility," *Solid-State Electronics*, vol. 43 (1999), pp. 1117-1120.

Ito et al., "Mechanical Stress Effect on Etch-Stop Nitride and its Impact on Deep Submicron Transistor Design," *IEEE International Electron Devices Meeting Technical Digest*, (2000), pp. 247-250.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591-593.

Ootsuka et al., "A Highly Dense, High-Performance 130nm node CMOS Technology for Large Scale System-on-a-Chip Applications," *IEEE International Electron Devices Meeting Technical Digest*, (2000), pp. 575-578.

Ota et al., "Novel Locally Strained Channel Technique for High Performance 55nm CMOS," *IEEE International Electron Devices Meeting Technical Digest*, (2002), pp. 27-30.

Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest* (2003), pp. 497-500.

Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.

Shimizu et al., "Local Mechanical-Stress Control (LMC): A New Technique for CMOS-Performance Enhancement," *IEEE International Electron Devices Meeting Technical Digest*, (2001), pp. 433-436.

Thompson et al., "A Logic Nanotechnology Featuring Strained-Silicon," *IEEE Electron Device Letters*, vol. 25, No. 4 (Apr. 2004), pp. 191-193.

Thompson et al., "A 90 nm Logic Technology Featuring 50nm Strained-Silicon Channel Transistors, 7 layers of Cu Interconnects, Low k ILD, and 1 $um^2$ SRAM Cell,"*IEEE International Electron Devices Meeting Technical Digest*, (2002), pp. 61-64.

Tiwari et al., "Hole Mobility Improvements in Silicon-on-Insulator and Bulk Silicon Transistors Using Local Strain,"*IEEE International Electron Devices Meeting Technical Digest*, (1997), pp. 939-941.

Uchino, et al., "A Raised Source/Drain Technology Using In-situ P-doped SiGe and B-doped Si for 0.1-μm CMOS ULSIs," *IEEE International Electron Device Meeting Technical Digest*, (1997), pp. 479-482.

Godbey et al., (1990) "Fabrication of Bond and Etch-Back Silicon Insulator Using a Strained $SI_{0.7}GE_{0.3}$ Layer as an Etch Stop," *Journal of the Electrical Society*, vol. 137, No. 10 (Oct. 1990) pp. 3219-3223.

Huang et al., (2001) "Carrier Mobility enhancement in strained Si-on-insulator fabricated by wafer bonding", *2001 Symposium on VLSI Technology, Digest of Technical Papers*, pp. 57-58.

Langdo et al., (2002) "Preparation of Novel SiGe-free Strained Si on Insulator Substrates" *IEEE International SOI Conference*, pp. 211-212 (XP002263057).

International Search Report for Related International Application No. PCT/US/18007, Jan. 5, 2004.

Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891-4899.

Halsall et al., "Electron diffraction and Raman studies of the effect of substrate misorientation on ordering in the AlGaInP system," *Journal of Applied Physics*, vol. 85, No. 1 (1999), pp. 199-202.

Hsu et al., "Surface morphology of related $Ge_xSi_{1-x}$ films," *Appl. Phys. Lett.*, vol. 61, No. 11 (1992), pp. 1293-1295.

Batterman, "Hillocks, Pits, and Etch Rate in Germanium Crystals," *Journal of Applied Physics*, vol. 28, No. 11 (Nov., 1957), pp. 1236-1241.

Bohg, "Ethylene Diamine-Pyrocatechol-Water Mixture Shows Etching Anomaly in Boron-Doped Silicon," *Journal of the Electrochemical Society*, vol. 118, No. 2 (Feb. 1971), pp. 401-402.

Brunner et al., "Molecular beam epitaxy growth and thermal stability of $Si_{1-x}Ge_x$ layers on extremely thin silicon-on-insulator substrates," *Thin Solid Films*, vol. 321 (1998), pp. 245-250.

Chen et al., "The Band Model and the Etching Mechanism of Silicon in Aqueous KOH," *Journal of the Electrochemcial Society*, vol. 142, No. 1 (Jan. 1995), pp. 170-176.

Desmond et al., "The Effects of Process-Induced Defects on the Chemical Selectivity of Highly Doped Boron Etch Stop in Silicon," *Journal of the Electrochemical Society*, vol. 141, No. 1 (Jan. 1994), pp. 178-184.

Ehman et al., "Morphology of Etch Pits on Germanium Studied by Optical and Scanning Electron Microscopy," *Journal of Applied Physics*, vol. 41, No. 7 (Jun. 1970), pp. 2824-2827.

Feijóo et al., "Etch Stop Barriers in Silicon Produced by Ion Implantation of Electrically Non-Active Species," *Journal of the Electrochemical Society*, vol. 139, No. 8 (Aug. 1992), pp. 2309-2313.

Finne et al., "A Water-Amine-Complexing Agent System for Etching Silicon," *Journal of the Electrochemical Society*, vol. 114, No. 9 (Sep. 1967), pp. 965-970.

Fitzgerald, "GeSi/Si Nanostructures," *Annual Review of Materials Science*, vol. 25 (1995), pp. 417-454.

Frank, "Orientation-Dependent Dissolution of Germanium," *Journal of Applied Physics*, vol. 31, No. 11 (Nov. 1960), pp. 1996-1999.

Fukatsu, "SiGe-based semiconductor-on-insulator substrate created by low-energy separation-by-implanted-oxygen," *Applied Physics Letters*, vol. 72, No. 26 (Jun. 29, 1998), pp. 3485-3487.

Ghandi et al., "Chemical Etching of Germanium," *Journal of the Electrochemical Society*, vol. 135, No. 8 (Aug. 1988), pp. 2053-2054.

Godbey et al., "A $Si_{0.7}Ge_{0.3}$ strained-layer etch stop for the generation of thin layer undoped silicon," *Applied Physics Letters*, vol. 56, No. 4 (Jan. 22, 1990), pp. 373-375.

Herzog et al., "X-Ray Investigation of Boron- and Germanium-Doped Silicon Epitaxial Layers," *Journal of the Electrochemical Society*, vol. 131, No. 12 (Dec. 1984), pp. 2969-2974.

Holmes, "The Orientation Dependence of Etching Effects on Germanium Crystals," *Acta Metallurgica*, vol. 7, No. 4 (Apr. 1959), pp. 283-290.

Hunt et al., "Highly Selective Etch Stop by Stress Compensation for Thin-Film BESOI," *1990 IEEE/SOI Technology Conference*, (Oct. 2-4, 1990), pp. 145-146.

Jaccodine, "Use of Modified Free Energy Theorems to Predict Equilibrium Growing and Etching Shapes," *Journal of Applied Physics*, vol. 33, No. 8 (Aug. 1962), pp. 2643-2647.

Kern, "Chemical Etching of Silicon, Germanium, Gallium, Arsenide, and Gallium Phosphide," *RCA Review*, vol. 39 (Jun. 1978), pp. 278-308.

Lang et al., "Bulk Micromachining of Ge for IR Gratings," *Journal of Micromechanics and Microengineering*, vol. 6, No. 1 (Mar. 1996), pp. 46-48.

Leancu et al., "Anisotropic Etching of Germanium," *Sensors and Actuators*, A46-47 (1995), pp. 35-37.

LeGoues et al., "Relaxation of SiGe thin films grown on Si/SiO$_2$ substrates," *Applied Physics Letters*, vol. 75, No. 11 (Jun. 1, 1994), pp. 7240-7246.

Lehmann et al., "Implanted Carbon: An Effective Etch-Stop in Silicon," *Journal of the Electrochemical Sociey*, vol. 138, No. 5 (May 1991), pp. 3-4.

Narozny et al., "Si/SiGe Heterojunction Bipolar Transistor with Graded GAP SiGe Base Made by Molecular Beam Epitaxy," *IEEE IEDM* (1988), pp. 562-565.

Palik et al., "Ellipsometric Study of the Etch-Stop Mechanism in Heavily Doped Silicon,"*Journal of the Electrochemical Society*, vol. 132, No. (Jan. 1985), pp. 135-141.

Palik et al., "Study of Bias-Dependent Etching of Si in Aqueous KOH," *Journal of the Electrochemical Sociey*, vol. 134, No. 2 (Feb. 1987), pp. 404-409.

Palik et al., "Study of the Etch-Stop Mechanism in Silicon," *Journal of the Electrochemical Society*, vol. 129, No. 9 (Sep. 1982), pp. 2051-2059.

Petersen, "Silicon as a Mechanical Material," *Proceedings of the IEEE*, vol. 70, No. 5 (May 1982), pp. 420-457.

Powell et al., "New approach to the growth of low dislocation relaxed SiGe material," *Applied Physics Letters*, vol. 64, No. 14 (Apr. 4, 1994), pp. 1865-1858.

Rai-Choudhury et al., "Doping of Epitaxial Silicon," *Journal of Crystal Growth*, vol. 7 (1970), pp. 361-367.

Raley et al., "(100) Silicon Etch-Rate Dependence on Boron Concentration in Ethylenediamine-Pyrocatechol-Water Solutions," *Journal of the Electrochemical Society*, vol. 131, No. 1 (Jan. 1984), pp. 161-170.

Seidel et al., "Anisotropic Etching of Crystalline Silicon in Alkaline Solutions," *Journal of the Electrochemical Society.*, vol. 137, No. 11 (Nov. 1990), pp. 3626-3632.

Senna et al., "Gallium Doping for Silicon Etch Stop in KOH," *Transducers '95/Eurosensors IX*, the 8th International Conference on Solid-State Sensors and Actuators and Eurosensors IX, Stockholm, Sweden, Jun. 25-29, 1995, pp. 194-195.

Shang et al., "The Development of an Anisotropic Si Etch Process Selective to Ge$_x$Si$_{1-x}$ Underlayers," *Journal of the Electrochemical Society.*, vol. 141, No. 2 (Feb. 1994), pp. 507-510.

Soderbarg, "Fabrication of BESOI-Materials Using Implanted Nitrogen as an Effective Etch Stop Barrier," *1989 IEEE SOS/SOI Technology Conference*, (Oct. 3-5, 1989), pp. 64.

Sundaram et al., "Electrochemical etching of Silicon by Hydrazine," *Journal of the Electrochemical Society*, vol. 140, No. 6 (Jun. 1993), pp. 1592-1597.

Sze, "Physics of Semiconductor Devices," (1991).

Takagi et al., "On the Universality of Inversion Layer Mobility in Si MOSFET's: Part I-Effects of Substrate Impurity Concentration," *IEEE Transactions on Electron Devices*, vol. 41, No. 12 (Dec. 1994), pp. 2357-2362.

Ting et al., "Monolithic Integration of III-V Materials and Devices on Silicon," Part of the0 SPIE Conference on Silicon-Based Optoelectronics, San Jose, CA, (Jan. 1999), pp. 19-28.

Vol'fson et al., "Fundamental Absorption Edge of Silicon Heavily Doped with Donor or Acceptor Impurities," *Soviet Physics Semiconductor*, vol. 1, No. 3 (Sep. 1967), pp. 327-332.

Wu, "Novel Etch-Stop Materials for Silicon Micromachining," Thesis Submitted to the Massachusetts Institute of Technology Department of Materials Science and Engineering on May 9, 1997, pp. 1-62.

Yi et al., "Si$_{1-x}$Ge$_x$/Si Multiple Quantum Well Wires Fabricated Using Selective Etching," *Materials Research Society Symposium Proceedings*, vol. 379 (1995), pp. 91-96.

Canaperi, et al., "Preparation of a relaxed Si-Ge layer on an insulator in fabricating high-speed smeiconductor devices with sustained epitaxial films", IBM, USA (2002) (abstract).

International Search Report for Int'l Application No. PCT/US01/46322, dated Jan. 16, 2003.

Examination Report for European Patent Application No. 98 931 529.6-2203, dated Jan. 10, 2002, 4 pages.

Examination Report for European Patent Application No. 98 931 529.6-2203, dated May 9, 2003, 5 pages.

International Search Report for Patent Application No. PCT/US 98/13076, dated Oct. 7, 1998, 2 pages.

Klauk et al., "Thermal stability of undoped strained Si channel SiGe heterostructures," American Institute of Physics, Apr. 1, 1996, pp. 1975-1977.

Notice of Preliminary Rejection for Korean Patent Application No. 10-1999-7012279, dated Feb. 21, 2002, 2 pages (English translation attached).

Notice of Final Rejection for Korean Patent Application No. 10-1999-7012279, dated Feb. 25, 2003 2 pages (English translation attached).

Rosenblad et al., "Strain relaxation of graded SiGe buffers brown at very high rates," Materials Science and Engineering B, Elsevier Sequoia, Lausanne, CH, vol. 71, Nr. 1-3, pp. 20-23, Feb. 2000.

* cited by examiner

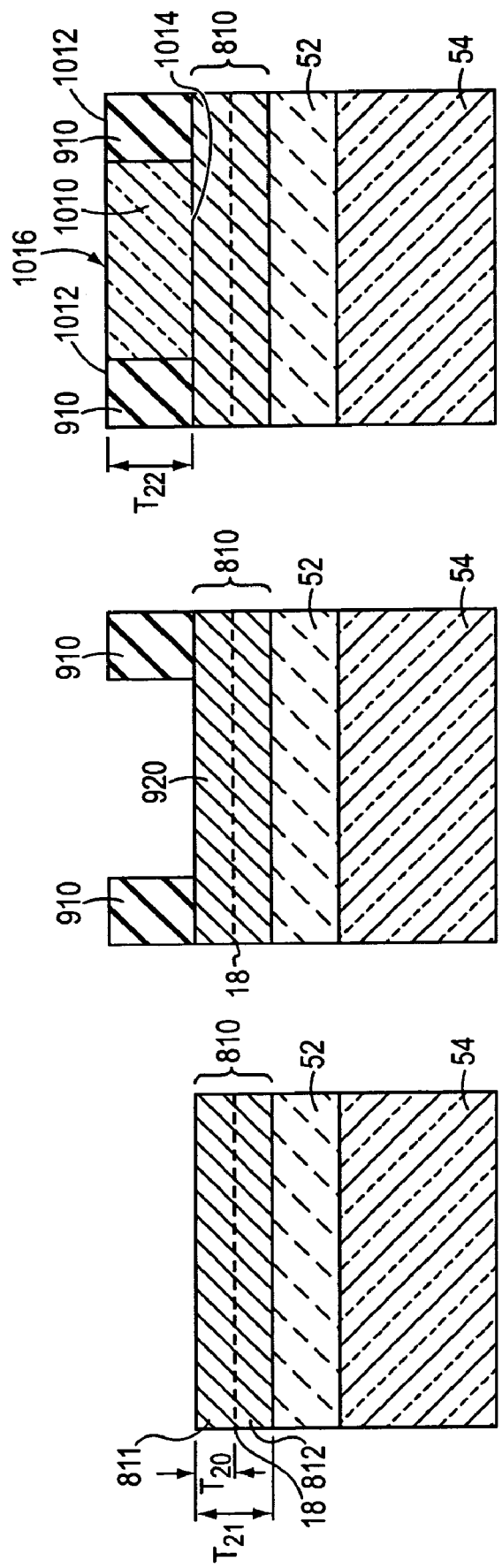

METHODS OF FORMING STRAINED-SEMICONDUCTOR-ON-INSULATOR FINFET DEVICE STRUCTURES

RELATED APPLICATIONS

This application claims the benefit of U.S. Provisional Application No. 60/386,968 filed Jun. 7, 2002, U.S. Provisional Application No. 60/404,058 filed Aug. 15, 2002, and U.S. Provisional Application No. 60/416,000 filed Oct. 4, 2002; the entire disclosures of these three provisional applications are hereby incorporated by reference.

FIELD OF THE INVENTION

This invention relates to devices and structures comprising strained semiconductor layers and insulator layers.

BACKGROUND

Strained silicon-on-insulator structures for semiconductor devices combine the benefits of two advanced approaches to performance enhancement: silicon-on-insulator (SOI) technology and strained silicon (Si) technology. The strained silicon-on-insulator configuration offers various advantages associated with the insulating substrate, such as reduced parasitic capacitances and improved isolation. Strained Si provides improved carrier mobilities. Devices such as strained Si metal-oxide-semiconductor field-effect transistors (MOSFETs) combine enhanced carrier mobilities with the advantages of insulating substrates.

Strained-silicon-on-insulator substrates are typically fabricated as follows. First, a relaxed silicon-germanium (SiGe) layer is formed on an insulator by one of several techniques such as separation by implantation of oxygen (SIMOX), wafer bonding and etch back; wafer bonding and hydrogen exfoliation layer transfer; or recrystallization of amorphous material. Then, a strained Si layer is epitaxially grown to form a strained-silicon-on-insulator structure, with strained Si disposed over SiGe. The relaxed-SiGe-on-insulator layer serves as the template for inducing strain in the Si layer. This induced strain is typically greater than $10^{-3}$.

This structure has limitations. It is not conducive to the production of fully-depleted strained-semiconductor-on-insulator devices in which the layer over the insulating material must be thin enough [<300 angstroms (Å)] to allow for full depletion of the layer during device operation. Fully depleted transistors may be the favored version of SOI for MOSFET technologies beyond the 90 nm technology node. The relaxed SiGe layer adds to the total thickness of this layer and thus makes it difficult to achieve the thicknesses required for fully depleted silicon-on-insulator device fabrication. The relaxed SiGe layer is not required if a strained Si layer can be produced directly on the insulating material. Thus, there is a need for a method to produce strained silicon—or other semiconductor—layers directly on insulating substrates.

Double-Gate MOSFETs

Double gate MOSFETs have the potential for superior performance in comparison to standard single-gate bulk or single-gate SOI MOSFET devices. This is due to the fact that two gates (one above and one below the channel) allow much greater control of channel charge then a single gate. This configuration has the potential to translate to higher drive current and lower stand-by leakage current.

FinFETs

Fin-field-effect transistors (finFETs), like double-gate MOSFETs, typically have two gates (one on either side of the channel, where the channel is here oriented vertically) allowing much greater control of channel charge than in a single gate device. This configuration also has the potential to translate to higher drive current and lower stand-by leakage current. Devices related to the finFET, such as the wrap-around gate FET (gate on both sides of as well as above the channel) allow even more channel charge control and hence even more potential for improved drive current and leakage current performance.

Bipolar-CMOS

The bipolar-CMOS (BiCMOS) process is a combination of both the bipolar transistor and MOSFET/CMOS processes. Individually, the CMOS process allows low power dissipation, high packing density and the ability to integrate complexity with high-speed yields. A major contribution to power dissipation in CMOS circuits originates from driving the load capacitance that is usually the gate of sequentially linked logic cells. The size of these gates may be kept sufficiently small, but when driving higher loads (such as input/output buffers or data buses) the load or capacitance of such devices is substantially larger and therefore requires greater gate width (hence area) of transistor, which inevitably drives down the switching speed of the MOSFET.

The bipolar transistor has significant advantages in terms of the drive current per unit active area and reduced noise signal. Additionally, the switching speed is enhanced due to the effectively exponential output current swing with respect to input signal. This means that the transconductance of a bipolar transistor is significantly higher than that of a MOS transistor when the same current is passed. Higher transconductance enables the charging process to take place approximately ten times more quickly in emitter coupled logic circuits, or high fan out/load capacitance.

Pure bipolar technology has not replaced the high packing density microprocessor CMOS process for a number of reasons, including issues of yield and the increased area required for device isolation. However, integration of bipolar and CMOS may provide the best aspects of the composite devices.

The advantages of BiCMOS process may be summarized as follows:

1. Improved speed performance of highly integrated functionality of CMOS technology;
2. Lower power dissipation than bipolar technology;
3. Lower sensitivity to fan out and capacitive load;
4. Increased flexibility of input/output interface;
5. Reduced clock skew;
6. Improved internal gate delay; and
7. Reduced need for aggressive scaling because a 1–2 μm BiCMOS process offers circuit speed equivalent to that of sub-micron CMOS.

SUMMARY

The present invention includes a strained-semiconductor-on-insulator (SSOI) substrate structure and methods for fabricating the substrate structure. MOSFETs fabricated on this substrate will have the benefits of SOI MOSFETs as well as the benefits of strained Si mobility enhancement. For example, the formation of BiCMOS structures on SSOI substrates provides the combined benefits of BiCMOS design platforms and enhanced carrier mobilities. SSOI substrates also enable enhanced carrier mobilities, process simplicity, and better device isolation for double-gate MOSFETs and finFETs.

By eliminating the SiGe relaxed layer traditionally found beneath the strained Si layer, the use of SSOI technology is simplified. For example, issues such as the diffusion of Ge into the strained Si layer during high temperature processes are avoided.

This approach enables the fabrication of well-controlled, epitaxially-defined, thin strained semiconductor layers directly on an insulator layer. Tensile strain levels of ~$10^{-3}$ or greater are possible in these structures, and are not diminished after thermal anneal cycles. In some embodiments, the strain-inducing relaxed layer is not present in the final structure, eliminating some of the key problems inherent to current strained Si-on-insulator solutions. This fabrication process is suitable for the production of enhanced-mobility substrates applicable to partially or fully depleted SSOI technology.

In an aspect, the invention features a structure including a substrate having a dielectric layer disposed thereon and a fin-field-effect transistor disposed over the substrate. The fin-field-effect-transistor includes a source region and a drain region disposed in contact with the dielectric layer, the source and the drain regions including a strained semiconductor material. The fin-field-effect-transistor also includes at least one fin extending between the source and the drain regions, the fin including a strained semiconductor material. A gate is disposed above the strained semiconductor layer, extending over at least one fin and between the source and the drain regions. A gate dielectric layer is disposed between the gate and the fin.

One or more of the following features may be included. The fin may include at least one of a group II, a group III, a group IV, a group V, of a group VI element. The strained semiconductor layer may be tensilely strained and may include, e.g., tensilely strained silicon. The strained semiconductor layer may be compressively strained and may include, e.g., compressively strained germanium.

In another aspect, the invention features a method for forming a structure, the method including providing a substrate having a dielectric layer disposed thereon, and a first strained semiconductor layer disposed in contact with the dielectric layer. A fin-field-effect transistor is formed on the substrate by patterning the first strained semiconductor layer to define a source region, a drain region, and at least one fin disposed between the source and the drain regions. A dielectric layer is formed, at least a portion of the dielectric layer being disposed over the fin, and a gate is formed over the dielectric layer portion disposed over the fin.

One or more of the following features may be included. The first strained semiconductor layer may include at least one of a group II, a group III, a group IV, a group V, or a group VI element. The strained semiconductor layer may be tensilely strained and may include, e.g., tensilely strained silicon. The strained semiconductor layer may be compressively strained and may include, e.g., compressively strained germanium.

In another aspect, the invention features a structure including a dielectric layer disposed over a substrate; and a transistor formed over the dielectric layer. The transistor includes a first gate electrode in contact with the dielectric layer, a strained semiconductor layer disposed over the first gate electrode; and a second gate electrode disposed over the strained semiconductor layer.

One or more of the following features may be included. The strained semiconductor layer may include at least one of a group II, a group III, a group IV, a group V, and a group VI elements.

The strained semiconductor layer may be tensilely strained and may include, e.g., tensilely strained silicon. The strained semiconductor layer may be compressively strained and may include, e.g., compressively strained germanium. The strained semiconductor layer may have a strain level greater than $10^{-3}$.

A first gate insulator layer may be disposed between the first gate electrode and the strained semiconductor layer. A second gate insulator layer may be disposed between the strained semiconductor layer and the second gate electrode. The strained semiconductor layer may include a source. The strained semiconductor layer may include a drain. A sidewall spacer may be disposed proximate the second gate electrode. The sidewall spacer may include a dielectric or a conductive material.

In another aspect, the invention features a method for forming a structure, the method including forming a substrate having a first gate electrode layer disposed over a substrate insulator layer, a first gate insulator layer disposed over the first gate electrode layer, and a strained semiconductor layer disposed over the first gate insulator layer. A second gate insulator layer is formed over the strained semiconductor layer, and a second gate electrode layer is formed over the second gate insulator layer. A second gate electrode is defined by removing a portion of the second gate insulator layer. A dielectric sidewall spacer is formed proximate the second gate electrode. A portion of the strained semiconductor layer, a portion of the first gate insulator layer, and a portion of the first gate electrode layer are removed to define a vertical structure disposed over the substrate insulator layer, the vertical structure including a strained layer region, a first gate insulator region, and a first gate electrode layer region disposed under the second gate electrode. A first gate electrode is defined by laterally shrinking the first gate electrode layer region.

One or more of the following features may be included. The strained semiconductor layer may be tensilely strained and may include, e.g., tensilely strained silicon. The strained semiconductor layer may be compressively strained and may include compressively strained germanium. A conductive sidewall spacer may be formed proximate the dielectric sidewall spacer. A source and/or a drain may be defined in the strained semiconductor layer.

In another aspect, the invention features a structure including a strained semiconductor layer disposed over a dielectric layer and a bipolar transistor. The bipolar transistor includes a collector disposed in a portion of the strained semiconductor layer, a base disposed over the collector, and an emitter disposed over the base.

One or more of the following features may be included. The strained layer may be tensilely strained and may include, e.g., tensilely strained silicon. The strained layer may be compressively strained.

In another aspect, the invention features a relaxed substrate including a bulk material, a strained layer disposed in contact with the relaxed substrate; and a bipolar transistor. The bipolar transistor includes a collector disposed in a portion of the strained layer, a base disposed over the collector, and an emitter disposed over the base. The strain of the strained layer is not induced by the underlying substrate.

One or more of the following features may be included. The strained layer may be tensilely strained and may include, e.g., tensilely strained silicon. The strained layer may be compressively strained.

In another aspect, the invention features a structure including a relaxed substrate including a bulk material, a strained layer disposed in contact with the relaxed substrate; and a bipolar transistor including. The bipolar transistor includes a collector disposed in a portion of the strained layer, a base disposed over the collector, and an emitter disposed over the base. The strain of the strained layer is independent of a lattice mismatch between the strained layer and the relaxed substrate.

One or more of the following features may be included. The strained layer may be tensilely strained and may include, e.g., tensilely strained silicon. The strained layer may be compressively strained.

In another aspect, the invention includes a method for forming a structure, the method including providing a substrate having a strained semiconductor layer disposed over a dielectric layer, defining a collector in a portion of the strained semiconductor layer; forming a base over the collector; and forming an emitter over the base.

One or more of the following features may be included. The strained layer may be tensilely strained and may include, e.g., tensilely strained silicon. The strained layer may be compressively strained.

In another aspect, the invention includes method for forming a structure, the method including providing a first substrate having a strained layer disposed thereon, the strained layer including a first semiconductor material. The strained layer is bonded to a second substrate, the second substrate including a bulk material. The first substrate is removed from the strained layer, with the strained layer remaining bonded to the bulk semiconductor material. A collector is defined in a portion of the strained layer. A base is formed over the collector; and an emitter is formed over the base. The strain of the strained layer is not induced by the second substrate and the strain is independent of lattice mismatch between the strained layer and the second substrate.

One or more of the following features may be included. The strained layer may be tensilely strained and may include, e.g., tensilely strained silicon. The strained layer may be compressively strained.

In another aspect, the invention features a method for forming a structure, the method including providing a relaxed substrate comprising a bulk material and a strained layer disposed in contact with the relaxed substrate, the strain of the strained layer not being induced by the underlying substrate and the strain being independent of a lattice mismatch between the strained layer and the relaxed substrate. A collector is defined in a portion of the strained layer. A base is formed over the collector, and an emitter is formed over the base.

One or more of the following features may be included. The strained layer may be tensilely strained and may include, e.g., tensilely strained silicon. The strained layer may be compressively strained.

In another aspect, the invention features a method for forming a structure, the method includes providing a substrate having a strained semiconductor layer disposed over a substrate dielectric layer and forming a transistor in the strained layer. Forming the transistor includes forming a gate dielectric layer above a portion of the strained semiconductor layer, forming a gate contact above the gate dielectric layer, and forming a source region and a drain region in a portion of the strained semiconductor layer, proximate the gate dielectric layer. A portion of the strained layer and the substrate dielectric layer are removed to expose a portion of the substrate. A collector is defined in the exposed portion of the substrate. A base is formed over the collector; and an emitter is formed over the base.

One or more of the following features may be included. The strained layer may be tensilely strained and may include, e.g., tensilely strained silicon. The strained layer may be compressively strained.

BRIEF DESCRIPTION OF DRAWINGS

FIGS. 36–39 are cross-sectional views of substrates illustrating a method for fabricating a bipolar transistor on an SSOI substrate.

Like-referenced features represent common features in corresponding drawings.

DETAILED DESCRIPTION

An SSOI structure may be formed by wafer bonding followed by cleaving. FIGS. 1A–2B illustrate formation of a suitable strained layer on a wafer for bonding, as further described below.

Figure 1B:
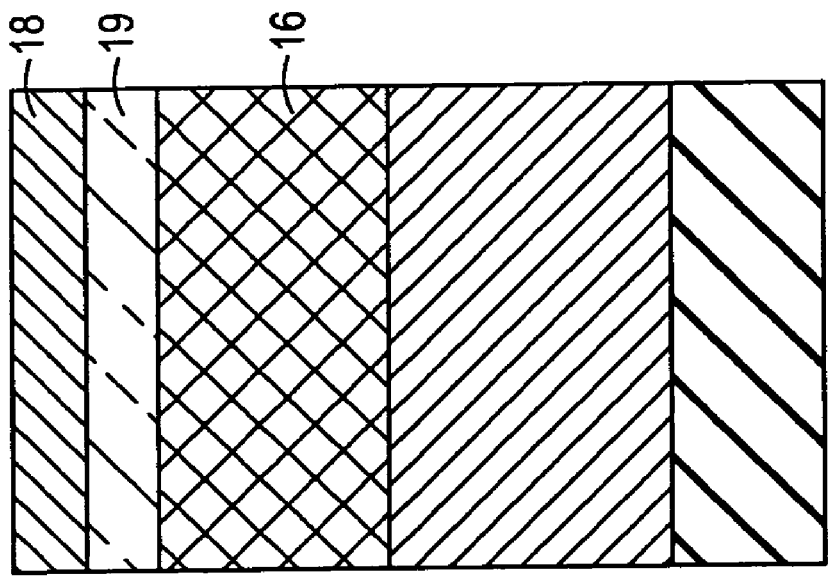
FIGS. 1A–6 are schematic cross-sectional views of substrates illustrating a method for fabricating an SSOI substrate.
Figure 1A:
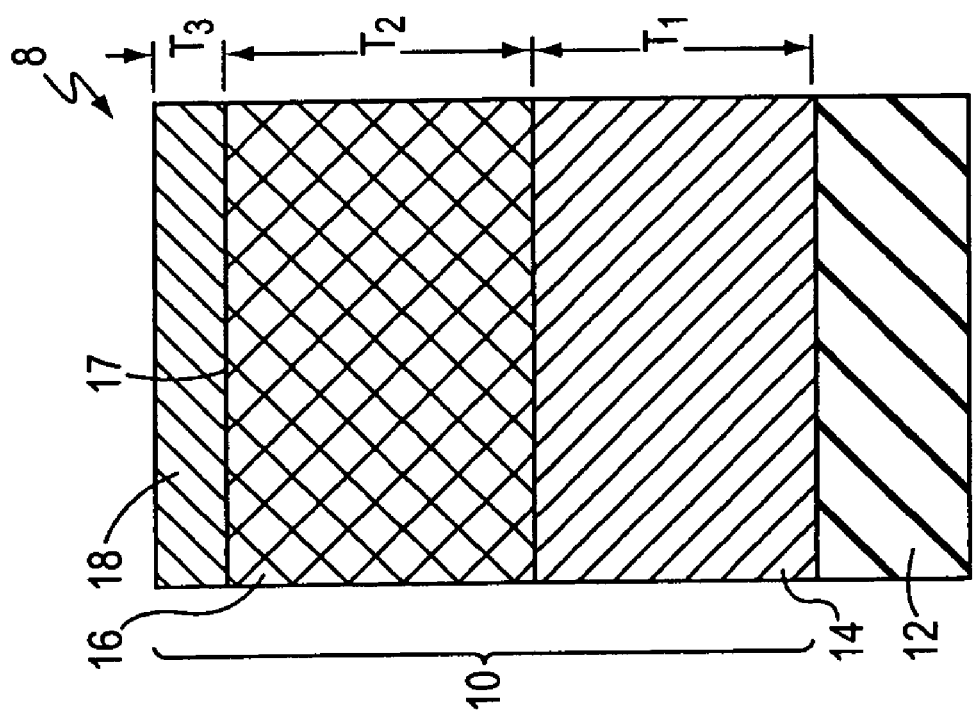

Referring to FIG. 1A, an epitaxial wafer 8 has a plurality of layers 10 disposed over a substrate 12. Substrate 12 may be formed of a semiconductor, such as Si, Ge, or SiGe. The plurality of layers 10 includes a graded buffer layer 14, which may be formed of $Si_{1-y}Ge_y$, with a maximum Ge content of, e.g., 10–80% (i.e., y=0.1–0.8) and a thickness $T_1$ of, for example, 1–8 micrometers (μm).

A relaxed layer 16 is disposed over graded buffer layer 14. Relaxed layer 16 may be formed of uniform $Si_{1-x}Ge_x$ having a Ge content of, for example, 10–80% (i.e., x=0.1–0.8), and a thickness $T_2$ of, for example, 0.2–2 μm. In some embodiments, $Si_{1-x}Ge_x$ may include $Si_{0.70}Ge_{0.30}$ and $T_2$ may be approximately 1.5 μm. Relaxed layer 16 may be fully relaxed, as determined by triple axis X-ray diffraction, and may have a threading dislocation density of $<1\times10^6$ dislocations/$cm^2$, as determined by etch pit density (EPD) analysis. Because threading dislocations are linear defects disposed within a volume of crystalline material, threading dislocation density may be measured as either the number of dislocations intersecting a unit area within a unit volume or the line length of dislocation per unit volume. Threading dislocation density, therefore, may be expressed in either units of dislocations/cm$^2$ or cm/cm$^3$. Relaxed layer 16 may have a surface particle density of, e.g., less than about 0.3 particles/cm$^2$. Further, relaxed layer 16 produced in accordance with the present invention may have a localized light-scattering defect level of less than about 0.3 defects/cm$^2$ for particle defects having a size (diameter) greater than 0.13 microns, a defect level of about 0.2 defects/cm$^2$ for particle defects having a size greater than 0.16 microns, a defect level of about 0.1 defects/cm$^2$ for particle defects having a size greater than 0.2 microns, and a defect level of about 0.03 defects/cm$^2$ for defects having a size greater than 1 micron. Process optimization may enable reduction of the localized light-scattering defect levels to about 0.09 defects/cm$^2$ for particle defects having a size greater than 0.09 microns and to 0.05 defects/cm$^2$ for particle defects having a size greater than 0.12 microns.

Substrate 12, graded layer 14, and relaxed layer 16 may be formed from various materials systems, including various combinations of group II, group III, group IV, group V, and group VI elements. For example, each of substrate 12, graded layer 14, and relaxed layer 16 may include a III–V compound. Substrate 12 may include gallium arsenide (GaAs), graded layer 14 and relaxed layer 16 may include indium gallium arsenide (InGaAs) or aluminum gallium arsenide (AlGaAs). These examples are merely illustrative, and many other material systems are suitable.

A strained semiconductor layer 18 is disposed over relaxed layer 16. Strained layer 18 may include a semiconductor such as at least one of a group II, a group III, a group IV, a group V, and a group VI element. Strained semiconductor layer 18 may include, for example, Si, Ge, SiGe, GaAs, indium phosphide (InP), and/or zinc selenide (ZnSe). In some embodiments, strained semiconductor layer 18 may include approximately 100% Ge, and may be compressively strained. Strained semiconductor layer 18 comprising 100% Ge may be formed over, e.g., relaxed layer 16 containing uniform $Si_{1-x}Ge_x$ having a Ge content of, for example, 50–80% (i.e., x=0.5–0.8), preferably 70% (x=0.7). Strained layer 18 has a thickness $T_3$ Of, for example, 200–1000 Å. In an embodiment, $T_3$ may be approximately 200–500 Å.

Strained layer 18 may be formed by epitaxy, such as by atmospheric-pressure CVD (APCVD), low- (or reduced-) pressure CVD (LPCVD), ultra-high-vacuum CVD (UHVCVD), by molecular beam epitaxy (MBE), or by atomic layer deposition (ALD). Strained layer 18 containing Si may be formed by CVD with precursors such as silane, disilane, or trisilane. Strained layer 18 containing Ge may be formed by CVD with precursors such as germane or digermane. The epitaxial growth system may be a single-wafer or multiple-wafer batch reactor. The growth system may also utilize a low-energy plasma to enhance layer growth kinetics. Strained layer 18 may be formed at a relatively low temperature, e.g., less than 700° C., to facilitate the definition of an abrupt interface 17 between strained layer 18 and relaxed layer 16. This abrupt interface 17 may enhance the subsequent separation of strained layer 18 from relaxed layer 16, as discussed below with reference to FIGS. 4 and 5. Abrupt interface 17 is characterized by the transition of Si or Ge content (in this example) proceeding in at least 1 decade (order of magnitude in atomic concentration) per nanometer of depth into the sample. In an embodiment, this abruptness may be better than 2 decades per nanometer.

In an embodiment in which strained layer 18 contains substantially 100% Si, strained layer 18 may be formed in a dedicated chamber of a deposition tool that is not exposed to Ge source gases, thereby avoiding cross-contamination and improving the quality of the interface between strained layer 18 and relaxed layer 16. Furthermore, strained layer 18 may be formed from an isotopically pure silicon precursor(s). Isotopically pure Si has better thermal conductivity than conventional Si. Higher thermal conductivity may help dissipate heat from devices subsequently formed on strained layer 18, thereby maintaining the enhanced carrier mobilities provided by strained layer 18.

After formation, strained layer 18 has an initial misfit dislocation density, of, for example, 0–$10^5$ cm/cm$^2$. In an embodiment, strained layer 18 has an initial misfit dislocation density of approximately 0 cm/cm$^2$. Because misfit dislocations are linear defects generally lying within a plane between two crystals within an area, they may be measured in terms of total line length per unit area. Misfit dislocation density, therefore, may be expressed in units of dislocations/cm or cm/cm$^2$. In one embodiment, strained layer 18 is tensilely strained, e.g., Si formed over SiGe. In another embodiment, strained layer 18 is compressively strained, e.g., Ge formed over SiGe.

Strained layer 18 may have a surface particle density of, e.g., less than about 0.3 particles/cm$^2$. As used herein, "surface particle density" includes not only surface particles but also light-scattering defects, and crystal-originated pits (COPs), and other defects incorporated into strained layer 18. Further, strained layer 18 produced in accordance with the present invention may have a localized light-scattering defect level of less than about 0.3 defects/cm$^2$ for particle defects having a size (diameter) greater than 0.13 microns, a defect level of about 0.2 defects/cm$^2$ for particle defects having a size greater than 0.16 microns, a defect level of about 0.1 defects/cm$^2$ for particle defects having a size greater than 0.2 microns, and a defect level of about 0.03 defects/cm$^2$ for defects having a size greater than 1 micron. Process optimization may enable reduction of the localized light-scattering defect levels to about 0.09 defects/cm$^2$ for particle defects having a size greater than 0.09 microns and to 0.05 defects/cm for particle defects having a size greater than 0.12 microns. These surface particles may be incorporated in strained layer 18 during the formation of strained layer 18, or they may result from the propagation of surface defects from an underlying layer, such as relaxed layer 16.

In alternative embodiments, graded layer 14 may be absent from the structure. Relaxed layer 16 may be formed in various ways, and the invention is not limited to embodiments having graded layer 14. In other embodiments, strained layer 18 may be formed directly on substrate 12. In this case, the strain in layer 18 may be induced by lattice mismatch between layer 18 and substrate 12, induced mechanically, e.g., by the deposition of overlayers, such as $Si_3N_4$, or induced by thermal mismatch between layer 18 and a subsequently grown layer, such as a SiGe layer. In some embodiments, a uniform semiconductor layer (not shown), having a thickness of approximately 0.5 μm and comprising the same semiconductor material as substrate 12, is disposed between graded buffer layer 14 and substrate 12. This uniform semiconductor layer may be grown to improve the material quality of layers subsequently grown on substrate 12, such as graded buffer layer 14, by providing a clean, contaminant-free surface for epitaxial growth. In certain embodiments, relaxed layer 16 may be planarized prior to growth of strained layer 18 to eliminate the cross-hatched surface roughness induced by graded buffer layer 14. (See, e.g., M. T. Currie, et al., *Appl. Phys. Lett.*, 72 (14) p. 1718 (1998), incorporated herein by reference.) The planarization may be performed by a method such as chemical mechanical polishing (CMP), and may improve the quality of a subsequent bonding process (see below) because it minimizes the wafer surface roughness and increases wafer flatness, thus providing a greater surface area for bonding.

Referring to FIG. 1B, after planarization of relaxed layer 16, a relaxed semiconductor regrowth layer 19 including a semiconductor such as SiGe may be grown on relaxed layer 16, thus improving the quality of subsequent strained layer 18 growth by ensuring a clean surface for the growth of strained layer 18. Growing on this clean surface may be preferable to growing strained material, e.g., silicon, on a surface that is possibly contaminated by oxygen and carbon from the planarization process. The conditions for epitaxy of the relaxed semiconductor regrowth layer 19 on the planarized relaxed layer 16 should be chosen such that surface roughness of the resulting structure, including layers formed over regrowth layer 19, is minimized to ensure a surface suitable for subsequent high quality bonding. High quality bonding may be defined as the existence of a bond between two wafers that is substantially free of bubbles or voids at the interface. Measures that may help ensure a smooth surface for strained layer 18 growth, thereby facilitating bonding, include substantially matching a lattice of the semiconductor regrowth layer 19 to that of the underlying relaxed layer 16, by keeping the regrowth thickness below approximately 1 µm, and/or by keeping the growth temperature below approximately 850° C. for at least a portion of the semiconductor layer 19 growth. It may also be advantageous for relaxed layer 16 to be substantially free of particles or areas with high threading dislocation densities (i.e., threading dislocation pile-ups) which could induce non-planarity in the regrowth and decrease the quality of the subsequent bond.

Figure 2B:
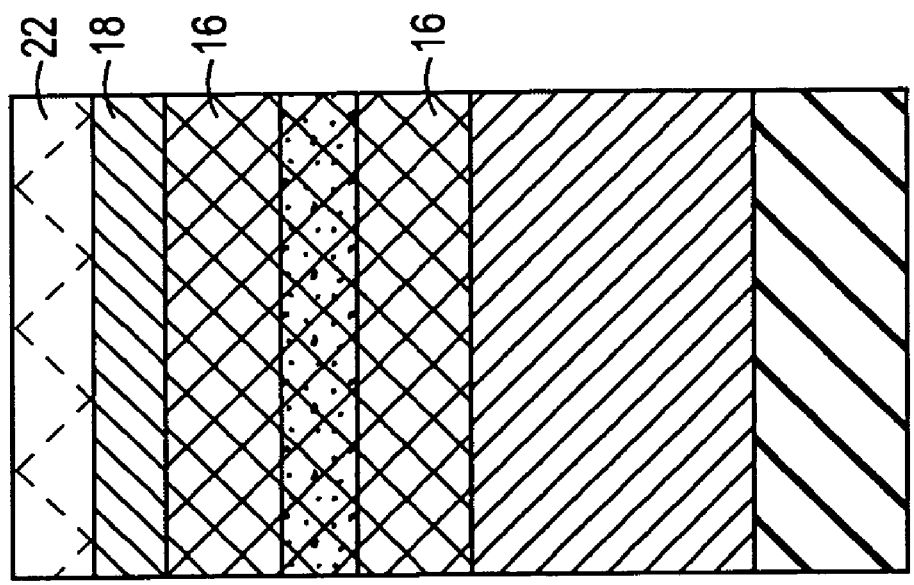
Figure 2A:
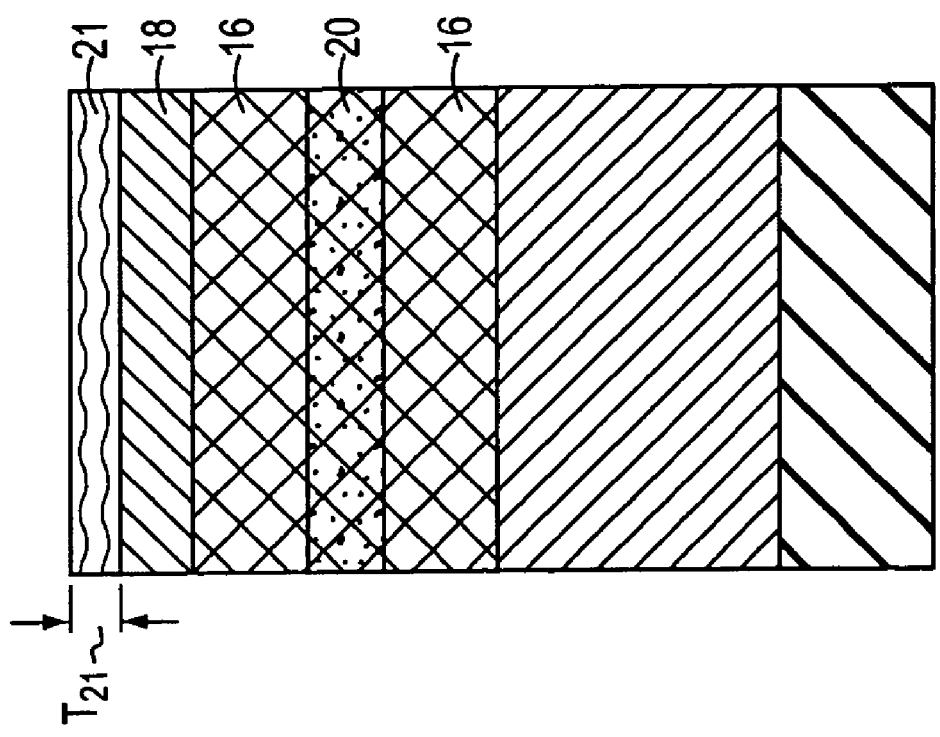

Referring to FIG. 2A, in an embodiment, hydrogen ions are implanted into relaxed layer 16 to define a cleave plane 20. This implantation is similar to the SMARTCUT process that has been demonstrated in silicon by, e.g., SOITEC, based in Grenoble, France. Implantation parameters may include implantation of hydrogen ($H_2^+$) to a dose of 2.5–5× $10^{16}$ ions/cm$^2$ at an energy of, e.g., 50–100 keV. For example, $H_2^+$ may be implanted at an energy of 75 keV and a dose of $4 \times 10^{16}$ ions/cm$^2$ through strained layer 18 into relaxed layer 16. In alternative embodiments, it may be favorable to implant at energies less than 50 keV to decrease the depth of cleave plane 20 and decrease the amount of material subsequently removed during the cleaving process (see discussion below with reference to FIG. 4). In an alternative embodiment, other implanted species may be used, such as $H^+$ or $He^+$, with the dose and energy being adjusted accordingly. The implantation may also be performed prior to the formation of strained layer 18. Then, the subsequent growth of strained layer 18 is preferably performed at a temperature low enough to prevent premature cleaving along cleave plane 20, i.e., prior to the wafer bonding process. This cleaving temperature is a complex function of the implanted species, implanted dose, and implanted material. Typically, premature cleaving may be avoided by maintaining a growth temperature below approximately 500° C.

Figure 3:
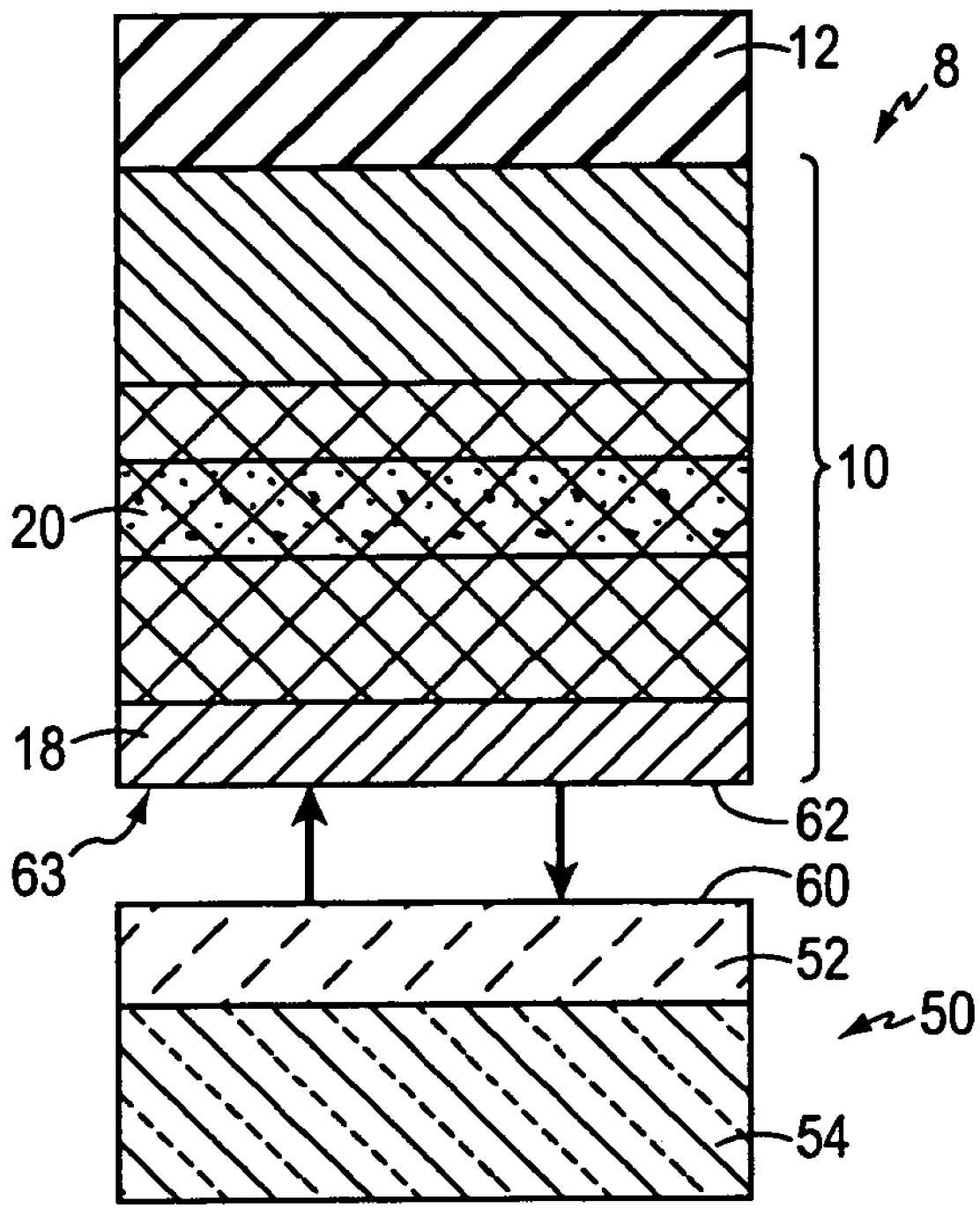

In some embodiments, such as when strained layer 18 comprises nearly 100% Ge, a thin layer 21 of another material, such as Si, may be formed over strained layer 18 prior to bonding (see discussion with respect to FIG. 3). This thin layer 21 may be formed to enhance subsequent bonding of strained layer 18 to an insulator, such as an oxide. Thin layer 21 may have a thickness $T_{21}$ of, for example, 0.5–5 nm.

In some embodiments, strained layer 18 may be planarized by, e.g., CMP, to improve the quality of the subsequent bond. Strained layer 18 may have a low surface roughness, e.g., less than 0.5 nm root mean square (RMS). Referring to FIG. 2B, in some embodiments, a dielectric layer 22 may be formed over strained layer 18 prior to ion implantation into relaxed layer 16 to improve the quality of the subsequent bond. Dielectric layer 22 may be, e.g., silicon dioxide ($SiO_2$) deposited by, for example, LPCVD or by high density plasma (HDP). An LPCVD deposited $SiO_2$ layer may be subjected to a densification step at elevated temperature. Suitable conditions for this densification step may be, for example, a 10 minute anneal at 800° C. in a nitrogen ambient. Alternatively, dielectric layer 22 may include low-temperature oxide (LTO), which may be subsequently densified at elevated temperature in nitrogen or oxygen ambients. Suitable conditions for this densification step can be a 10 minute anneal at 800° C. in an oxygen ambient. Dielectric layer 22 may be planarized by, e.g., CMP to improve the quality of the subsequent bond. In an alternative embodiment, it may be advantageous for dielectric layer 22 to be formed from thermally grown $SiO_2$ in order to provide a high quality semiconductor/dielectric interface in the final structure. In an embodiment, strained layer 18 comprises approximately 100% Ge and dielectric layer 22 comprises, for example, germanium dioxide ($GeO_2$); germanium oxynitride (GeON); a high-k insulator having a higher dielectric constant than that of Si such as hafnium oxide ($HfO_2$) or hafnium silicate (HfSiON, $HfSiO_4$); or a multilayer structure including $GeO_2$ and $SiO_2$. Ge has an oxidation behavior different from that of Si, and the deposition methods may be altered accordingly.

Referring to FIG. 3, epitaxial wafer 8 is bonded to a handle wafer 50. Either handle wafer 50, epitaxial wafer 8, or both have a top dielectric layer (see, e.g., dielectric layer 22 in FIG. 2B) to facilitate the bonding process and to serve as an insulator layer in the final substrate structure. Handle wafer 50 may have a dielectric layer 52 disposed over a semiconductor substrate 54. Dielectric layer 52 may include, for example, $SiO_2$. In an embodiment, dielectric layer 52 includes a material having a melting point ($T_m$) higher than a $T_m$ of pure $SiO_2$, i.e., higher than 1700° C. Examples of such materials are silicon nitride ($Si_3N_4$), aluminum oxide, magnesium oxide, etc. Using dielectric layer 52 with a high $T_m$ helps prevents possible relaxation of the transferred strained semiconductor layer 18 that may occur during subsequent processing, due to softening of the underlying dielectric layer 52 at temperatures typically used during device fabrication (approximately 1000–1200° C.). In other embodiments, handle wafer 50 may include a combination of a bulk semiconductor material and a dielectric layer, such as a silicon on insulator substrate. Semiconductor substrate 54 includes a semiconductor material such as, for example, Si, Ge, or SiGe.

Handle wafer 50 and epitaxial wafer 8 are cleaned by a wet chemical cleaning procedure to facilitate bonding, such as by a hydrophilic surface preparation process to assist the bonding of a semiconductor material, e.g., strained layer 18, to a dielectric material, e.g., dielectric layer 52. For example, a suitable prebonding surface preparation cleaning procedure could include a modified megasonic RCA SC1 clean containing ammonium hydroxide, hydrogen peroxide, and water ($NH_4OH:H_2O_2:H_2O$) at a ratio of 1:4:20 at 60° C. for 10 minutes, followed by a deionized (DI) water rinse and spin dry. The wafer bonding energy should be strong enough to sustain the subsequent layer transfer (see FIG. 4). In some embodiments, top surfaces 60, 62 of handle wafer 50 and epitaxial wafer 8, including a top surface 63 of strained semiconductor layer 18, may be subjected to a plasma activation, either before, after, or instead of a wet clean, to increase the bond strength. The plasma environment may include at least one of the following species: oxygen, ammonia, argon, nitrogen, diborane, and phosphine. After an appropriate cleaning step, handle wafer 50 and epitaxial wafer 8 are bonded together by bringing top surfaces 60, 62 in contact with each other at room temperature. The bond strength may be greater than 1000 mJ/m$^2$, achieved at a low temperature, such as less than 600° C.

Figure 4:
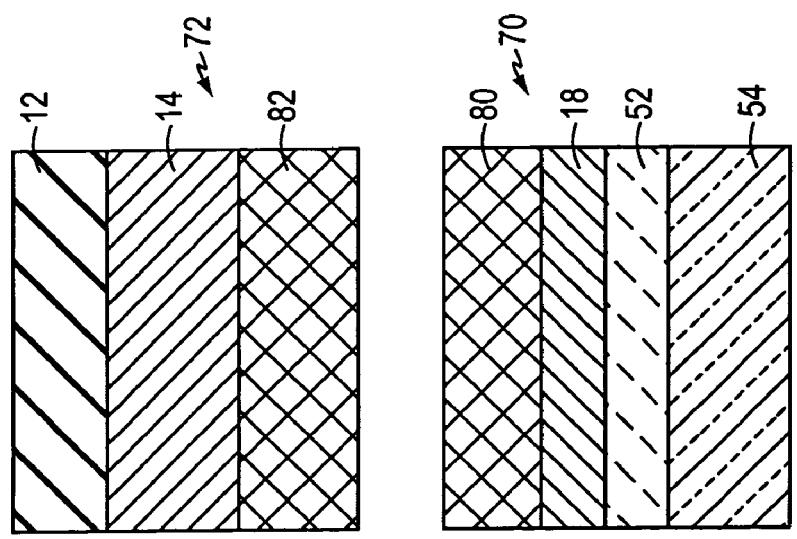

Referring to FIG. 4 as well as to FIG. 3, a split is induced at cleave plane 20 by annealing handle wafer 50 and epitaxial wafer 8 after they are bonded together. This split may be induced by an anneal at 300–700° C., e.g., 550° C., inducing hydrogen exfoliation layer transfer (i.e., along cleave plane 20) and resulting in the formation of two separate wafers 70, 72. One of these wafers (70) has a first portion 80 of relaxed layer 16 (see FIG. 1A) disposed over strained layer 18. Strained layer 18 is in contact with dielectric layer 52 on semiconductor substrate 54. The other of these wafers (72) includes substrate 12, graded layer 14, and a remaining portion 82 of relaxed layer 16. In some embodiments, wafer splitting may be induced by mechanical force in addition to or instead of annealing. If necessary, wafer 70 with strained layer 18 may be annealed further at 600–900° C., e.g., at a temperature greater than 800° C., to strengthen the bond between the strained layer 18 and dielectric layer 52. In some embodiments, this anneal is limited to an upper temperature of about 900° C. to avoid the destruction of a strained Si/relaxed SiGe heterojunction by diffusion. Wafer 72 may be planarized, and used as starting substrate 8 for growth of another strained layer 18. In this manner, wafer 72 may be "recycled" and the process illustrated in FIGS. 1A–5 may be repeated. An alternative "recyling" method may include providing relaxed layer 16 that is several microns thick and repeating the process illustrated in FIGS. 1A–5, starting with the formation of strained layer 18. Because the formation of this thick relaxed layer 16 may lead to bowing of substrate 12, a layer including, e.g., oxide or nitride, may be formed on the backside of substrate 12 to counteract the bowing. Alternatively substrate 12 may be pre-bowed when cut and polished, in anticipation of the bow being removed by the formation of thick relaxed layer 16.

Figure 5:
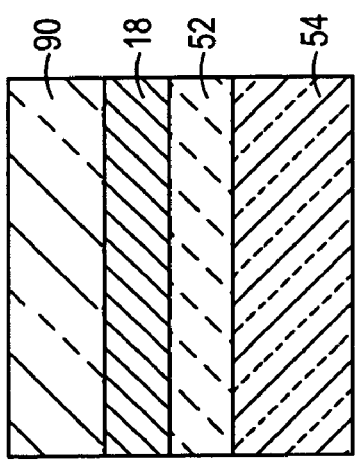

Referring to FIG. 4 as well as to FIG. 5, relaxed layer portion 80 is removed from strained layer 18. In an embodiment, removal of relaxed layer portion 80, containing, e.g., SiGe, includes oxidizing the relaxed layer portion 80 by wet (steam) oxidation. For example, at temperatures below approximately 800° C., such as temperatures between 600–750° C., wet oxidation will oxidize SiGe much more rapidly then Si, such that the oxidation front will effectively stop when it reaches the strained layer 18, in embodiments in which strained layer 18 includes Si. The difference between wet oxidation rates of SiGe and Si may be even greater at lower temperatures, such as approximately 400° C.–600° C. Good oxidation selectivity is provided by this difference in oxidation rates, i.e., SiGe may be efficiently removed at low temperatures with oxidation stopping when strained layer 18 is reached. This wet oxidation results in the transformation of SiGe to a thermal insulator 90, e.g., $Si_xGe_yO_z$. The thermal insulator 90 resulting from this oxidation is removed in a selective wet or dry etch, e.g., wet hydrofluoric acid. In some embodiments, it may be more economical to oxidize and strip several times, instead of just once.

In certain embodiments, wet oxidation may not completely remove the relaxed layer portion 80. Here, a localized rejection of Ge may occur during oxidation, resulting in the presence of a residual Ge-rich SiGe region at the oxidation front, on the order of, for example, several nanometers in lateral extent. A surface clean may be performed to remove this residual Ge. For example, the residual Ge may be removed by a dry oxidation at, e.g., 600° C., after the wet oxidation and strip described above. Another wet clean may be performed in conjunction with—or instead of—the dry oxidation. Examples of possible wet etches for removing residual Ge include a Piranha etch, i.e., a wet etch that is a mixture of sulfuric acid and hydrogen peroxide ($H_2SO_4$: $H_2O_2$) at a ratio of, for example, 3:1. An HF dip may be performed after the Piranha etch. Alternatively, an RCA SC1 clean may be used to remove the residual Ge. The process of Piranha or RCA SC1 etching and HF removal of resulting oxide may be repeated more than once. In an embodiment, relaxed layer portion including, e.g., SiGe, is removed by etching and annealing under a hydrochloric acid (HCl) ambient.

In the case of a strained Si layer, the surface Ge concentration of the final strained Si surface is preferably less than about $1\times10^{12}$ atoms/cm$^2$ when measured by a technique such as total reflection x-ray fluorescence (TXRF) or the combination of vapor phase decomposition (VPD) with a spectroscopy technique such as graphite furnace atomic absorption spectroscopy (GFAAS) or inductively-coupled plasma mass spectroscopy (ICP-MS). In some embodiments, after cleaving, a planarization step or a wet oxidation step may be performed to remove a portion of the damaged relaxed layer portion 80 as well as to increase the smoothness of its surface. A smoother surface may improve the uniformity of subsequent complete removal of a remainder of relaxed layer portion 80 by, e.g., wet chemical etching. After removal of relaxed layer portion 80, strained layer 18 may be planarized. Planarization of strained layer 18 may be performed by, e.g., CMP; an anneal at a temperature greater than, for example, 800° C., in a hydrogen ($H_2$) or hydrochloric acid (HCl) containing ambient; or cluster ion beam smoothing.

Figure 6:
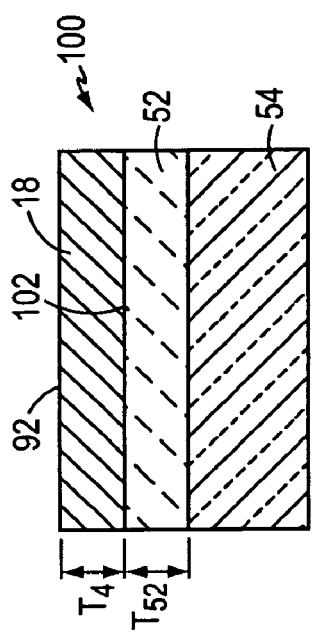

Referring to FIG. 6, a SSOI substrate 100 has strained layer 18 disposed over an insulator, such as dielectric layer 52 formed on semiconductor substrate 54. Strained layer 18 has a thickness $T_4$ selected from a range of, for example, 50–1000 Å, with a thickness uniformity of better than approximately ±5% and a surface roughness of less than approximately 20 Å. Dielectric layer 52 has a thickness $T_{52}$ selected from a range of, for example, 500–3000 Å. In an embodiment, strained layer 18 includes approximately 100% Si or 100% Ge having one or more of the following material characteristics: misfit dislocation density of, e.g., 0–105 cm/cm$^2$; a threading dislocation density of about $10^1$–$10^7$ dislocations/cm$^2$; a surface roughness of approximately 0.01–1 nm RMS; and a thickness uniformity across SSOI substrate 100 of better than approximately 110% of a mean desired thickness; and a thickness $T_4$ of less than approximately 200 Å. In an embodiment, SSOI substrate 100 has a thickness uniformity of better than approximately ±5% of a mean desired thickness.

In an embodiment, dielectric layer 52 has a $T_m$ greater than that of $SiO_2$. During subsequent processing, e.g., MOSFET formation, SSOI substrate 100 may be subjected to high temperatures, i.e., up to 1100° C. High temperatures may result in the relaxation of strained layer 18 at an interface between strained layer 18 and dielectric layer 52. The use of dielectric layer with a $T_m$ greater than 1700° C. may help keep strained layer 18 from relaxing at the interface between strained layer 18 and dielectric layer 52 when SSOI substrate is subjected to high temperatures.

In an embodiment, the misfit dislocation density of strained layer 18 may be lower than its initial dislocation density. The initial dislocation density may be lowered by, for example, performing an etch of a top surface 92 of strained layer 18. This etch may be a wet etch, such as a standard microelectronics clean step such as an RCA SC1, i.e., hydrogen peroxide, ammonium hydroxide, and water ($H_2O_2+NH_4OH+H_2O$), which at, e.g., 80° C. may remove silicon.

The presence of surface particles on strained layer 18, as described above with reference to FIG. 1A, may result in the formation of bonding voids at an interface 102 between strained layer 18 and dielectric layer 52. These bonding voids may have a density equivalent to the density of surface particles formed on strained layer 18, e.g., less than about 0.3 voids/cm$^2$.

In some embodiments, strained semiconductor layer 18 includes Si and is substantially free of Ge; further, any other layer disposed in contact with strained semiconductor layer 18 prior to device processing, e.g., dielectric layer 52, is also substantially free of Ge.

Figure 7:
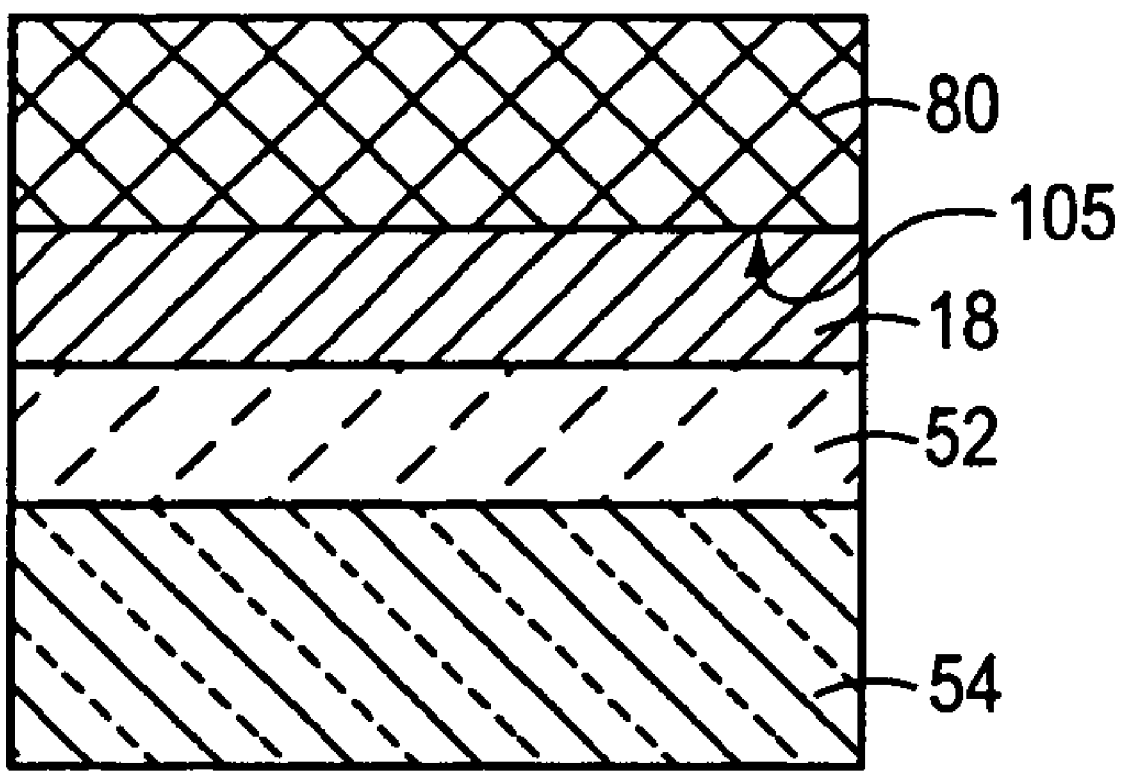
FIG. 7 is a schematic cross-sectional view illustrating an alternative method for fabricating the SSOI substrate illustrated in FIG. 6.

Referring to FIG. 7, in an alternative embodiment, relaxed layer portion 80 may be removed by a selective wet etch that stops at the strained layer 18 to obtain SSOI substrate 100 (see FIG. 6). In embodiments in which relaxed layer portion 80 contains SiGe, a suitable selective SiGe wet etch may be a solution containing nitric acid ($HNO_3$) and dilute HF at a ratio of 3:1 or a solution containing $H_2O_2$, HF, and acetic acid ($CH_3COOH$) at a ratio of 2:1:3. Alternatively, relaxed layer portion 80 may be removed by a dry etch that stops at strained layer 18. In some embodiments, relaxed layer portion 80 may be removed completely or in part by a chemical-mechanical polishing step or by mechanical grinding.

Figure 8A:
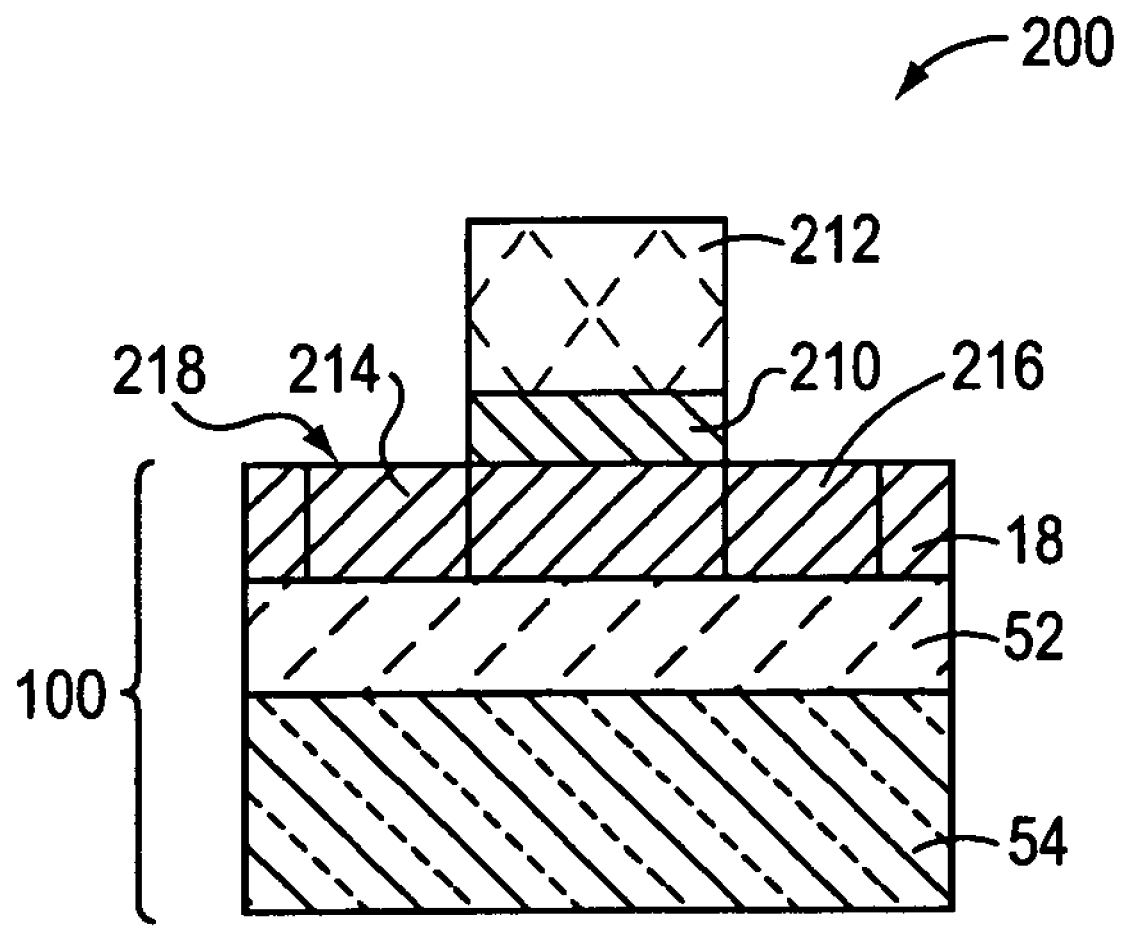
FIG. 8 is a schematic cross-sectional view of a transistor formed on the SSOI substrate illustrated in FIG. 6.

Strained semiconductor-on-insulator substrate 100 may be further processed by CMOS SOI MOSFET fabrication methods. For example, referring to FIG. 8A, a transistor 200 may be formed on SSOI substrate 100. Forming transistor 200 includes forming a gate dielectric layer 210 above strained layer 18 by, for example, growing an $SiO_2$ layer by thermal oxidation. Alternatively, gate dielectric layer 210 may include a high-k material with a dielectric constant higher than that of $SiO_2$, such as $HfO_2$, HfSiON, or $HfSiO_4$. In some embodiments, gate dielectric layer 210 may be a stacked structure, e.g., a thin $SiO_2$ layer capped with a high-k material. A gate 212 is formed over gate dielectric layer 210. Gate 212 may be formed of a conductive material, such as doped semiconductor, e.g., polycrystalline Si or polycrystalline SiGe; a metal, e.g., titanium (Ti), tungsten (W), molybdenum (Mo), tantalum (Ta), nickel (Ni), or iridium (Ir); or metal compounds, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$), that provide an appropriate workfunction. A source region 214 and a drain region 216 are formed in a portion 218 of strained semiconductor layer 18, proximate gate dielectric layer 210. Source and drain regions 214, 216 may be formed by, e.g., ion implantation of either n-type or p-type dopants.

In some embodiments, strained semiconductor layer 18 may be compressively strained when, for example, layer 18 includes strained Ge. Compressively strained layers may be prone to undulation when subjected to large temperature changes. The risk of such undulation may be reduced by reducing the thermal budget of a process for fabricating devices, such as transistor 200. The thermal budget may reduced by, for example, using atomic layer deposition (ALD) to deposit gate dielectric layer 210. Furthermore, a maximum temperature for forming gate 212 may be limited to, e.g., 600° C. by, for example, the use of materials comprising metal or metal compounds, rather than polysilicon or other gate materials that may require higher formation and/or dopant activation temperatures.

Figure 8B:
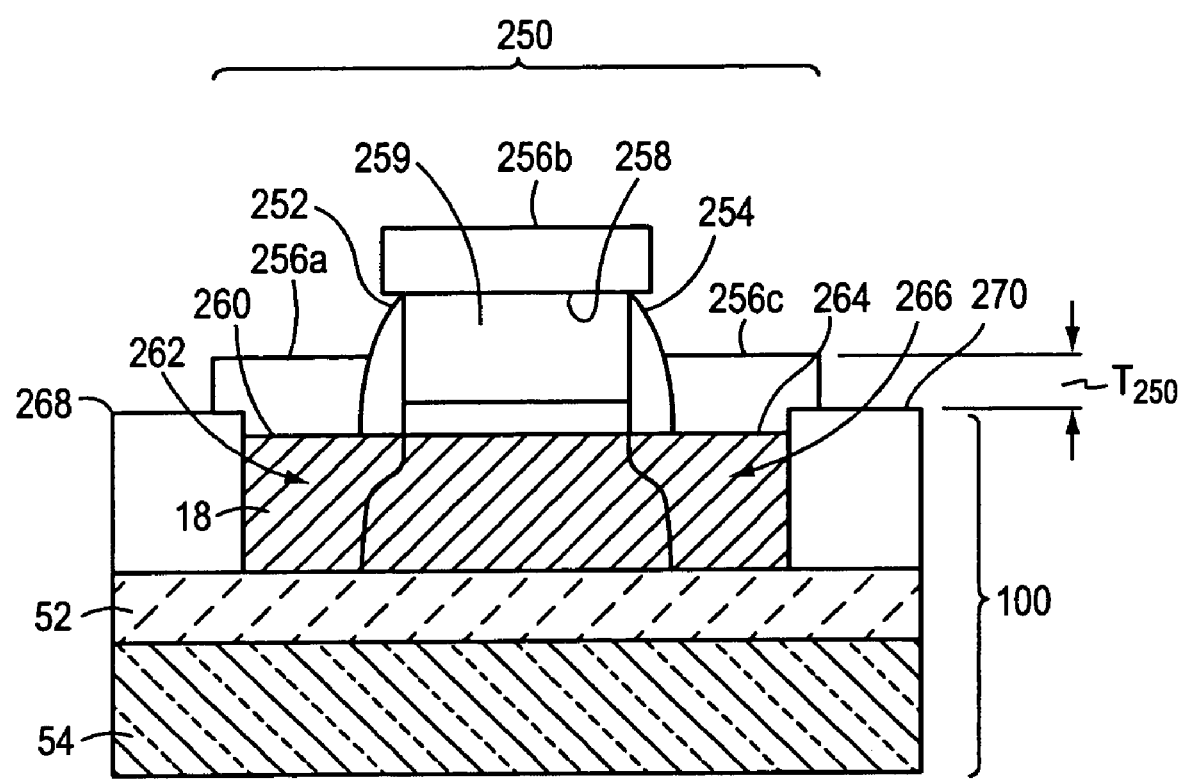

Referring to FIG. 8B, a transistor 250 formed on SSOI substrate 100 may have an elevated source region and an elevated drain region proximate a first and a second sidewall spacer 252, 254. These elevated regions may be formed as follows. A semiconductor layer 256a–256c is formed selectively on exposed silicon surfaces, i.e., on top surface 258 of a gate 259 containing silicon, a top surface 260 of a source 262 defined in strained layer 18, and top surface 264 of a drain 266 defined in strained layer 18. In an embodiment, semiconductor layer 256a–256c is an epitaxial layer, such as epitaxial silicon, epitaxial germanium, or epitaxial silicon-germanium. No semiconductor layer is formed on non-silicon features, such as sidewall spacers 252, 254 and dielectric isolation regions 268, 270. Semiconductor layer 256a–256c has a thickness $T_{256}$ of, for example, approximately 100–500 Å.

Semiconductor layer 256a–256c has a low resistivity of, e.g., 0.001 ohm-cm, that facilitates the formation of low-resistance contacts. To achieve this low resistivity, semiconductor layer 256a–256c is, for example, epitaxial silicon doped with, for example, arsenic to a concentration of $1\times10^{20}$ atoms/cm$^3$. Semiconductor layer 256a–256c may be doped in situ, during deposition. In alternative embodiments, semiconductor layer 256a–256c may be doped after deposition by ion implantation or by gas-, plasma- or solid-source diffusion. In some embodiments, the doping of semiconductor layer 256a–256c and the formation of source 262 and drain 266 are performed simultaneously. Portions of semiconductor layer 256a, 256c disposed over source 262 and drain 266 may have top surfaces substantially free of facets. In an embodiment, portions of source 262, drain 266, and/or gate 259 may be etched away to define recess prior to deposition of semiconductor layer 256a–256c, and semiconductor layer 256a–256c may then be deposited in the recesses thus formed.

Figure 8C:
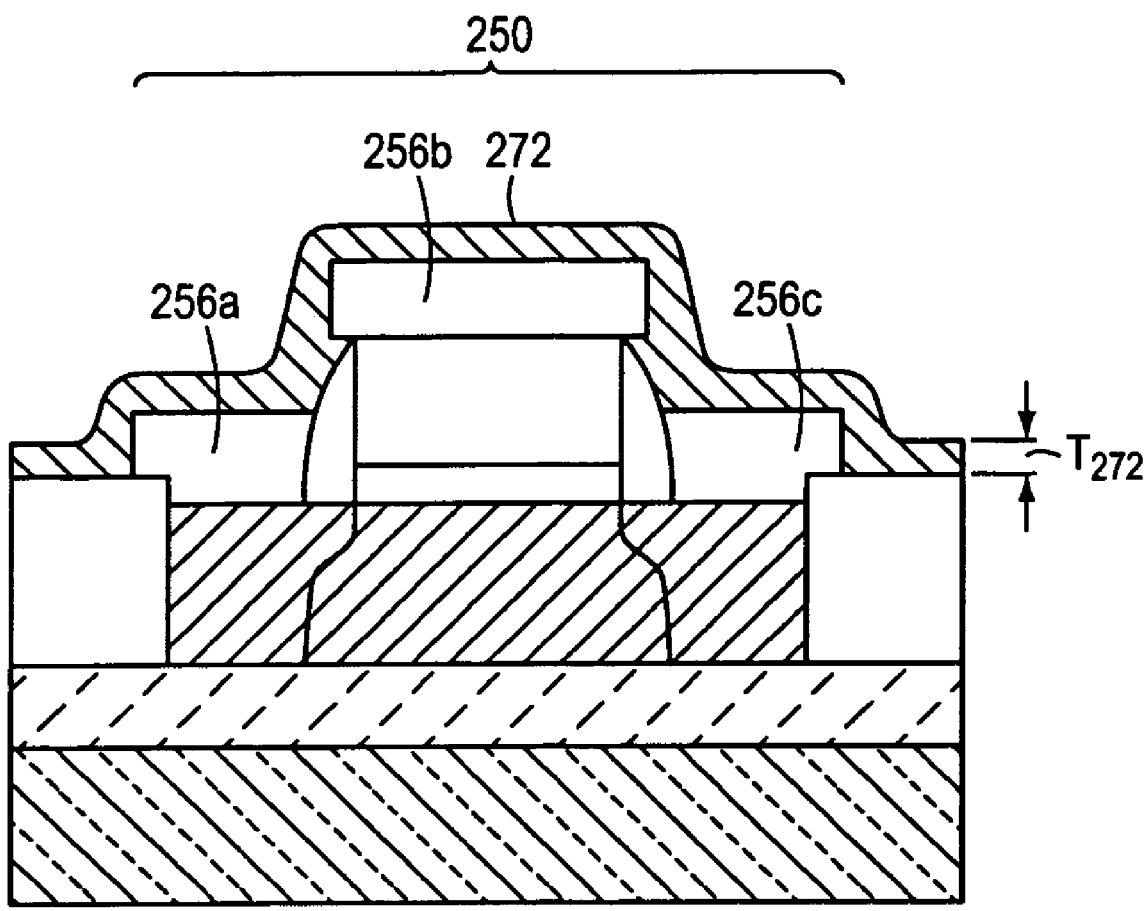

Referring to FIG. 8C, a metal layer 272 is formed over transistor 250. Metal layer 272 is formed by, for example, sputter deposition. Metal layer 272 has a thickness $T_{272}$ of, e.g., 50–200 Å and includes a metal such as cobalt, titanium, tungsten, nickel, or platinum. The metal is selected to react with semiconductor layer 256a–256c to form a low-resistance metal-semiconductor alloy when exposed to heat, as described below. The metal is also selected such that the metal-semiconductor alloy remains stable at temperatures typically required to complete transistor 250 fabrication, e.g., 400–700° C.

Figure 8D:
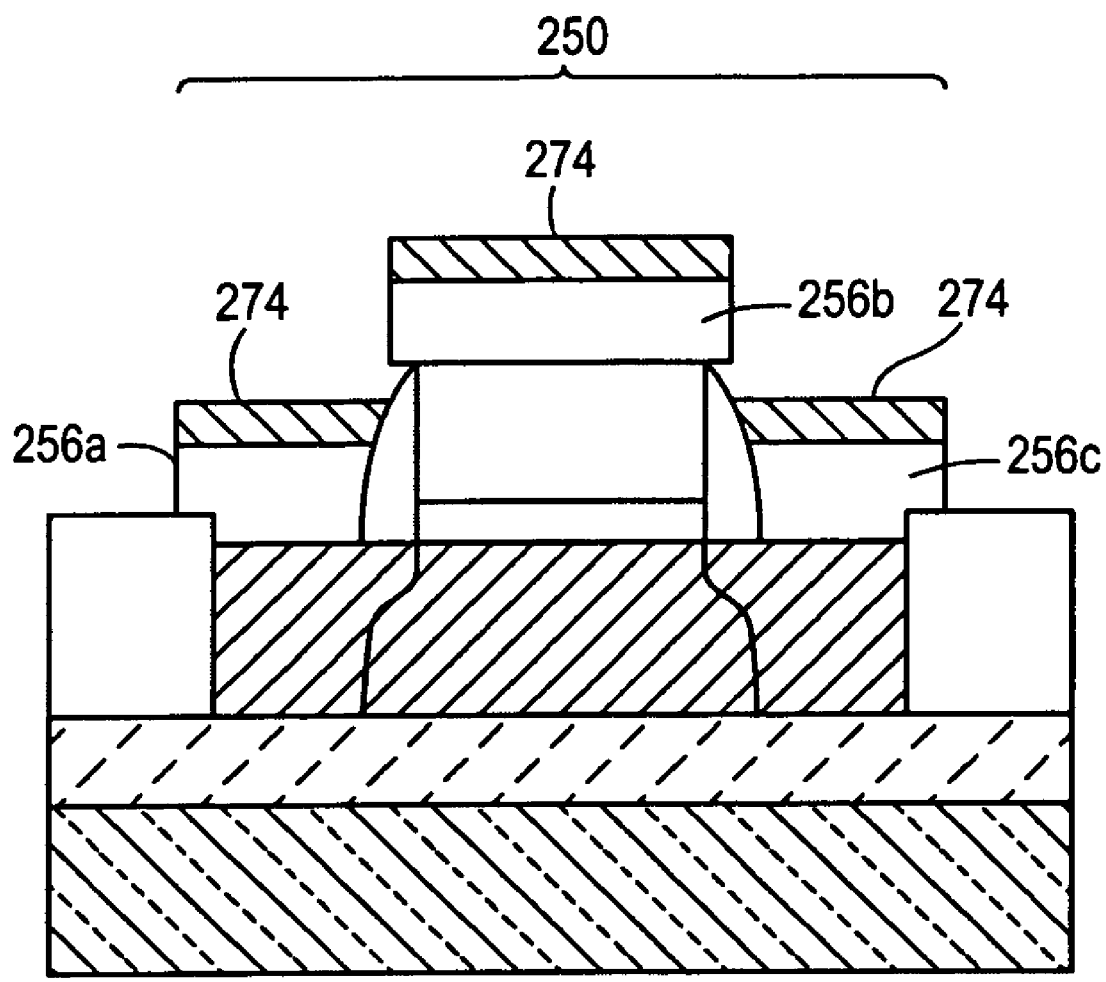

Referring also to FIG. 8D, subsequent to deposition of metal layer 272, a first rapid thermal anneal is performed, e.g., at 550° C. for 60 seconds. This heating step initiates a reaction between metal layer 272 and semiconductor layers 256a–256c, forming a high resistivity phase of a metal-semiconductor alloy, e.g., cobalt silicide (CoSi). Portions of metal layer 272 are removed by a wet etch, such as sulfuric acid and hydrogen peroxide. In an alternative embodiment, the wet etch may be ammonium hydroxide, peroxide, and water. This wet etch removes portions of metal layer 272 disposed over dielectric material, such as over first and second sidewall spacers 252, 254 and isolation regions 268, 270. Portions 274 of metal layer 272 disposed over semiconductor layer 256a–256c that have reacted to form the metal-semiconductor alloy remain in place after the anneal and wet etch.

Figure 8E:
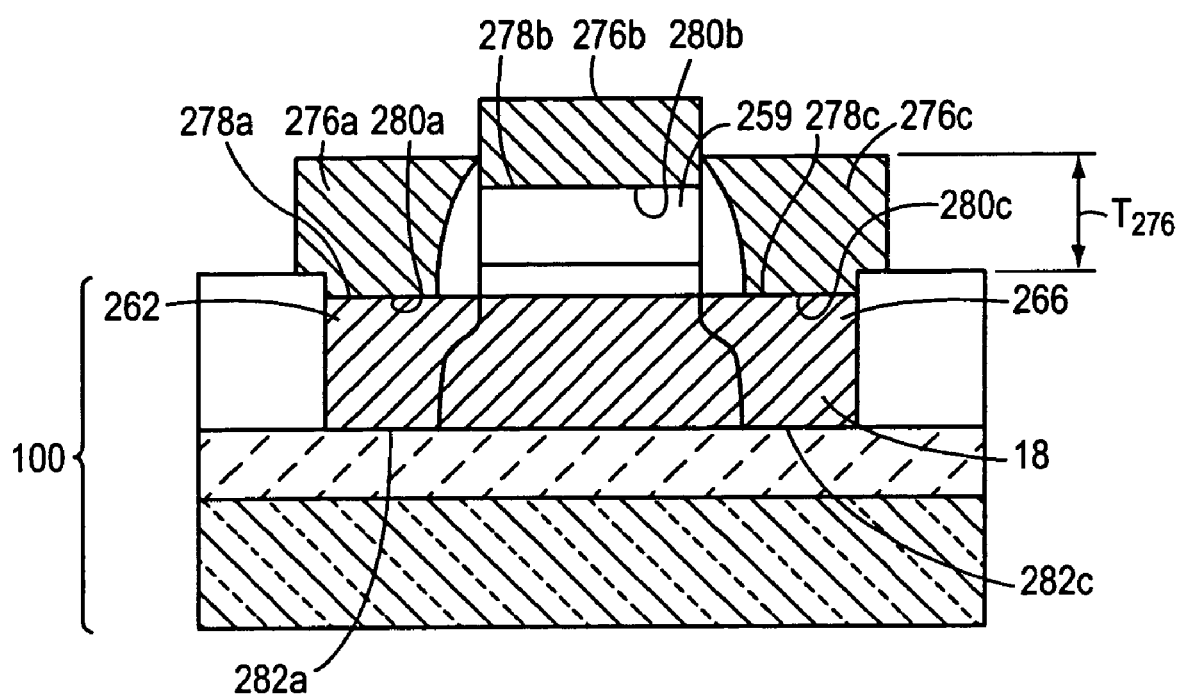

Referring to FIG. 8E, SSOI substrate 100, including transistor 250, is subjected to a second heat treatment. For example, in an embodiment in which metal layer 272 includes cobalt, SSOI substrate 100 undergoes a rapid thermal anneal at 800° C. for 60 seconds in a nitrogen ambient. This heating step initiates a reaction in the metal-semiconductor alloy layer which substantially lowers its resistivity, to form a substantially homogeneous contact layer 276a–276c. Contact layer 276a–276c includes a metal-semiconductor alloy, e.g., a metal silicide such as a low resistivity phase of cobalt silicide ($CoSi_2$). Contact layer 276a–276c has a thickness $T_{276}$ of, for example, 400 Å. Contact layer 276a–276c has a low sheet resistance, e.g., less than about 10 Ω/□, and enables a good quality contact to be made to source 262 and drain 266, as well as to gate 259.

In some embodiments, during formation, contact layer 276a–276c may consume substantially all of semiconductor layer 256a–256c. A bottommost boundary 278a of contact layer 276a, therefore, shares an interface 280a with strained layer 18 in source 262, and a bottommost boundary 278c of contact layer 276c, therefore, shares an interface 280c with strained layer 18 in drain 266. A bottommost boundary 278b of contact layer 276b shares an interface 280b with gate 259.

In other embodiments, contact layer portions 276a, 276c, disposed over source 262 and drain 266, may extend into strained layer 18. Interfaces 280a, 280c between contact layer 276a, 276c and strained layer 18 are then disposed within source 262 and drain 266, respectively, above bottommost boundaries 282a, 282c of strained layer 18. Interfaces 280a, 280c have a low contact resistivity, e.g., less than approximately $5 \times 10^{-7}$ Ω-cm$^2$. In certain other embodiments, during formation, contact layer 276a–276c may not consume all of semiconductor layer 256a–256c (see FIG. 8D). A bottommost boundary 278a of contact layer 276a, therefore, shares an interface with semiconductor layer 256a over source 262, and a bottommost boundary 278c of contact layer 276c, therefore, shares an interface with semiconductor layer 256c over drain 266.

Because strained layer 18 includes a strained material, carrier mobilities in strained layer 18 are enhanced, facilitating lower sheet resistances. This strain also results in a reduced energy bandgap, thereby lowering the contact resistivity between the metal-semiconductor alloy and the strained layer.

Figure 9:
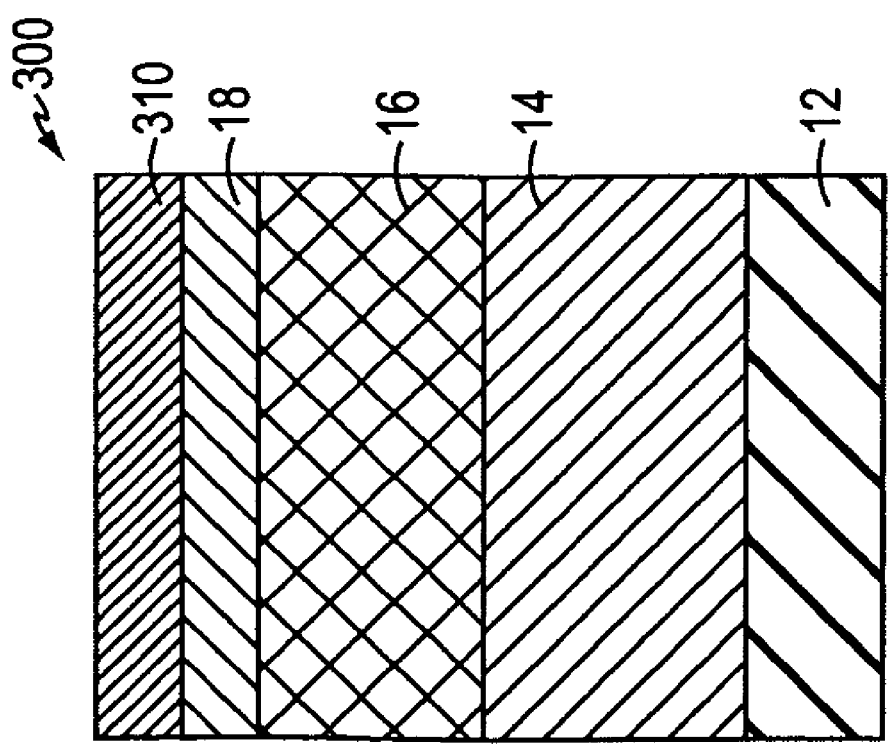

In alternative embodiments, an SSOI structure may include, instead of a single strained layer, a plurality of semiconductor layers disposed on an insulator layer. For example, referring to FIG. 9, epitaxial wafer 300 includes strained layer 18, relaxed layer 16, graded layer 14, and substrate 12. In addition, a semiconductor layer 310 is disposed over strained layer 18. Strained layer 18 may be tensilely strained and semiconductor layer 310 may be compressively strained. In an alternative embodiment, strained layer 18 may be compressively strained and semiconductor layer 310 may be tensilely strained. Strain may be induced by lattice mismatch with respect to an adjacent layer, as described above, or mechanically. For example, strain may be induced by the deposition of overlayers, such as $Si_3N_4$. In another embodiment, semiconductor layer 310 is relaxed. Semiconductor layer 310 includes a semiconductor material, such as at least one of a group II, a group III, a group IV, a group V, and a group VI element. Epitaxial wafer 300 is processed in a manner analogous to the processing of epitaxial wafer 8, as described with reference to FIGS. 1–7.

Figure 10:
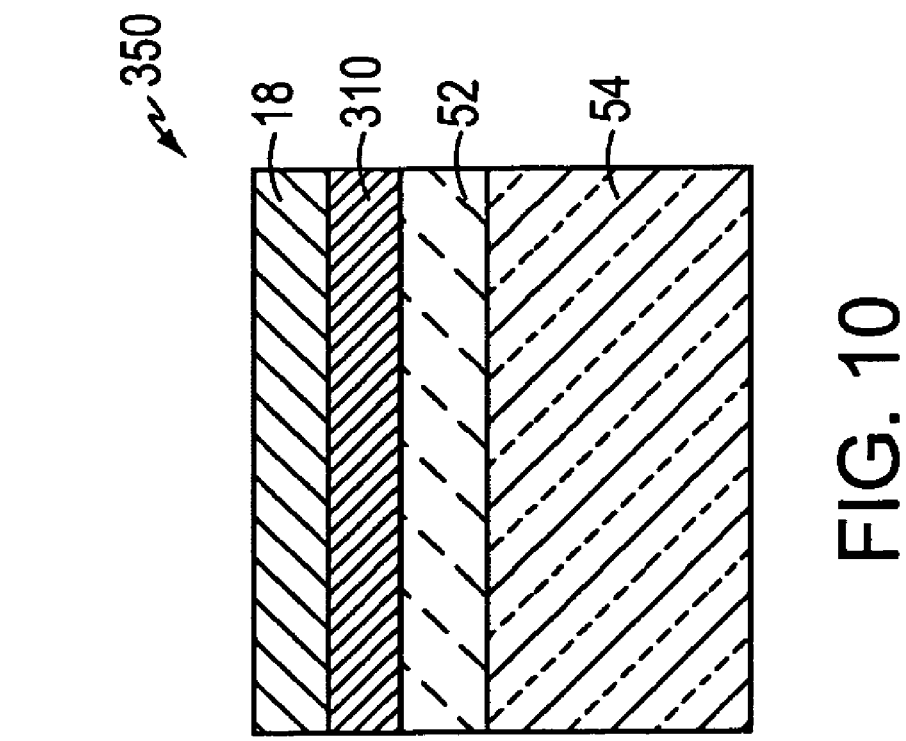
FIGS. 9–10 are schematic cross-sectional views of substrate(s) illustrating a method for fabricating an alternative SSOI substrate.

Referring also to FIG. 10, processing of epitaxial wafer 300 results in the formation of SSOI substrate 350, having strained layer 18 disposed over semiconductor layer 310. Semiconductor layer 310 is bonded to dielectric layer 52, disposed over substrate 54. As noted above with reference to FIG. 9, strained layer 18 may be tensilely strained and semiconductor layer 310 may be compressively strained. Alternatively, strained layer 18 may be compressively strained and semiconductor layer 310 may be tensilely strained. In some embodiments, semiconductor layer 310 may be relaxed.

Figure 11:
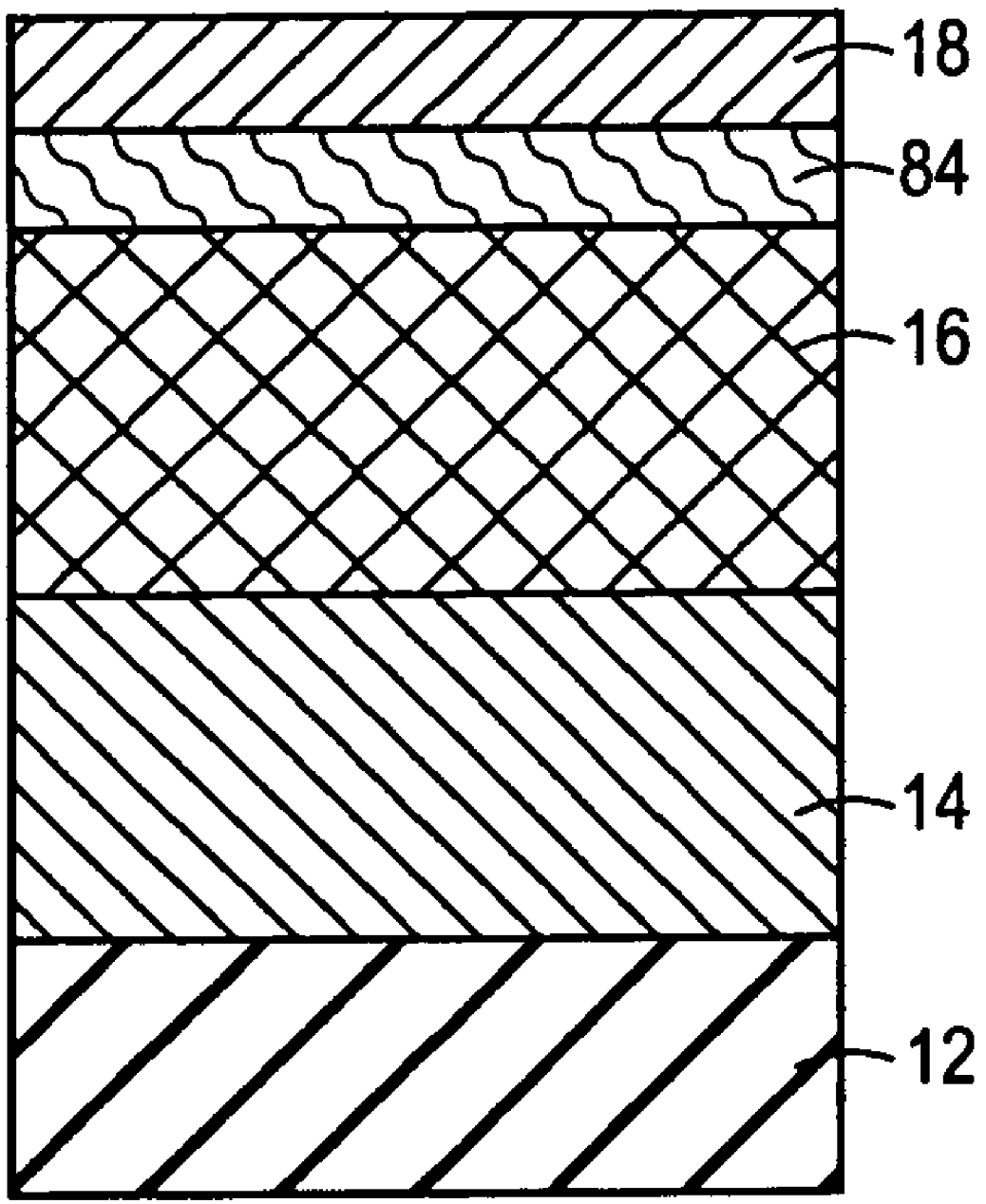
FIG. 11 is a schematic cross-sectional view of a substrate having several layers formed thereon.

Referring to FIG. 11, in some embodiments, a thin strained layer 84 may be grown between strained layer 18 and relaxed layer 16 to act as an etch stop during etching, such as wet etching. In an embodiment in which strained layer 18 includes Si and relaxed layer 16 includes $Si_{1-y}Ge_y$, thin strained layer 84 may include $Si_{1-x}Ge_x$, with a higher Ge content (x) than the Ge content (y) of relaxed layer 16, and hence be compressively strained. For example, if the composition of the relaxed layer 16 is 20% Ge ($Si_{0.80}Ge_{0.20}$), thin strained layer 84 may contain 40% Ge ($Si_{0.60}Ge_{0.40}$) to provide a more robust etch stop. In other embodiments, a second strained layer, such as thin strained layer 84 with higher Ge content than relaxed layer 16, may act as a preferential cleave plane in the hydrogen exfoliation/cleaving procedure described above.

In an alternative embodiment, thin strained layer 84 may contain $Si_{1-x}Ge_x$ with lower Ge content than relaxed layer 16. In this embodiment, thin strained layer 84 may act as a diffusion barrier during the wet oxidation process. For example, if the composition of relaxed layer 16 is 20% Ge ($Si_{0.80}Ge_{0.20}$), thin strained layer 84 may contain 10% Ge ($Si_{0.90}Ge_{0.10}$) to provide a barrier to Ge diffusion from the higher Ge content relaxed layer 16 during the oxidation process. In another embodiment, thin strained layer 84 may be replaced with a thin graded $Si_{1-z}Ge_z$ layer in which the Ge composition (z) of the graded layer is decreased from relaxed layer 16 to the strained layer 18.

Referring again to FIG. 7, in some embodiments, a small amount, e.g., approximately 20–100 Å, of strained layer 18 may be removed at an interface 105 between strained layer 18 and relaxed layer portion 80. This may be achieved by overetching after relaxed layer portion 80 is removed. Alternatively, this removal of strained layer 18 may be performed by a standard microelectronics clean step such as an RCA SC1, i.e., hydrogen peroxide, ammonium hydroxide, and water ($H_2O_2 + NH_4OH + H_2O$), which at, e.g., 80° C. may remove silicon. This silicon removal may remove any misfit dislocations that formed at the original strained layer 18/relaxed layer 80 interface 105 if strained layer 18 was grown above the critical thickness. The critical thickness may be defined as the thickness of strained layer 18 beyond which it becomes energetically favorable for the strain in the layer to partially relax via the introduction of misfit dislocations at interface 105 between strained layer 18 and relaxed layer 16. Thus, the method illustrated in FIGS. 1–7 provides a technique for obtaining strained layers above a critical thickness without misfit dislocations that may compromise the performance of deeply scaled MOSFET devices.

Figure 12:
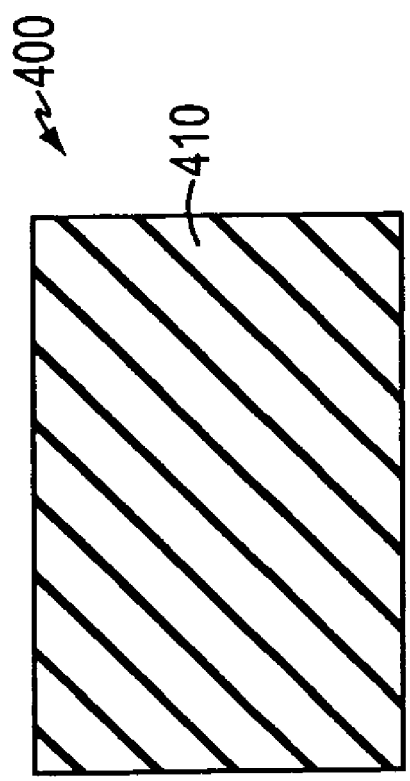

Referring to FIG. 12, in some embodiments, handle wafer 50 may have a structure other than a dielectric layer 52 disposed over a semiconductor substrate 54. For example, a bulk relaxed substrate 400 may comprise a bulk material 410 such as a semiconductor material, e.g., bulk silicon. Alternatively, bulk material 410 may be a bulk dielectric material, such as $Al_2O_3$ (e.g., alumina or sapphire) or $SiO_2$ (e.g., quartz). Epitaxial wafer 8 may then be bonded to handle wafer 400 (as described above with reference to FIGS. 1–6), with strained layer 18 being bonded to the bulk material 410 comprising handle wafer 400. In embodiments in which bulk material 410 is a semiconductor, to facilitate this semiconductor-semiconductor bond, a hydrophobic clean may be performed, such as an HF dip after an RCA SC1 clean.

Figure 13:
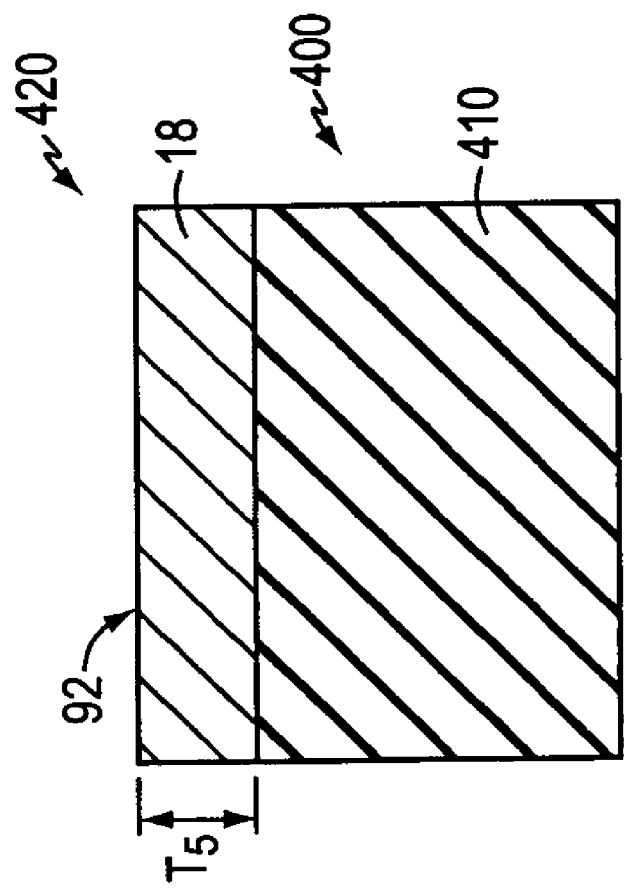
FIGS. 12–13 are schematic cross-sectional views of substrates illustrating a method for fabricating an alternative strained semiconductor substrate.

Referring to FIG. 13, after bonding and further processing (as described above), a strained-semiconductor-on-semiconductor (SSOS) substrate 420 is formed, having strained layer 18 disposed in contact with relaxed substrate 400. The strain of strained layer 18 is not induced by underlying relaxed substrate 400, and is independent of any lattice mismatch between strained layer 18 and relaxed substrate 400. In an embodiment, strained layer 18 and relaxed substrate 400 include the same semiconductor material, e.g., silicon. Relaxed substrate 400 may have a lattice constant equal to a lattice constant of strained layer 18 in the absence of strain. Strained layer 18 may have a strain greater than approximately $1 \times 10^{-3}$. Strained layer 18 may have been formed by epitaxy, and may have a thickness $T_5$ of between approximately 20 Å–1000 Å, with a thickness uniformity of better than approximately 110%. In an embodiment, strained layer 18 may have a thickness uniformity of better than approximately ±5%. Surface 92 of strained layer 18 may have a surface roughness of less than 20 Å.

Figure 14:
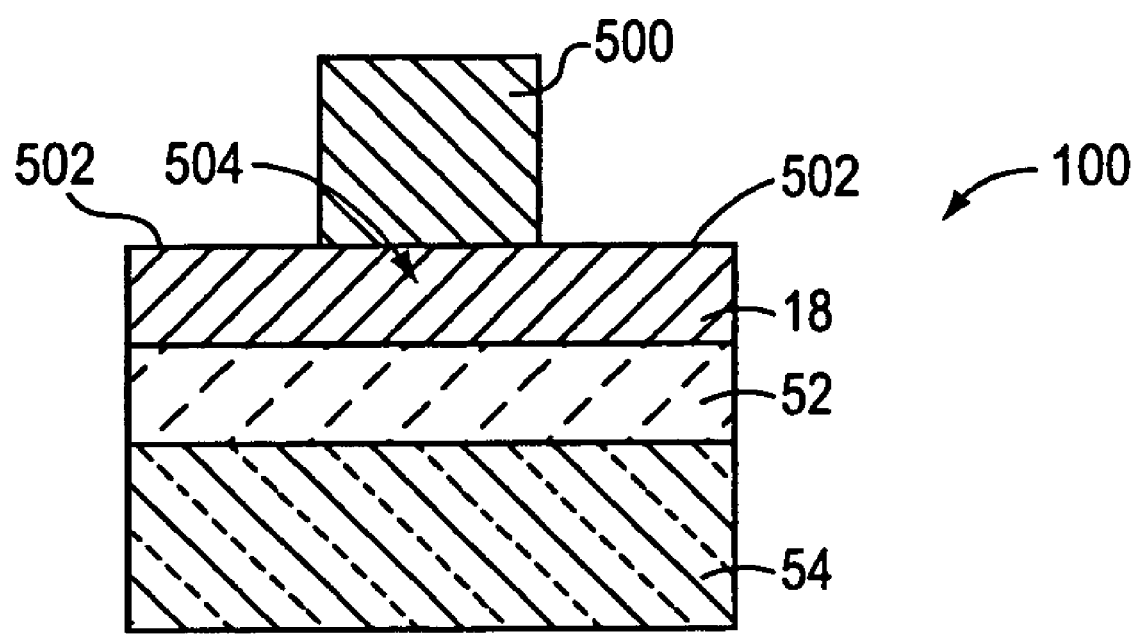
FIG. 14 is a schematic cross-sectional view of the SSOI substrate illustrated in FIG. 6 after additional processing.

Referring to FIG. 14, in an embodiment, after fabrication of the SSOI structure 100 including semiconductor substrate 54 and dielectric layer 52, it may be favorable to selectively relax the strain in at least a portion of strained layer 18. This could be accomplished by introducing a plurality of ions by, e.g., ion implantation after a photolithography step in which at least a portion of the structure is masked by, for example, a photoresist feature 500. Ion implantation parameters may be, for example, an implant of Si ions at a dose of $1 \times 10^{15} - 1 \times 10^{17}$ ions/cm$^2$, at an energy of 5–75 keV. After ion implantation, a relaxed portion 502 of strained layer 18 is relaxed, while a strained portion 504 of strained layer 18 remains strained.

Devices

In addition to the transistors described above with reference to FIGS. 8A–8E, various other transistors may be formed on SSOI substrate 100 fabricated by the methods described above All of these transistors may also be formed on SSOI substrate 100 fabricated with the use of a porous semiconductor substrate, as described below with reference to FIGS. 40A–41D.

FinFET

A finFET (or any variant of the basic finFET structure such as the wrap-around gate FET, tri-gate FET, or omega FET) may be fabricated on SSOI substrate 100 as described below. The finFET and related devices include two gates located on either side of a FET channel region. Unlike in a traditional planar FET, this channel region is raised above the wafer surface: the channel (or portions of the channel) falls in a plane perpendicular to the wafer surface. There may in addition be gates above and/or below the channel region, such as in the wrap-around gate FET.

Figure 15:
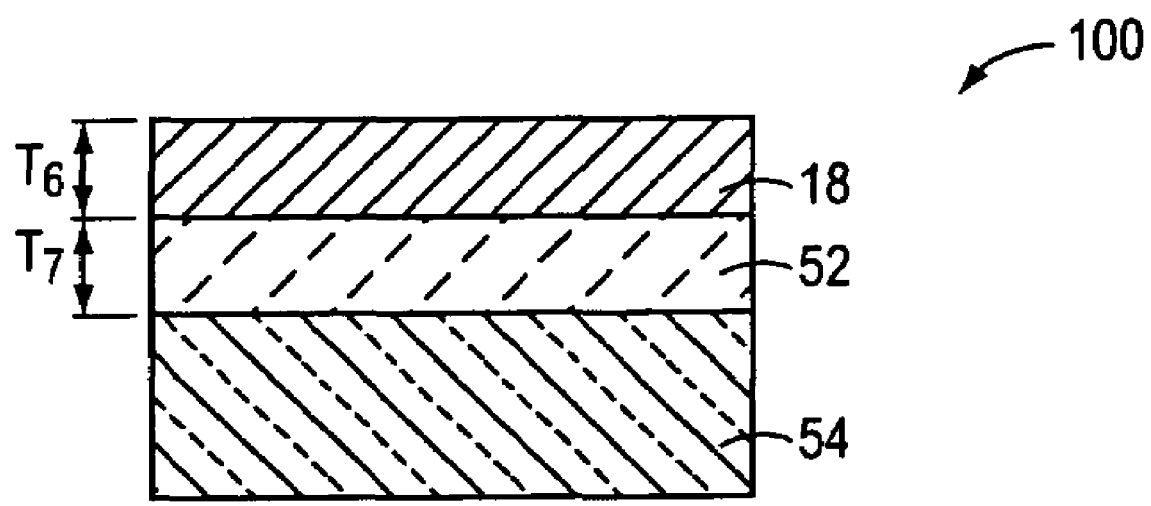
FIGS. 15–21B are cross-sectional and top views of substrates illustrating a method for fabricating a fin-field-effect transistor (finFET) on an SSOI substrate.

Referring to FIG. 15, SSOI substrate 100 includes strained layer 18 and dielectric layer 52 disposed over substrate 54. In an embodiment, strained layer 18 includes Si and has thickness $T_6$ of, e.g., 200–1000 Å. Dielectric layer 52 may be formed from $SiO_2$, with thickness $T_7$ selected from the range of, e.g., 500–3000 Å. Substrate 54 may be formed from, e.g., Si.

Figure 16A:
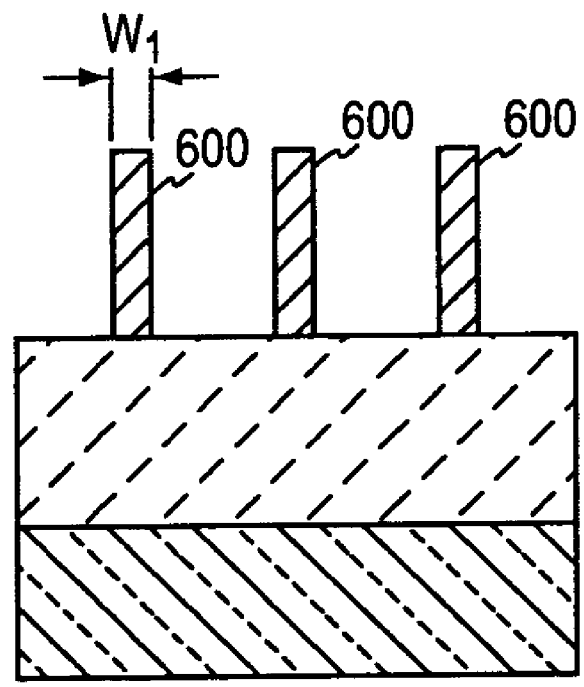
Figure 16B:
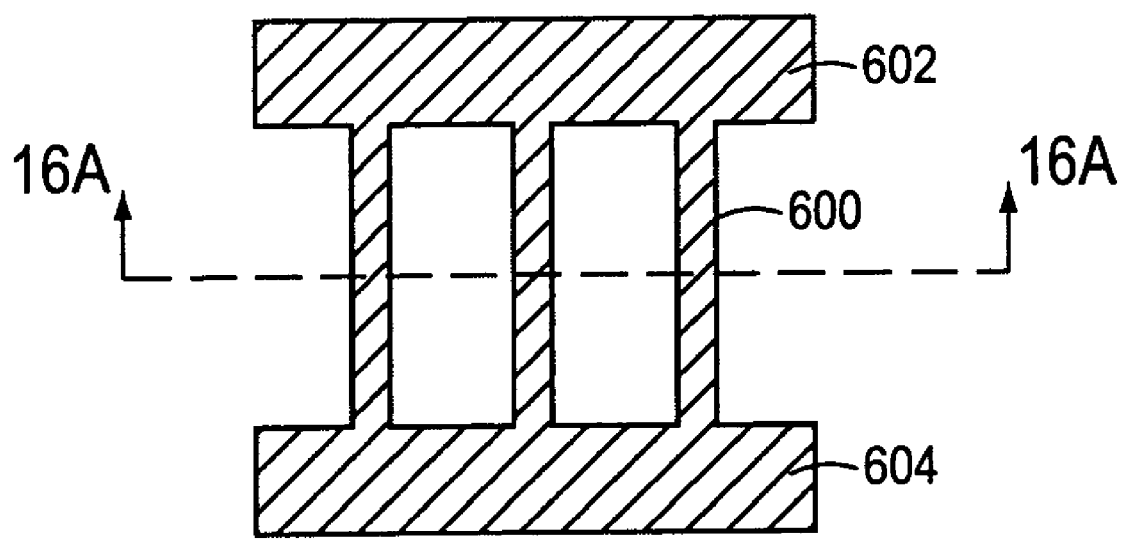

Referring to FIGS. 16A and 16B, strained layer 18 is patterned to define a plurality of fins 600. Fins 600 are defined by the formation of a photolithographic mask (not shown) over strained layer 18, followed by anisotropic reactive ion etching (RIE) of strained layer 18. Fins 600 have a width $W_1$ of, e.g., 50–300 Å. The photomask/RIE steps also define source mesa region 602 and drain mesa region 604. Fins 600, source mesa region 602, and source mesa region 604 include portions of strained layer 18 not removed by RIE. The photolithographic mask is removed after the RIE of strained layer 18.

Figure 17:
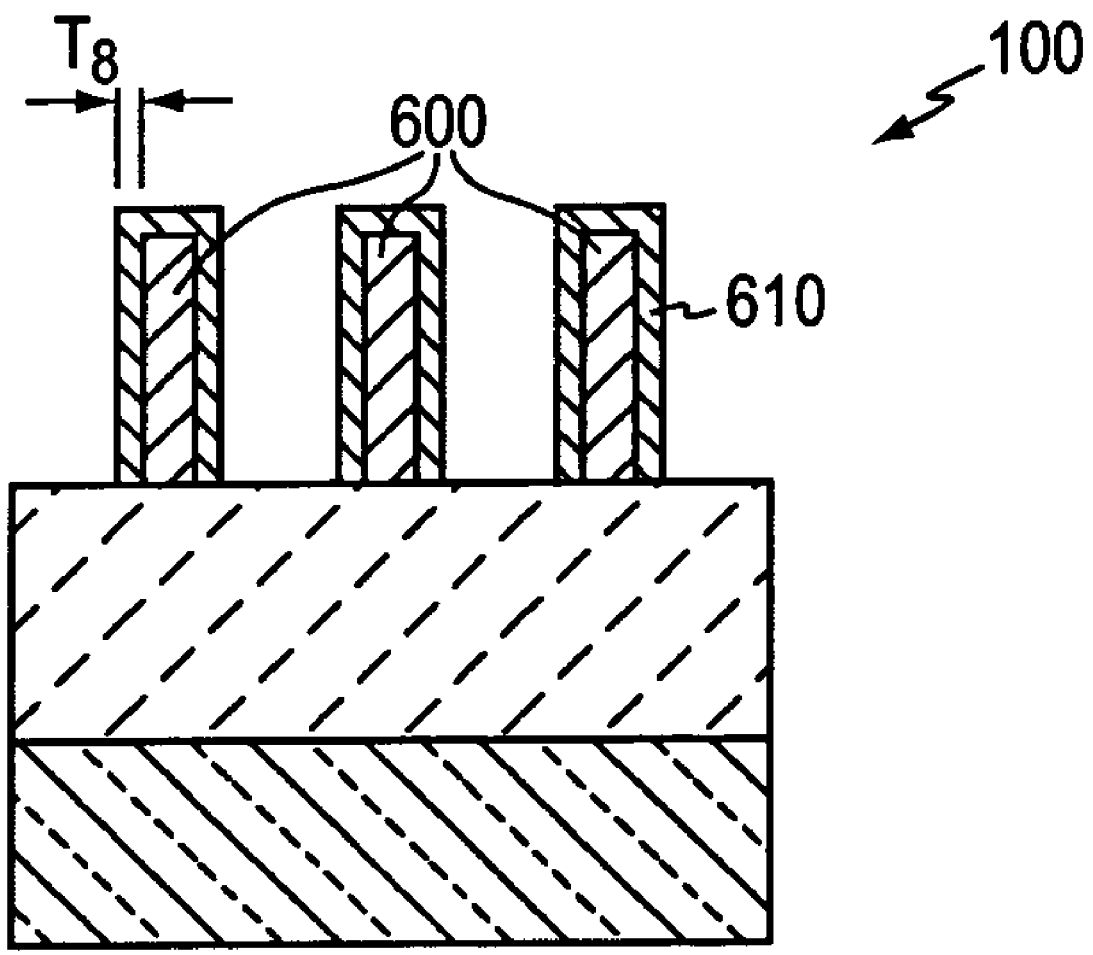

Referring to FIG. 17, a gate insulator layer 610 is formed over SSOI substrate 100. Gate insulator layer 610 is conformally formed over fins 600, as well as over source and drain mesa regions 602, 604. Gate insulator layer 610 may include, e.g., thermally grown $SiO_2$, or a high-k dielectric like $HfO_2$ or HfSiON, and have a thickness $T_8$ of, e.g., 10–100 Å. In some embodiments, gate insulator layer 610 is grown, and is therefore formed only over exposed silicon surfaces, i.e., over fins 600 and source and drain mesa regions 602, 604. In other embodiments, gate insulator layer 610 is deposited, and is therefore formed over an entire top surface of SSOI substrate 100.

Figure 18A:
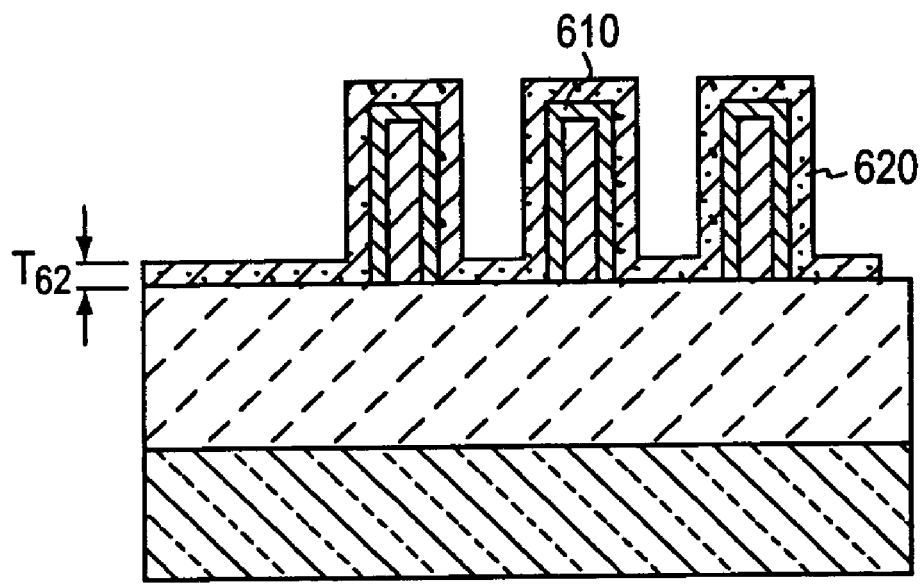
Figure 18B:
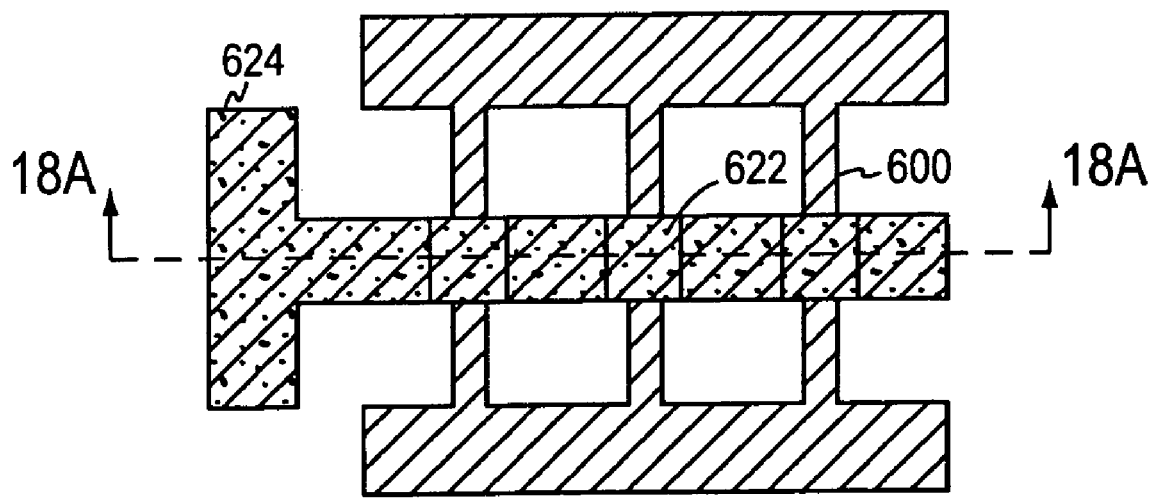

Referring to FIGS. 18A and 18B, a gate electrode material 620 is conformally formed over gate insulator layer 610, including over fins 600. Gate electrode material 620 may be, e.g., polycrystalline silicon ("polysilicon"), deposited by CVD, such as by UHVCVD, APCVD, LPCVD, or PECVD, having a thickness $T_{62}$ selected from the range of, e.g., 100–2000 Å. A photolithographic mask (not shown) is formed over gate electrode material 620. Portions of gate electrode material 620 are selectively removed by, e.g., RIE to define a gate 622 crossing over fins 600, and terminating in a gate contact area 624. Portions of gate insulator layer 610 are exposed (or even removed) by the RIE of gate electrode material 620.

Figure 19A:
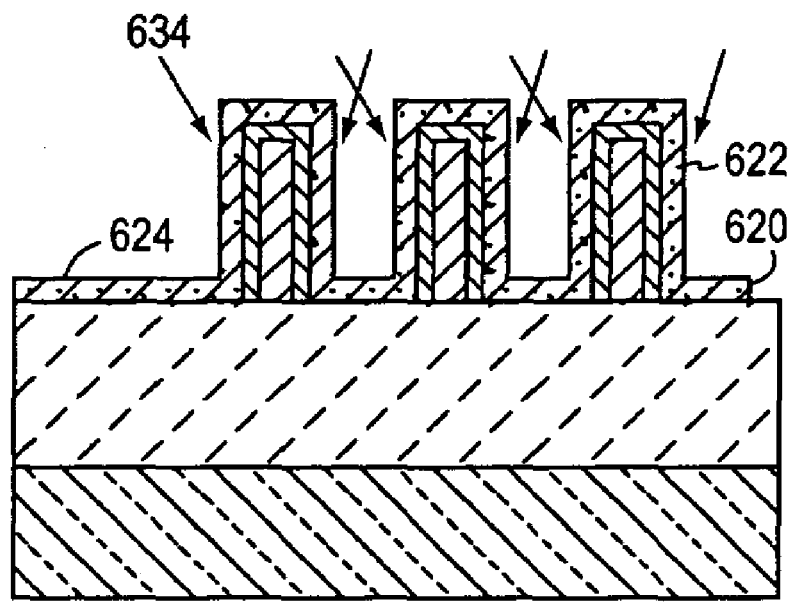
Figure 19B:
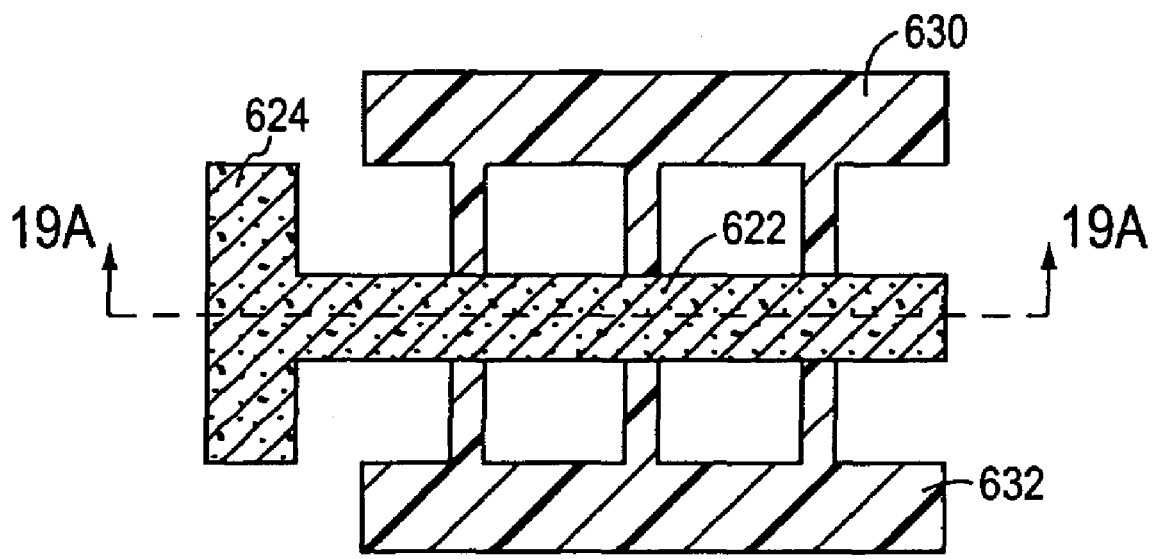

Referring to FIGS. 19A and 19B, a plurality of dopants are introduced into source and drain mesa regions 602, 604 to define source 630 and drain 632. To form an n-type finFET, dopants such as arsenic or phosphorus may be implanted into mesa regions 602, 604. Possible implantation parameters may be, for example, arsenic with a dose of $2 \times 10^{15}$ atoms/cm$^2$ implanted at an energy of 10–50 kiloelectron volts (keV). To form a p-type finFET, dopants such as boron may be implanted into mesa regions 602, 604. Possible implantation parameters may be, for example, boron, with a dose of $2 \times 10^{15}$ atoms/cm$^2$ at an energy of 3–15 keV. For the formation of a CMOS device, NMOS regions may be protected by a mask during the implantation of p-type dopants into PMOS regions. Similarly, PMOS regions may be protected by a mask during the implantation of n-type dopants into NMOS regions. A suitable mask for both types of implantation may be, e.g., photoresist.

During the introduction of dopants into source and drain mesa regions 602, 604, a plurality of gate dopants 634 are also introduced into gate 622 and gate contact area 624. Gate dopants 634 serve to increase a conductivity of gate electrode material 620. Gate dopants 630 may be, for example, implanted arsenic or phosphorous ions for an n-type finFET.

Dopants for both n-type and p-type finFETs may be implanted at an angle of 20–50°, with zero degrees being normal to SSOI substrate 100. Implanting at an angle may be desired in order to implant ions into a side of exposed fins 600 and also into a side of the vertical surfaces of gate electrode material 620.

Figure 20A:
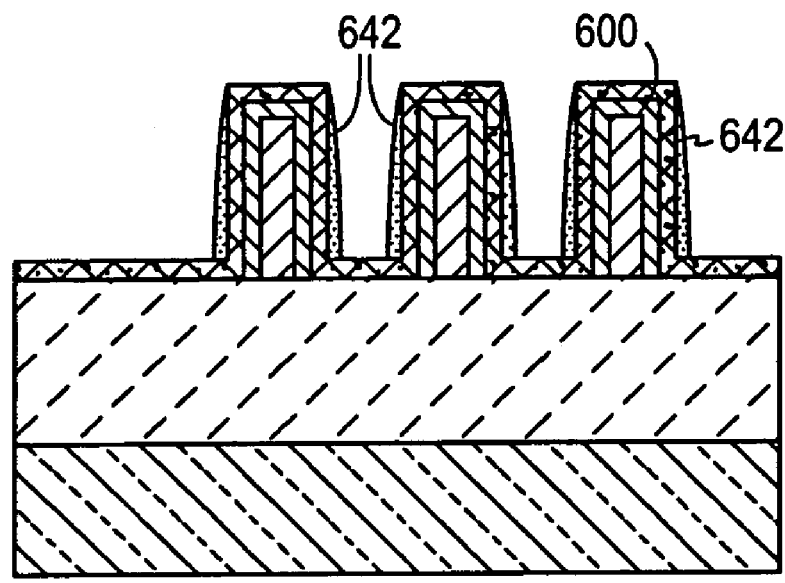
Figure 20B:
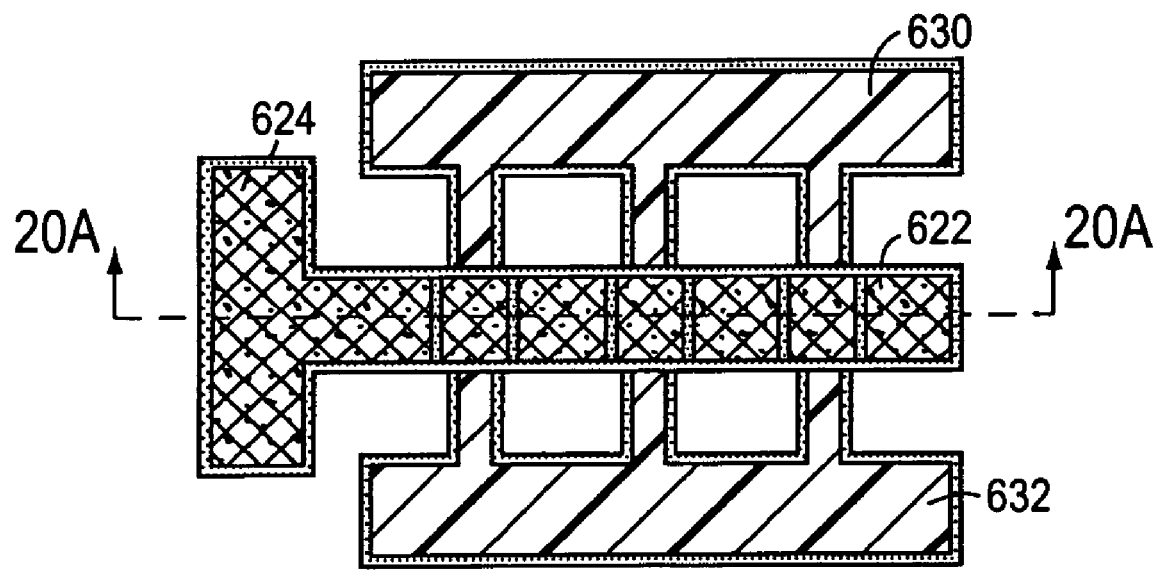

Referring to FIGS. 20A and 20B, a blanket layer of spacer insulator material is formed over SSOI substrate 100, including over gate 622, gate contact 624, source 630, and drain 632. Spacer insulator material may be, for example, $SiO_2$ or $Si_3N_4$ deposited by CVD and have a thickness $T_9$ of, for example, 100–1000 Å. Subsequently, portions of spacer insulator material are removed by an anisotropic RIE to define a plurality of sidewall spacers 642 proximate vertical surfaces, such as fins 600, gate 622, and gate contact area 624. Horizontal surfaces, such as top surfaces of fins 600, are substantially free of the spacer insulator material.

After the RIE definition of sidewall spacers 642, the portions of gate insulator layer 610 exposed by the RIE of gate electrode material 620 may be removed from top surfaces of source 630, and drain 632 by, e.g., a dip in hydrofluoric acid (HF), such as for 5–30 seconds in a solution containing, e.g., 0.5–5% HF. Alternately, this removal may be via RIE, with an etchant species such as, e.g., $CHF_3$.

Figure 21A:
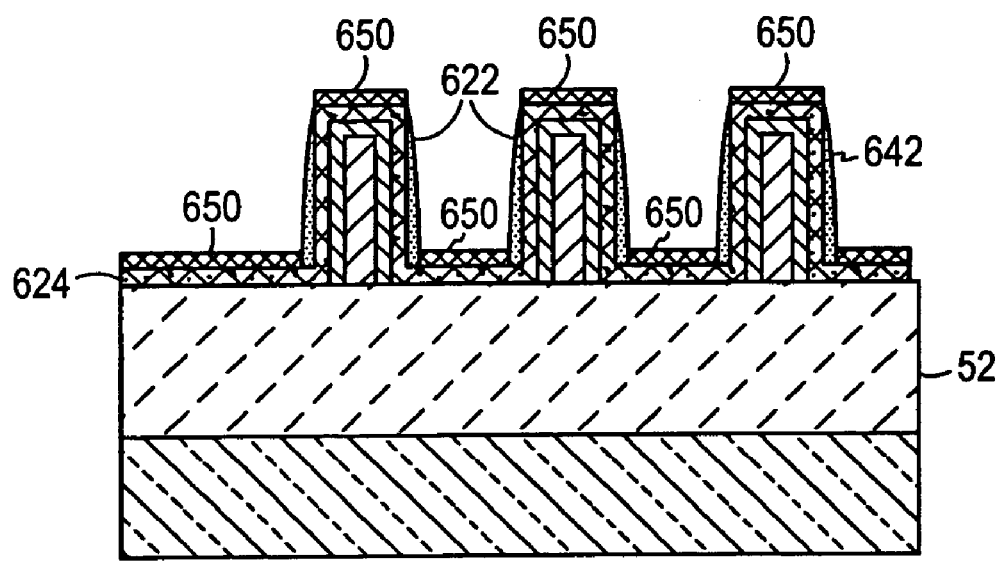
Figure 21B:
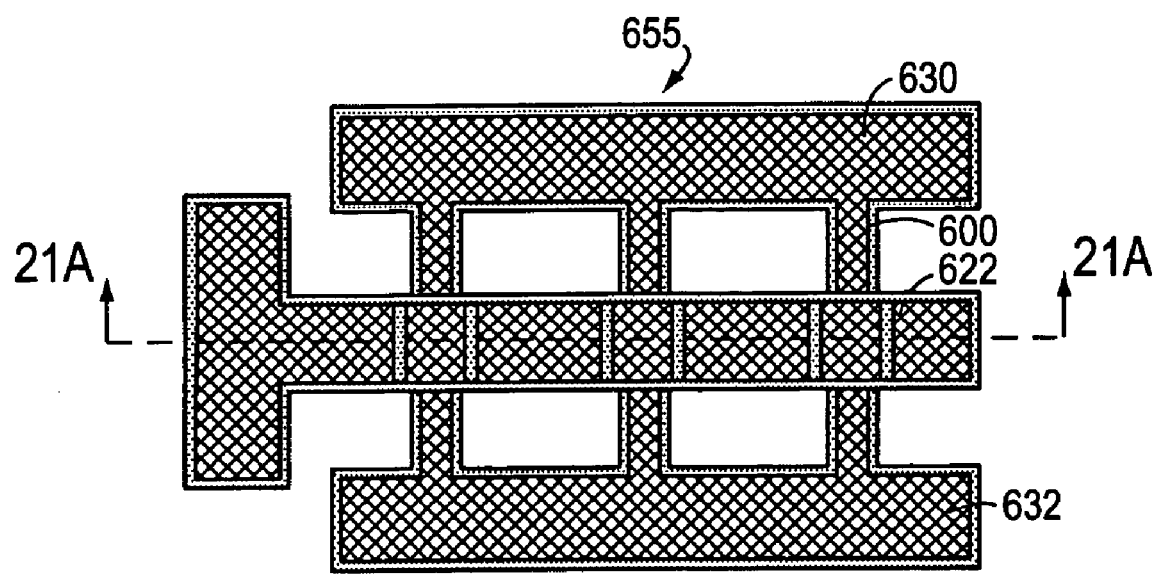

Referring to FIGS. 21A and 21B, a self-aligned silicide ("salicide") is formed over SSOI substrate 100 to provide low resistance contacts as follows. A conductive layer is formed over SSOI substrate 100. For example, a metal such as cobalt or nickel is deposited by, e.g., CVD or sputtering, with the conductive layer having a thickness of, e.g., 50–200 Å. An anneal is performed to react the conductive layer with the underlying semiconductor, e.g., exposed portions of gate 622 and gate contact area 624, to form salicide 650 including, e.g., cobalt silicide or nickel silicide. Anneal parameters may be, for example, 400–800° C. for 10–120 seconds. Unreacted portions of the conductive layer disposed directly over insulator material, such as exposed portions of dielectric layer 52 and sidewall spacers 642, are removed by a chemical strip. A suitable chemical strip may be a solution including $H_2SO_4:H_2O_2$ at a ratio of 3:1. A second anneal may be performed to further lower resistivity of salicide 650. The second anneal parameters may be, for example, 600–900° C. for 10–120 seconds. A finFET 655 includes fins 600, gate insulator 610, source 630, drain 632, and gate 622. A finFET 655 having three fins 600 is illustrated in FIG. 21B. The three fins 600 share a common source 630 and a common drain 632. A single transistor may have multiple fins to increase current drive in comparison to a transistor with a single fin.

In an alternative embodiment, gate dielectric material may be removed from the top surfaces of the source and drain mesa regions immediately after the RIE of the gate electrode. In some embodiments, raised source and drain regions may be formed, as described above with reference to FIGS. 8B–8D.

Double gate MOSFETs

Figure 22:
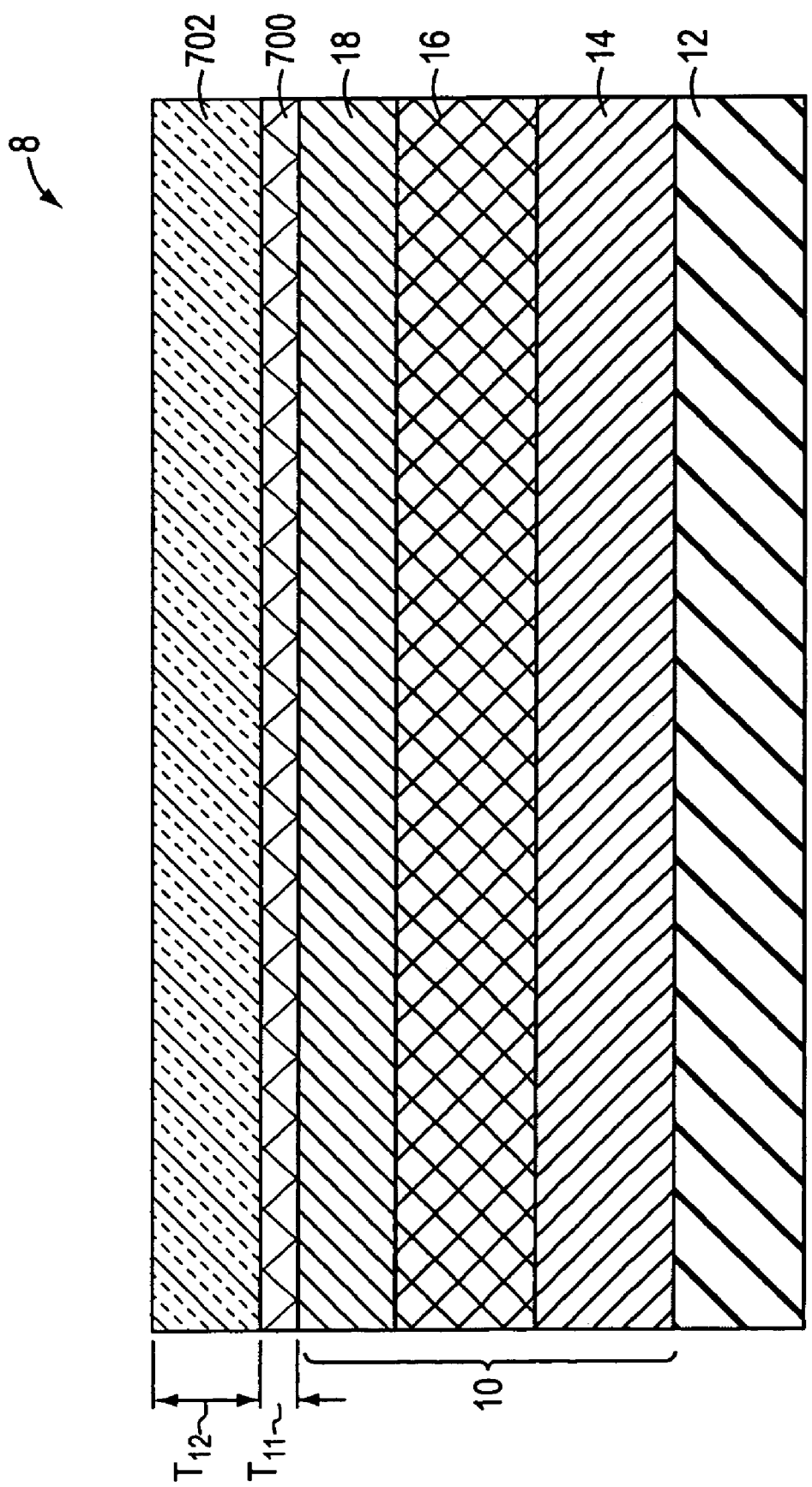
FIGS. 22–35 are cross-sectional views of substrates illustrating a method for fabricating a dual-gate transistor on an SSOI substrate.

Referring to FIG. 22 as well as to FIG. 1A, epitaxial wafer 8 has layers 10 disposed over substrate 12. Substrate 12 may be formed of a semiconductor, such as Si, Ge, or SiGe. The plurality of layers 10 includes graded buffer layer 14, formed of $Si_{1-y}Ge_y$, with a maximum Ge content of, e.g., 10–80% (i.e., y=0.1–0.8). Relaxed layer 16 is disposed over graded buffer layer 14. Relaxed layer 16 may be formed of uniform $Si_{1-x}Ge_x$ having a Ge content of, for example, 10–80% (i.e., x=0.1–0.8). Strained semiconductor layer 18 is disposed over relaxed layer 16. Strained layer 18 comprises at least one of a group II, a group III, a group IV, a group V, and a group VI element. Strained layer 18 may include, for example, Si and may be tensilely strained.

A first gate insulator layer 700 is formed over strained layer 18. First gate insulator layer 700 may include $SiO_2$ or a high-k dielectric like $HfO_2$ or HfSiON, and may be grown or deposited. First gate insulator layer 700 may have a thickness $T_{11}$ of, e.g., 10–100 Å. A first gate electrode layer 702 is formed over first gate insulator layer 700. First gate electrode layer 702 may include a conductive material, for example, doped polycrystalline silicon or tungsten, and may have a thickness $T_{12}$ of, for example, 500–2000 Å.

Figure 23:
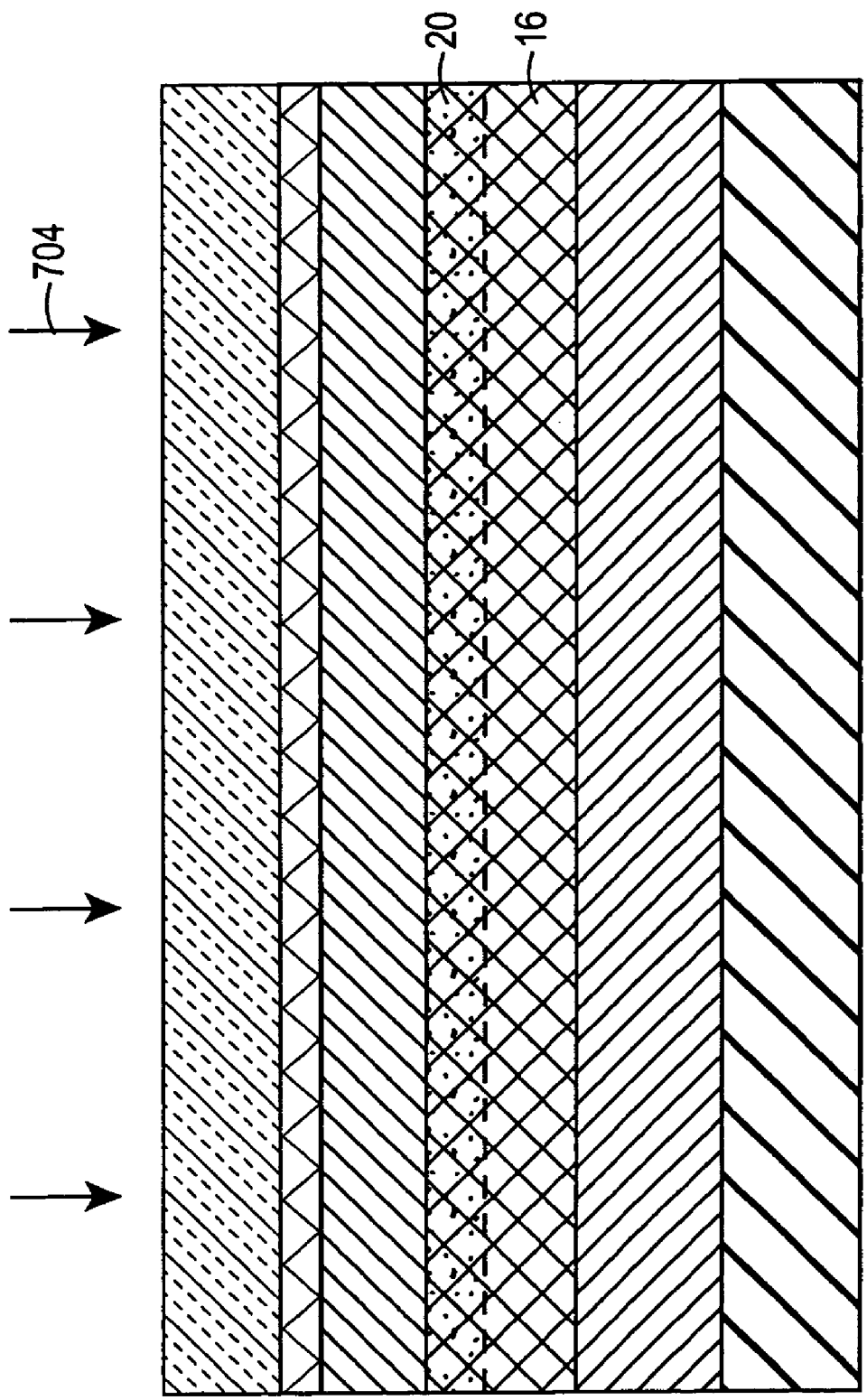

Referring to FIG. 23, ions 704 are introduced to define cleave plane 20 in relaxed layer 16, in the manner described above with reference to FIG. 2A.

Figure 24:
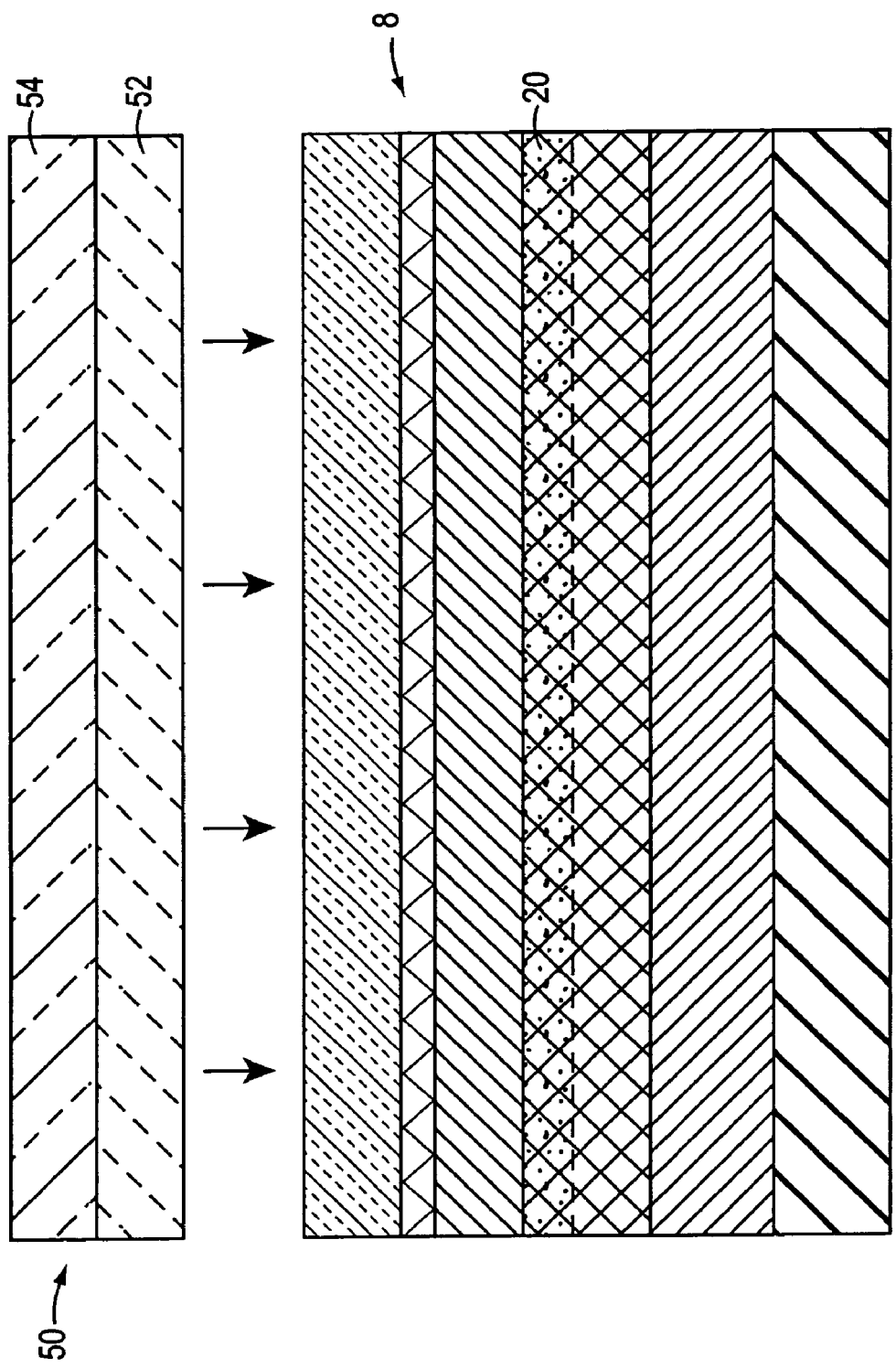

Referring to FIG. 24, epitaxial wafer 8 is bonded to handle wafer 50, in the manner described above with reference to FIG. 3. Handle wafer 50 includes dielectric layer 52 disposed over semiconductor substrate 54.

Figure 25:
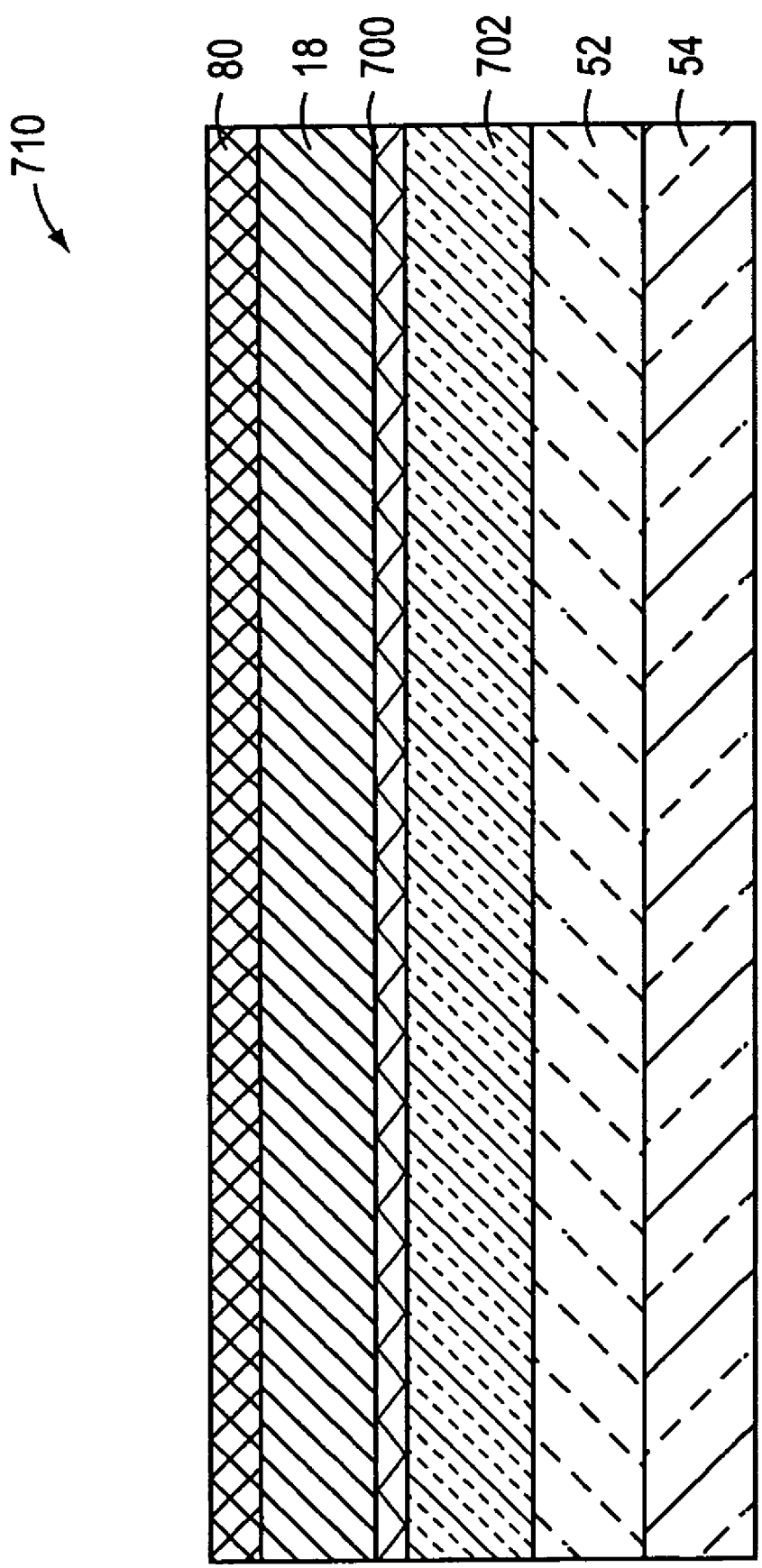

Referring to FIG. 25 as well as to FIG. 24, the bond between epitaxial wafer 8 and handle wafer 50 may be strengthened by an anneal at a relatively low temperature such as, e.g., 200–300° C. Epitaxial wafer 8 is separated from handle wafer 50 by inducing a split along cleave plane 20 with an anneal at, e.g., 300–700° C. After cleaving, a SSOI substrate 710 includes strained layer 18 disposed over first gate insulator 700, first gate electrode layer 702, insulator 52, and substrate 54. Residual portion 80 of relaxed layer 16 is disposed over strained layer 18. Relaxed layer portion 80 is selectively removed by, e.g., thermal oxidation and HF strip in the manner discussed above with reference to FIGS. 4 and 5.

Figure 26:
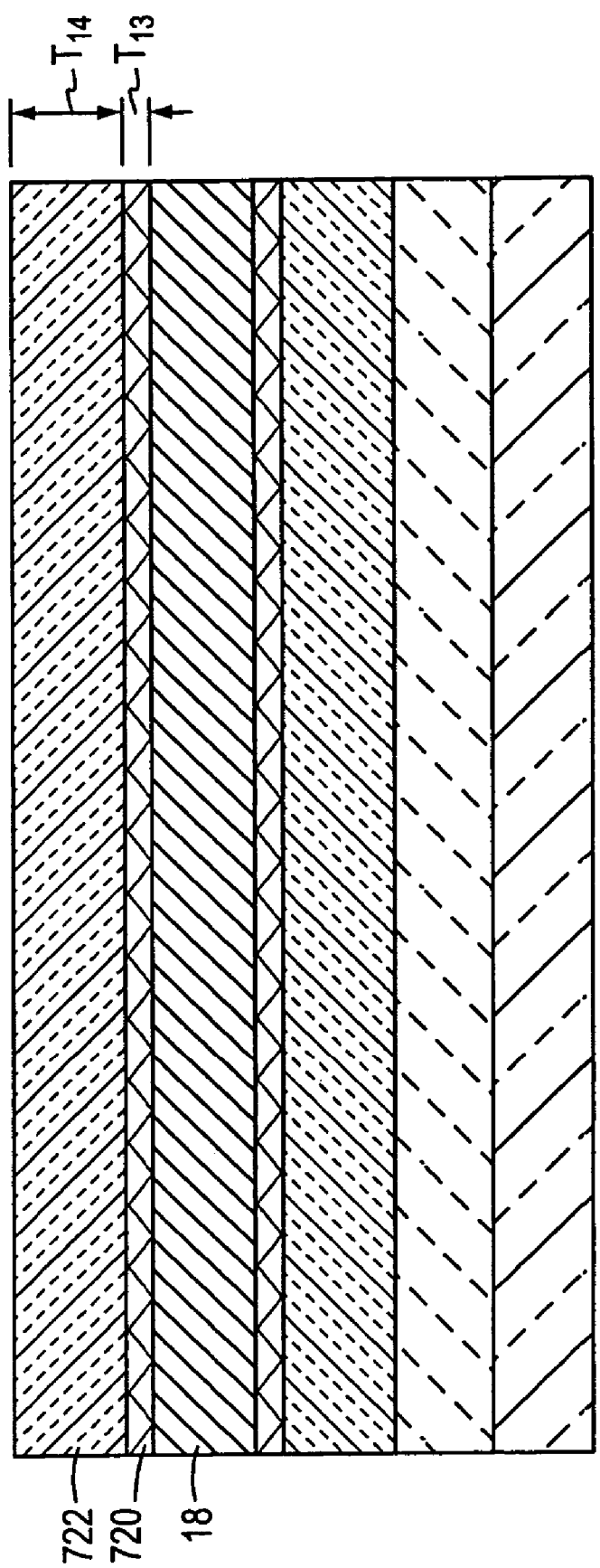

Referring to FIG. 26, a second gate insulator layer 720 is formed over strained layer 18. Second gate insulator layer 720 may include $SiO_2$ or a high-k dielectric like $HfO_2$ or HfSiON, and may be grown or deposited. First gate insulator layer 720 may have a thickness $T_{13}$ of, e.g., 10–100 Å. A second gate electrode layer 722 is formed over second gate insulator layer 720. Second gate electrode layer 722 may include a conductive material such as, for example, doped polycrystalline silicon, and may have a thickness $T_{14}$ of, for example, 500–2000 Å.

Figure 27:
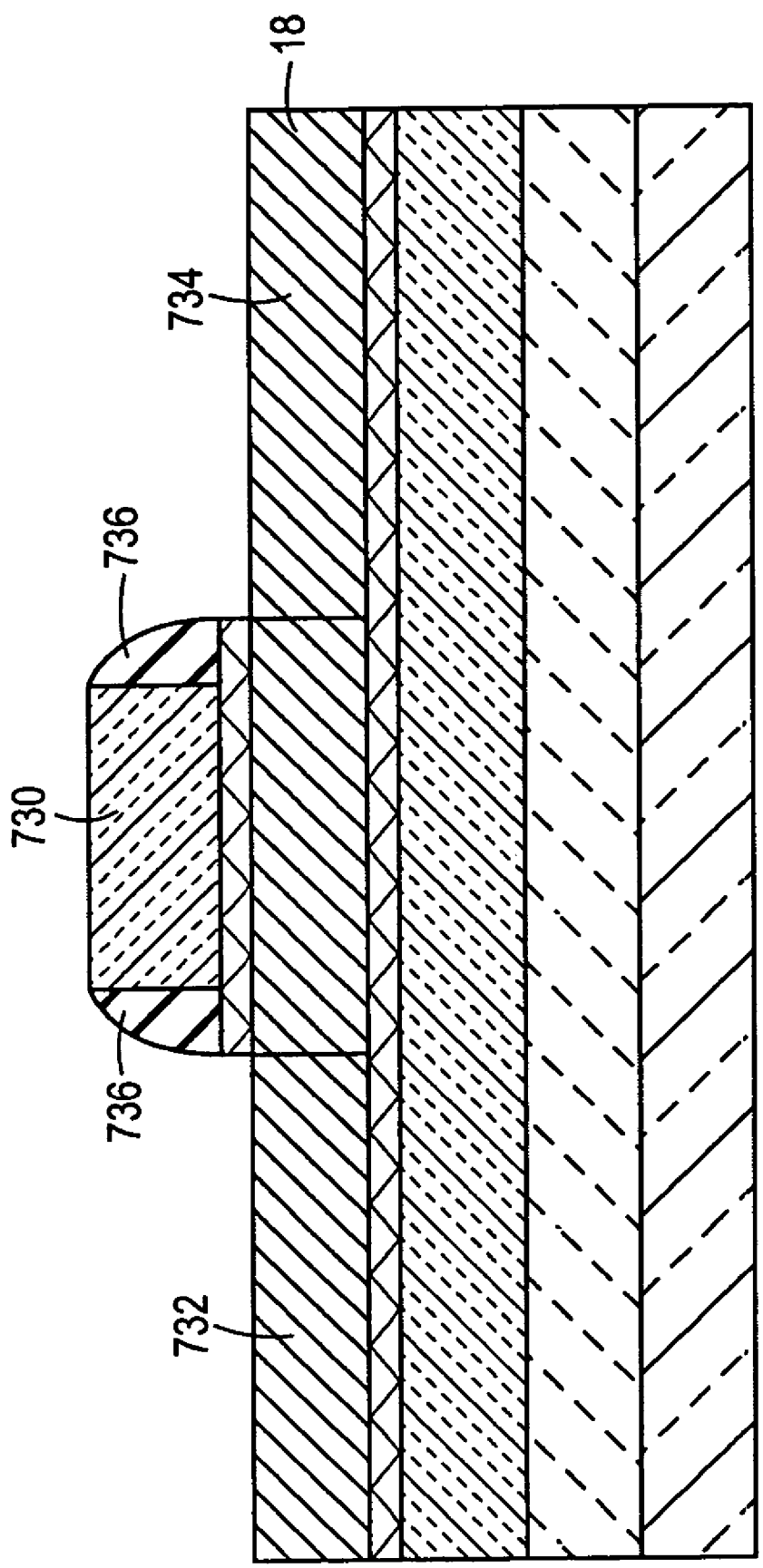

Referring to FIG. 27 as well as to FIG. 26, second gate electrode layer 722 is patterned by photolithography and RIE to define a second gate electrode 730. A source 732 and a drain 734 are formed in strained layer 18 by, e.g., implanting dopants, such as n-type or p-type dopants, into strained layer 18. A spacer dielectric layer is deposited and etched back to define dielectric sidewall spacers 736 proximate second gate electrode 730.

Figure 28:
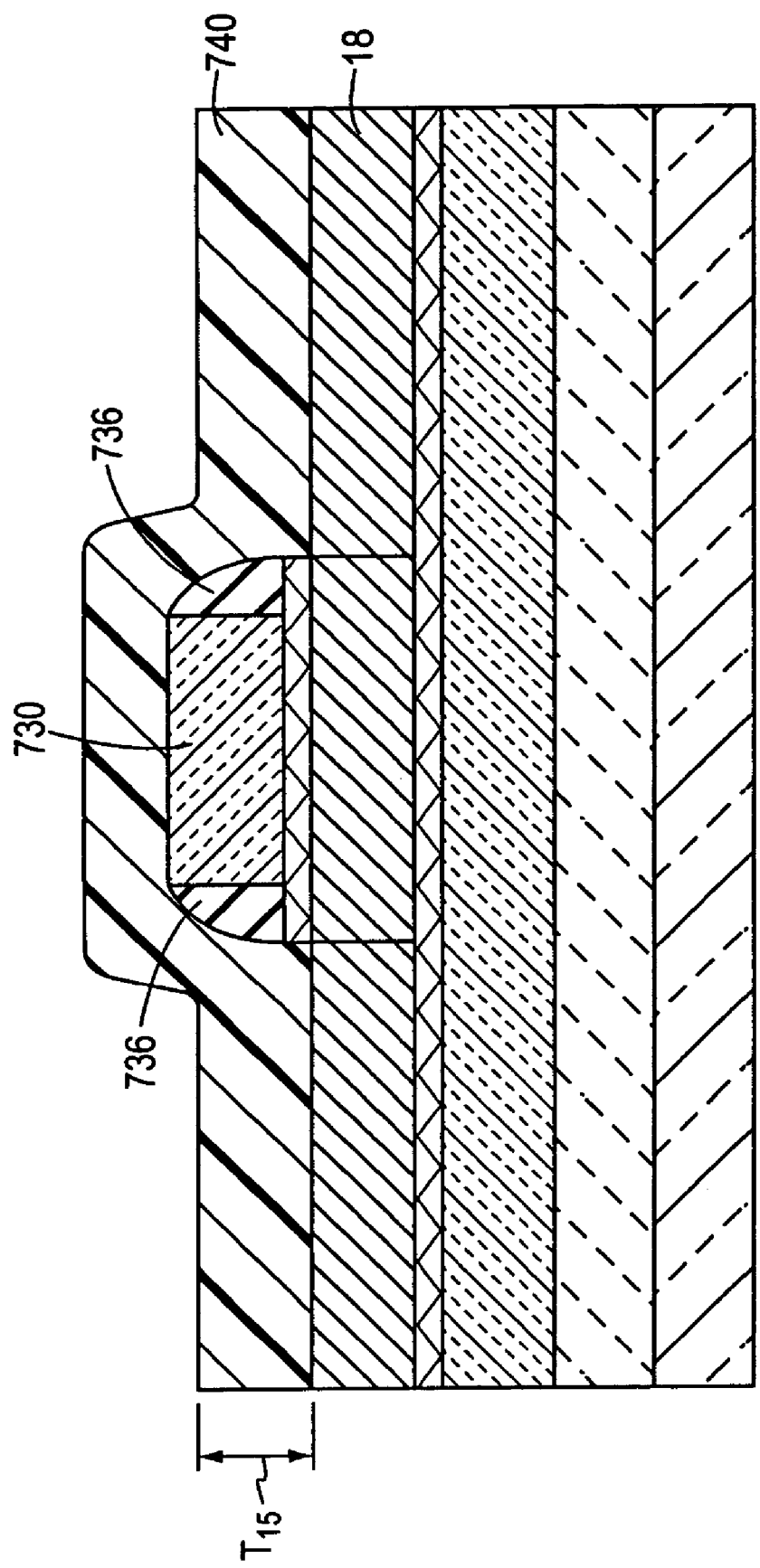

Referring to FIG. 28, a conductive spacer layer 740 is deposited over strained layer 18, second gate electrode 730, and dielectric sidewall spacers 736. Conductive spacer layer 740 includes a conductive material, such as doped polycrystalline silicon or a metal. Conductive spacer layer 740 has a thickness $T_{15}$ of, e.g., 500–2000 Å.

Figure 29:
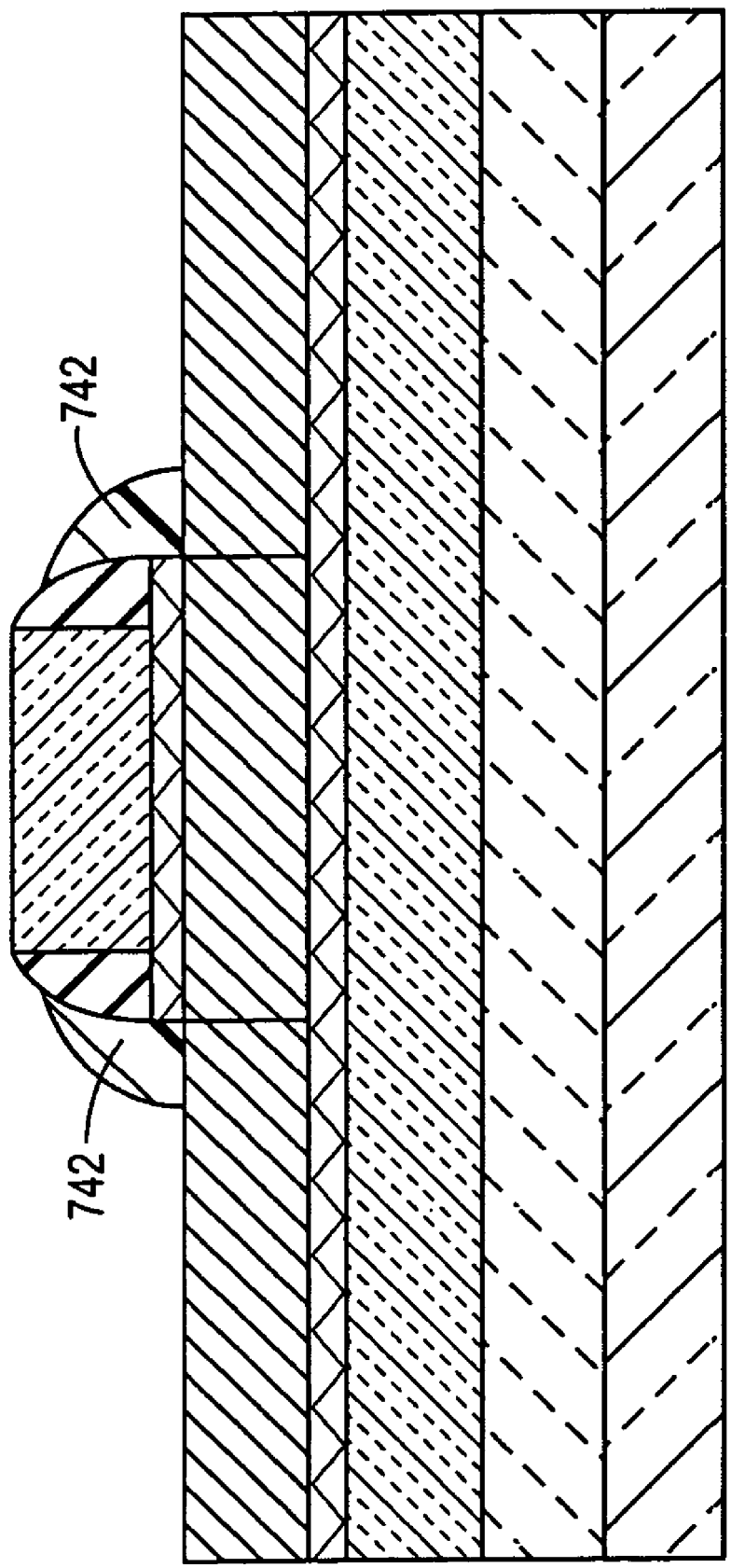

Referring to FIG. 29 as well as to FIG. 28, conductive spacer layer 740 is anisotropically etched to form conductive sidewall spacers 742, proximate dielectric sidewall spacers 736.

Figure 30:
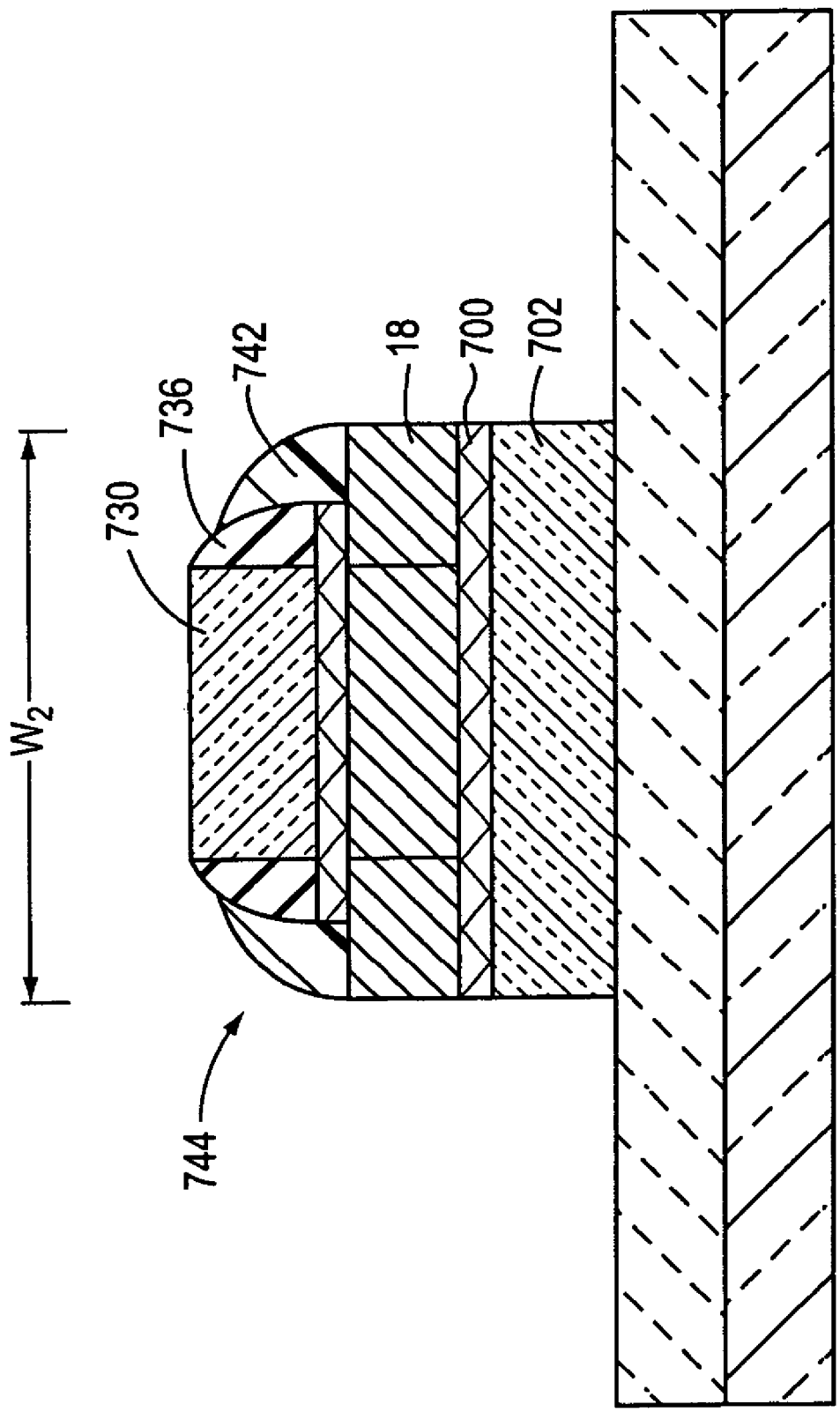

Referring to FIG. 30 as well as to FIG. 29, an RIE is performed to remove portions of strained layer 18, first gate insulator layer 700, and first gate electrode layer 702 not disposed directly below second gate electrode 730, dielectric sidewall spacers 736, and conductive sidewall spacers 742. After this RIE, a vertical structure 744 includes strained layer 18, first gate insulator layer 700, and first gate electrode layer 702 regions disposed under second gate electrode 730 and sidewall spacers 736, 742. Vertical structure 744 has a width $W_2$ of, e.g., 1000–5000 Å

Figure 31:
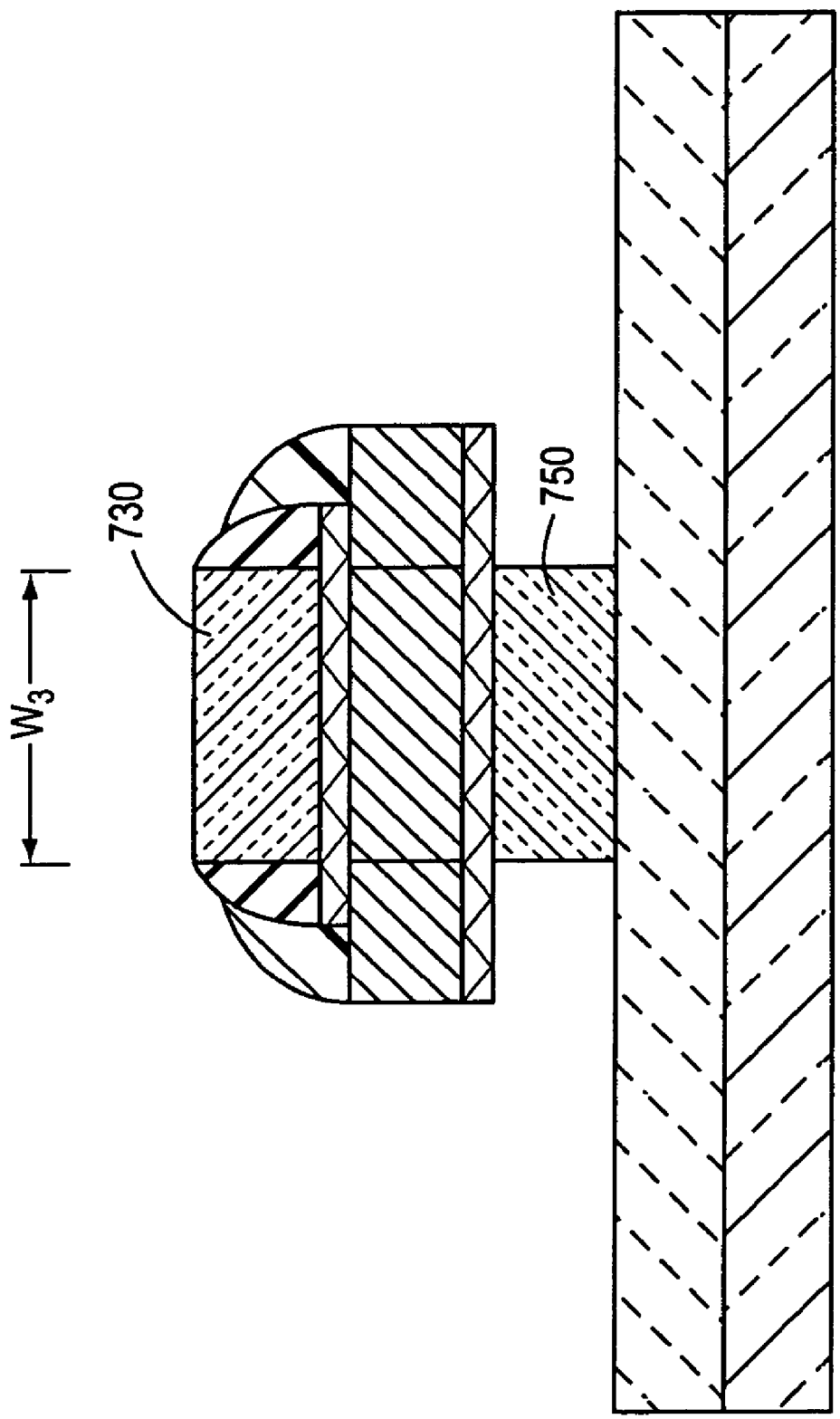

Referring to FIG. 31, an isotropic etch is performed to laterally shrink first gate electrode layer 702 region disposed under second gate electrode 730, thus defining first gate electrode 750. This isotropic etch may be a wet etch, such as hydrogen peroxide (in an embodiment in which first gate electrode layer 702 includes tungsten) or an isotropic dry etch. The width of first gate electrode layer 702 may be reduced such that both the first gate electrode 750 and the second gate electrode 730 have approximately the same width $W_3$ that is less than $W_2$, e.g., 100–2000 Å.

Figure 32:
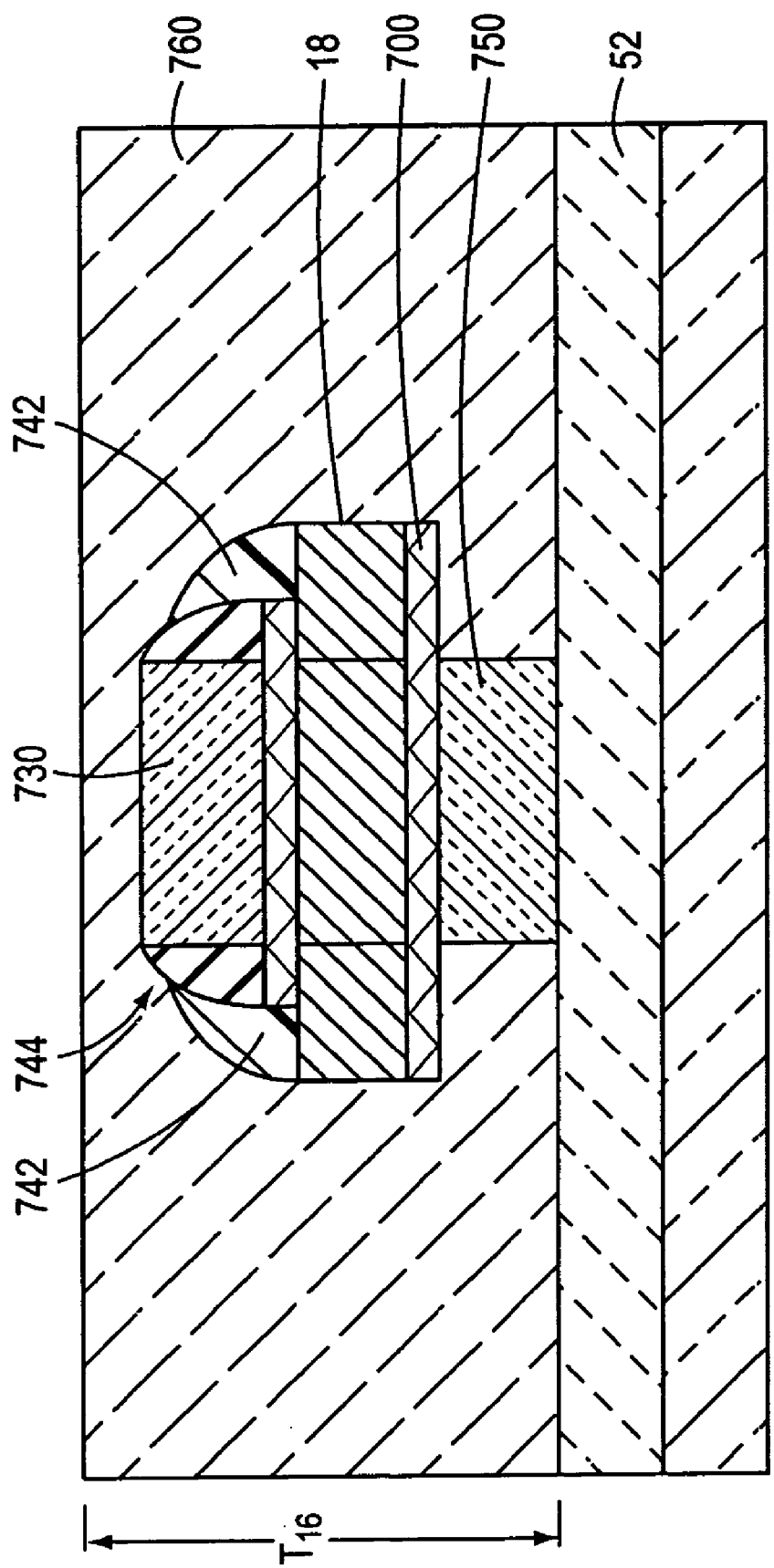

Referring to FIG. 32, a thick insulator layer 760 is deposited over insulator layer 52 and vertical structure 744, i.e., over second gate electrode 730 and conductive sidewall spacers 742, as well as proximate strained layer 18, first gate insulator layer 700, and first gate electrode 750. Thick insulator layer 760 has an initial thickness $T_{16}$ over insulator 52 of, e.g., 5000 Å. Thick insulator layer 760 is then planarized by, e.g., CMP.

Figure 33:
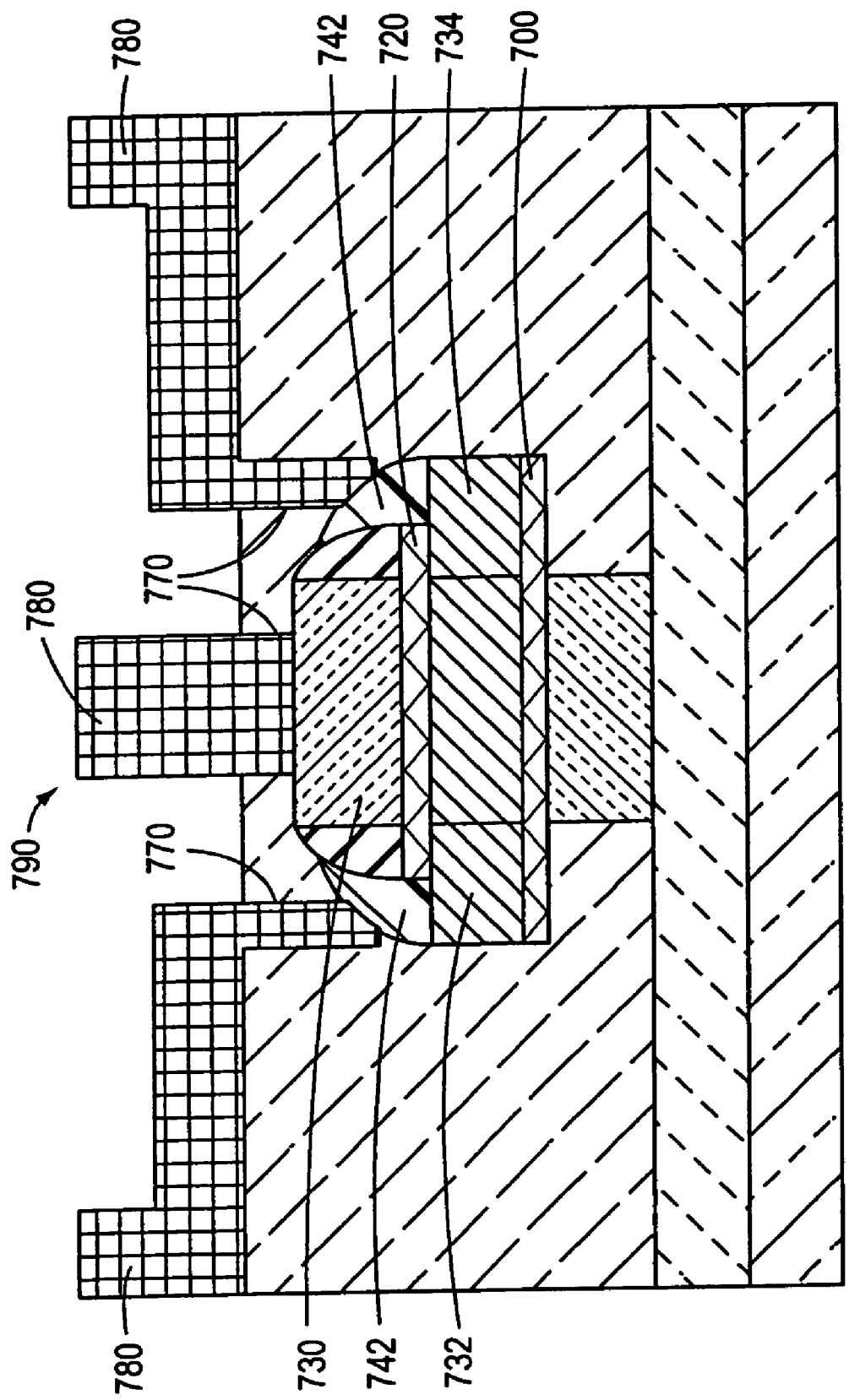
Figure 34:
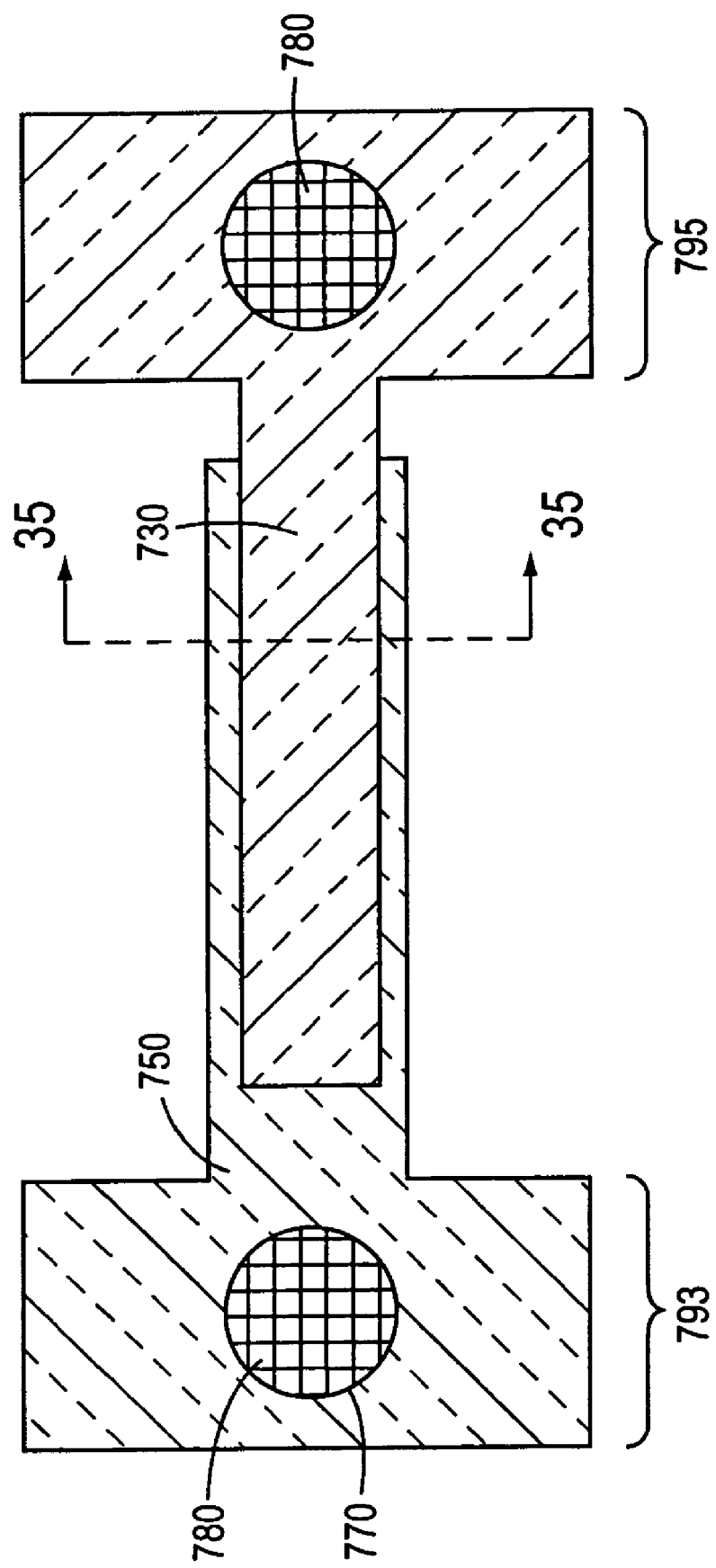
Figure 35:
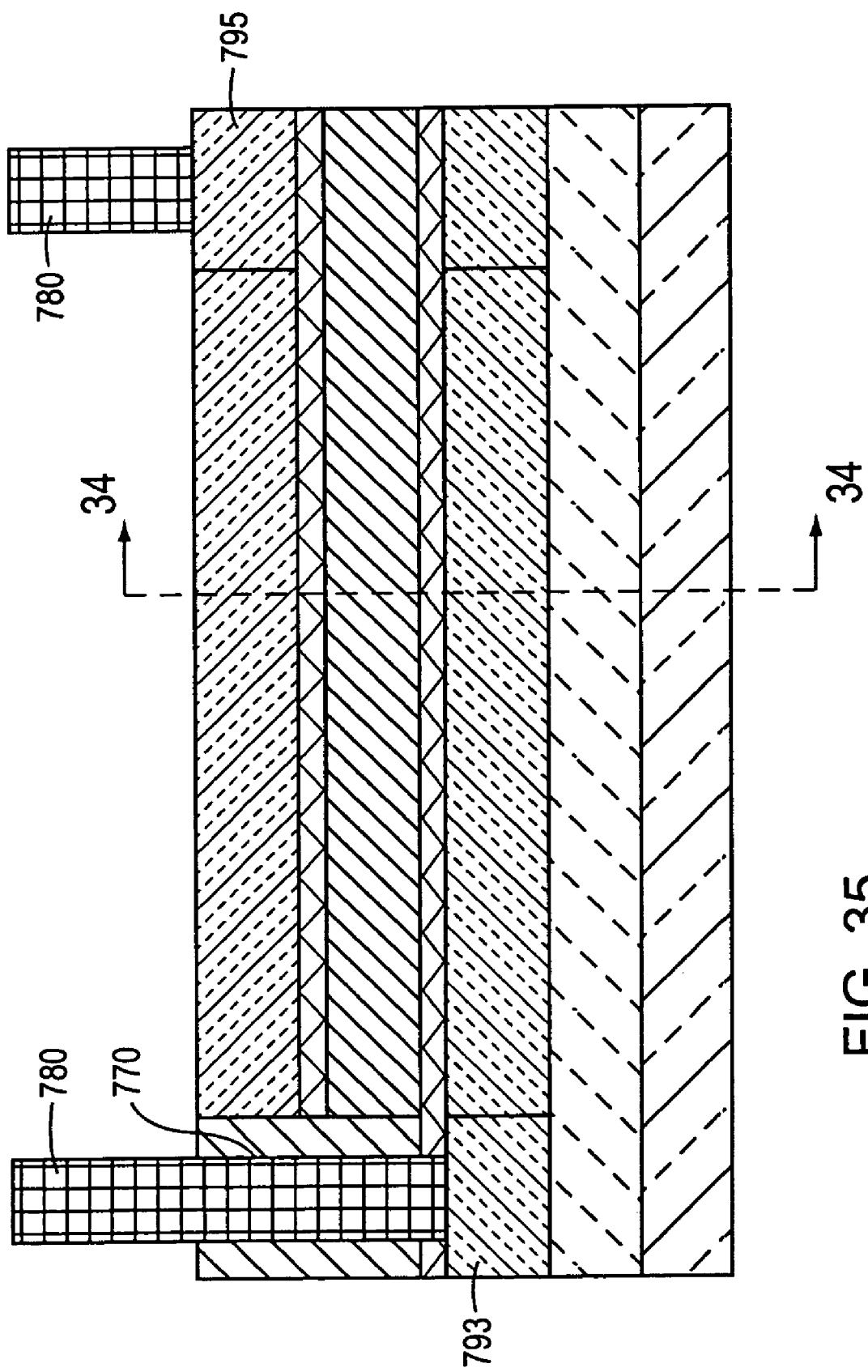

Referring to FIGS. 33–35, contact holes 770 are formed through thick insulator layer 760 to conductive sidewall spacers 742 and second gate electrode 730. Contact holes 770 may be defined by the use of photolithography and RIE. Contact holes 770 are filled with a conductive material such as, e.g., a metal such as titanium or tungsten. The conductive material is patterned by photolithography and etch to define contacts 780 to source 732, drain 734, first gate electrode 750 at a first gate electrode 793, and second gate electrode 730 at a second gate electrode 795. Double gate transistor 790 includes first gate electrode 750, second gate electrode 730, first gate insulator layer 700, second gate insulator layer 720 source 732, and drain 734.

Heterojunction Bipolar Transistor

Referring to FIG. 36 as well as to FIG. 6, a heterojunction bipolar transistor (HBT) may be formed on SSOI substrate 100, including strained layer 18, dielectric layer 52, and substrate 54. A collector 810 for the HBT is formed in a portion of strained layer 18 by the introduction of dopants into the strained layer 18 portion. Collector 810 includes a low-doped region 811 and a high-doped region 812. Low-doped region 811 is doped at a relatively low level, for example at $5 \times 10^{16}$–$1 \times 10^{18}$ atoms/cm$^3$, and has a thickness $T_{20}$ of, for example, 100–1000 Å. High-doped region 812 is doped to a level not less than the doping level of low-doped region 811, preferably to a relatively high level of, e.g., $1 \times 10^{19}$–$1 \times 10^{21}$ atoms/cm$^3$. Low-doped region 811 and high-doped region 812 are doped with the same type of dopants, and both may be doped either n-type or p-type. In an embodiment, both regions are doped n-type. Collector 810 may be electrically isolated from other devices formed on the substrate through the use of, for example, trench isolation (not shown).

A total thickness $T_{21}$ of collector 810 may be increased to improve performance by subsequent additional deposition of a material that is lattice matched to the original strained layer 18 portion. The additional material may be, for example, SiGe lattice-matched to strained layer 18.

Referring to FIG. 37, a masking layer is formed over collector 810. The masking layer may include a dielectric material, such as, e.g., SiO$_2$ or Si$_3$N$_4$. Photoresist is disposed over the masking layer and patterned to expose an area of the masking layer. This area is removed by, e.g., wet etching or RIE, to define a mask 910 disposed over strained layer 18. Mask 910 exposes a region 920 of collector 810.

Referring to FIG. 38, a base 1010 is formed over region 920 of collector 810. Base 1010 may be formed selectively by, e.g., selective deposition of a semiconductor material only over region 920 defined by mask 910. The selective deposition can be done by CVD methods, such as by APCVD, LPCVD, UHVCVD, or by MBE. In an embodiment, base 1010 may be deposited non-selectively. The non-selectively grown material will thus also form on a top surface 1012 of mask 910, and may be removed by further photolithography and etch steps. Base 1010 has a thickness $T_{22}$ of, e.g., of 50–1000 Å. In an embodiment, $T_{22}$ may be, for example 300–500 Å. Base 1010 includes a semiconductor material like Si or SiGe. In some embodiments, base 1010 is relaxed or compressively strained. The in-plane lattice constant of collector 810 (strained layer 18) was defined by relaxed layer 16 (see FIG. 1A). Therefore, in order that base 1010 be relaxed, the Ge content of base 1010 should be equal to the Ge content of relaxed layer 16 (see FIG. 1A). Similarly, in order that base 1010 be compressively strained, the Ge content of base 1010 should be greater than the Ge content of relaxed layer 16. This difference in Ge content also provides a base 1010 with a bandgap no larger than that of collector 810, which can be advantageous to device operation. In other embodiments, base 1010 is tensilely strained. In order that base 1010 be tensilely strained, the Ge content of base 1010 should be less than the Ge content of relaxed layer 16 (see FIG. 1A). Alternatively, base 1010 may be formed from the same material as collector 810, for example strained Si. Base 1010 is doped the opposite doping type as the collector, i.e., base 1010 is p-type doped for an n-type doped collector. Base 1010 may be doped during the deposition process, but may also be doped after deposition by ion implantation. Base 1010 may be doped to a level of $1 \times 10^{18}$–$1 \times 10^{19}$ atoms/cm$^3$.

In some embodiments, the base doping may be significantly higher, e.g., $\geq 10^{20}$ atoms/cm$^3$. In such embodiments, the outdiffusion of dopants from base 1010 may be deleterious to device performance, and therefore the p-type doping of base 1010 may be reduced within base 1010 in regions adjacent to an emitter 1110/base 1010 interface (see FIG. 39) and a base 1010/collector 810 interface 1014. These regions with reduced doping may have thicknesses of, e.g., 10 Å–30 Å.

In an embodiment, base 1010 contains an element with a concentration of $1 \times 10^{18}$–$1 \times 10^{20}$ atoms/cm$^3$ that suppresses the diffusion of dopants out of base 1010 during subsequent high temperature processing steps. A suitable element for diffusion suppression may be, for example, carbon. In another embodiment, base 1010 may be formed of SiGe, with the Ge content of base 1010 being not uniform across the thickness of base 1010. In this case, the Ge content of base 1010 may be graded in concentration, with higher Ge content at base-collector interface 1014 and lower Ge content at a base upper surface 1016. In other embodiments, the Ge content of base 1010 can have a trapezoidal or triangular profile.

Figure 39:
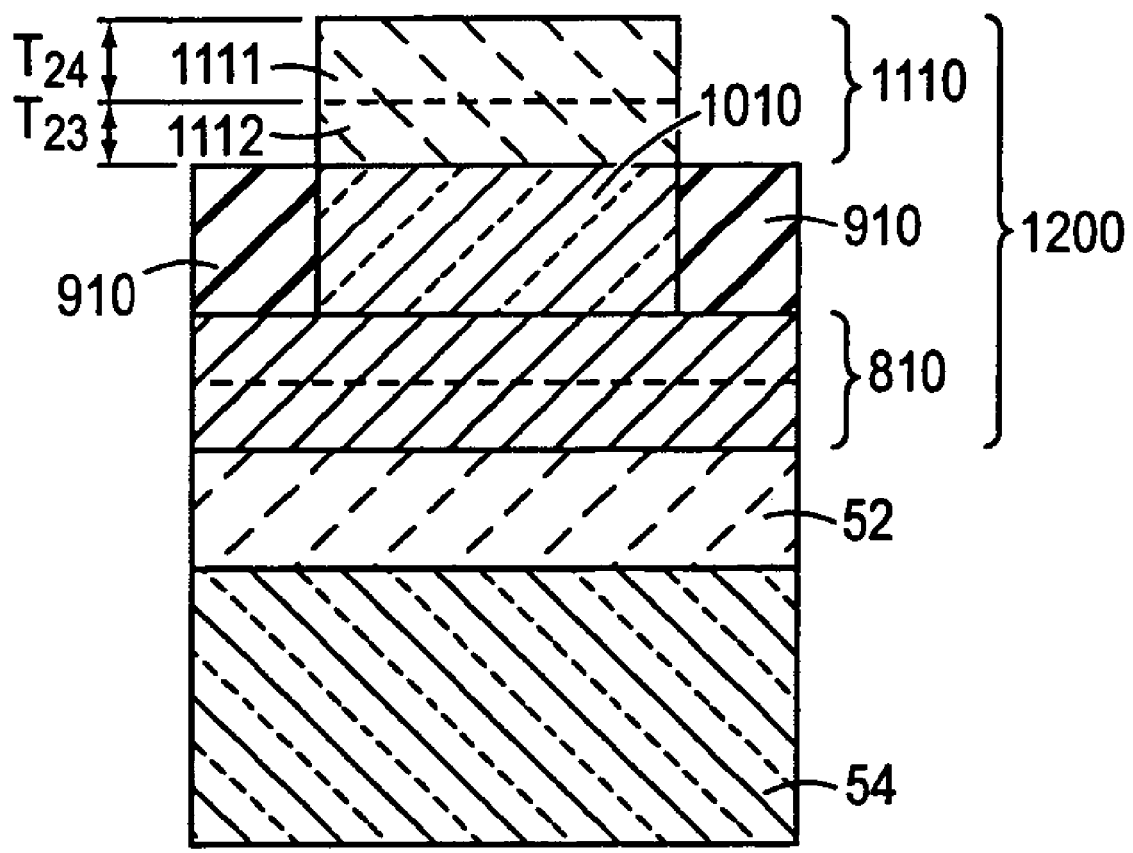

Referring to FIG. 39, an emitter 1110 is formed on base 1010. Emitter 1110 may be formed by the deposition of a semiconductor layer over base 1010 and mask 910. The semiconductor layer may be subsequently patterned by photolithographic and etch steps to define emitter 1110. Emitter 1110 may include a semiconductor material such as Si or SiGe, and may have a Ge content lower than the Ge content of base 1010. In an embodiment, emitter 1110 has a Ge content equal to that of relaxed layer 16 (see FIG. 1A) that originally defined the in-plane lattice constant of strained layer 18 (and hence collector 810). In another embodiment, the Ge content of emitter 1110 may be lower than that of relaxed layer 16, and, therefore, emitter 1110 is tensilely strained. In another embodiment, emitter 1110 may include the same material as strained layer 18/collector 810, such as, for example, strained Si.

Emitter 1110 has two regions: an upper emitter region 1111 and a lower emitter region 1112. Lower emitter region 1112 has a thickness $T_{23}$ of 10–2000 Å and is doped with a same doping type as collector 810 (and hence the opposite doping type of base 1010). For example, lower emitter region 1112 and collector 810 may be doped n-type and base 1010 may be doped p-type. Lower emitter region 1112 may be doped at a concentration of $1 \times 10^{17}$–$5 \times 10^{18}$ atoms/cm³, for example $1 \times 10^{18}$ atoms/cm³. Upper emitter region 1111 has a thickness $T_{24}$ of, for example, 100–4000 Å and is doped the same doping type as lower emitter region 1112. Upper emitter region 1111 may be doped at a concentration of $1 \times 10^{19}$–$1 \times 10^{21}$ atoms/cm³, for example $1 \times 10^{20}$–$5 \times 10^{20}$ atoms/cm³. An HBT 1200 includes collector 810, base 1010, and emitter 1110.

After formation of emitter 1110, metal contacts (not shown) may be made to each of collector 810, base 1010, and emitter 1110. Mask 910 may be removed or further patterned during the formation of metal contacts. HBT 1200 may be a standalone device or may be interconnected to other devices fabricated on SSOI substrate 100, such as, for example, transistor 200 (see FIG. 8A), finFET 655 (see FIGS. 21A and 21B), or double-gate transistor 790 (see FIG. 33).

In an embodiment, HBT 1200 may be formed on SSOS substrate 420 (see FIG. 13) by the steps described above with reference to FIGS. 36–39. In another embodiment, HBT 1200 may be formed on relaxed portion 504 of strained layer 18 (see FIG. 14) by the steps described above with reference to FIGS. 36–39. In this embodiment, collector 810 is formed in relaxed portion 504.

In another embodiment, HBT 1200 may be formed on a region of SSOI substrate 100 (see FIG. 6) in which portions of strained layer 18 and dielectric layer 52 have been removed by the steps described with reference to FIGS. 36–39. In this embodiment, collector 810 is formed in substrate 54 and may be increased in thickness by deposition of another semiconductor layer as described above. This configuration enables the interconnection of HBT 1200 formed directly on semiconductor substrate 54 with devices formed on other portions of SSOI substrate 100, for example transistor 200 of FIG. 8A.

Formation of SSOI Substrate by Use of a Porous Semiconductor Substrate

Figure 40A:
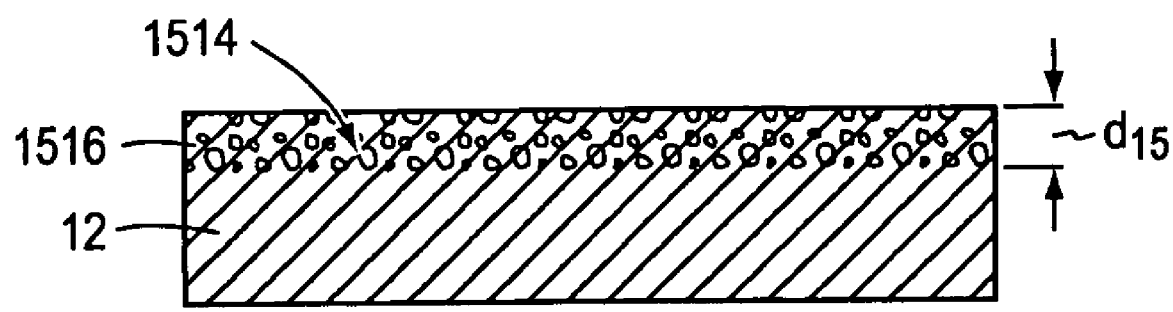
FIGS. 40A–41D are schematic cross-sectional views of substrates illustrating alternative methods for fabricating an SSOI substrate.

Referring to FIGS. 40A–40E, SSOI structure 100 (see FIG. 6) may be formed by the use of a porous semiconductor substrate. Referring to FIG. 40A, substrate 12 may be formed of a semiconductor, such as Si, Ge, or SiGe. A plurality of pores 1514, i.e., microvoids, are formed to define a porous layer 1516 in a portion of substrate 12. Pores 1514 may have a median diameter of 5–10 nm and a pitch of 10–50 nm. Porous layer 1516 may have a porosity of 10–50% and may extend a depth of $d_{15}$ into substrate 12 of approximately 1–5 µm.

Figure 40B:
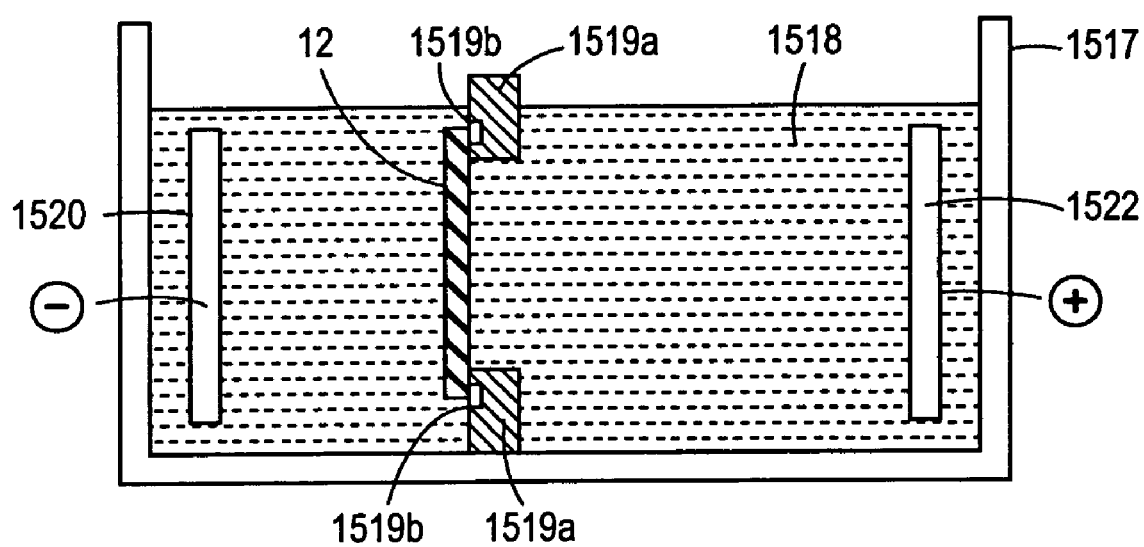

Referring to FIG. 40B, pores 1514 may be formed by, for example, submerging substrate 12 into a vessel 1517 containing an electrolyte 1518, such as hydrofluoric acid (HF), possibly mixed with ethanol, with a cathode 1520 and an anode 1522 disposed in the electrolyte 1518. A back surface chucking holder 1519*a* with a vacuum pad 1519*b* may hold substrate 12 while it is submerged in vessel 1517. A current may be generated between cathode 1520 and anode 1522, through substrate 12, resulting in the electrochemical etching of substrate 12, thereby forming pores 1514 at a top surface 1524 of substrate 12. In an embodiment, prior to the formation of pores 1514, substrate 12 may be planarized, e.g., by CMP.

Figure 40C:
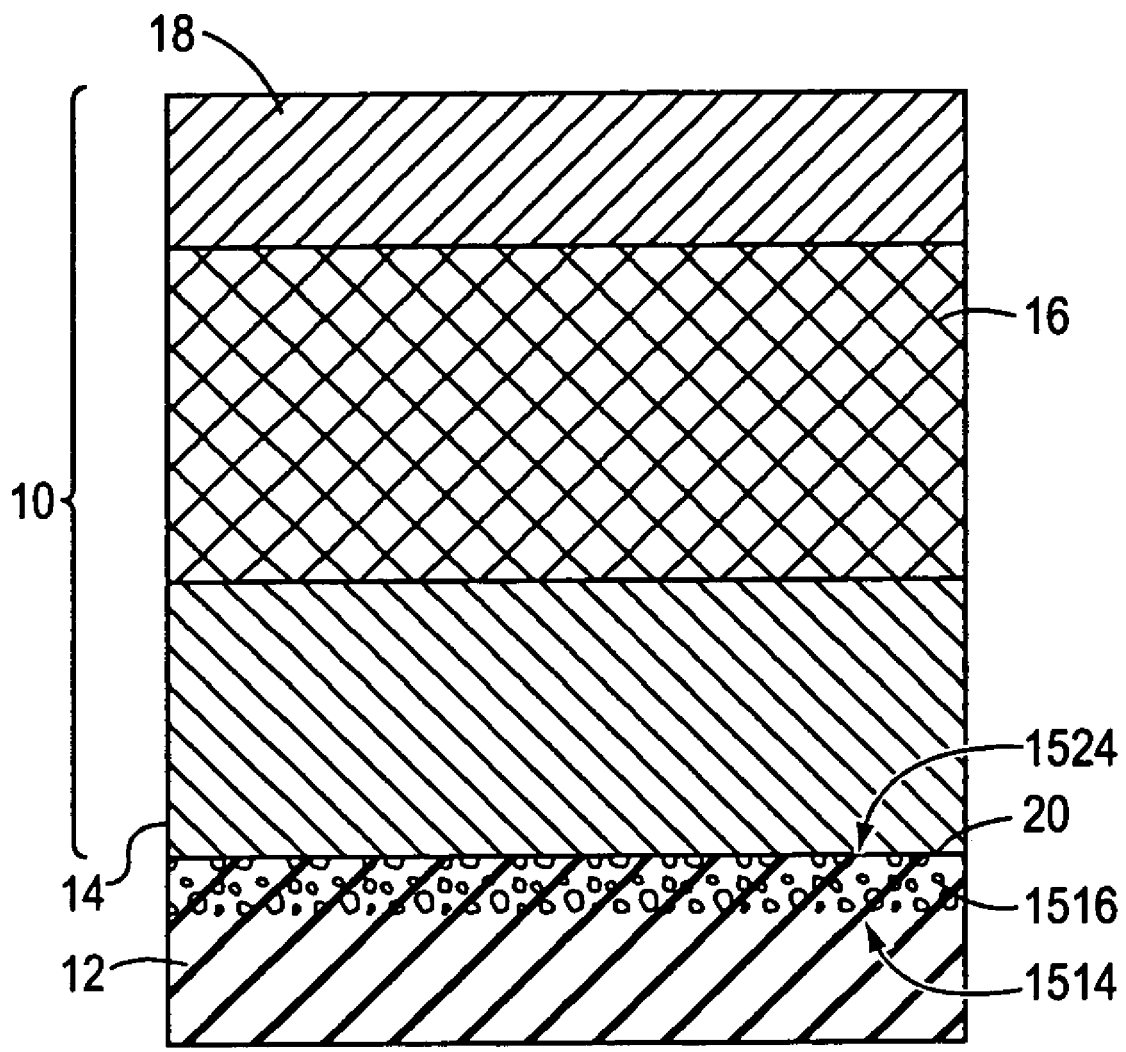

Referring to FIG. 40C, after the formation of pores 1514, a plurality of layers 10 may be formed over porous top surface 1524 of substrate 12, as described with reference to FIG. 1A. Layers 10 may include, for example, graded buffer layer 14, relaxed layer 16, and strained layer 18. Pores 1514 define cleave plane 20 in porous layer 1516 of substrate 12.

Figure 40D:
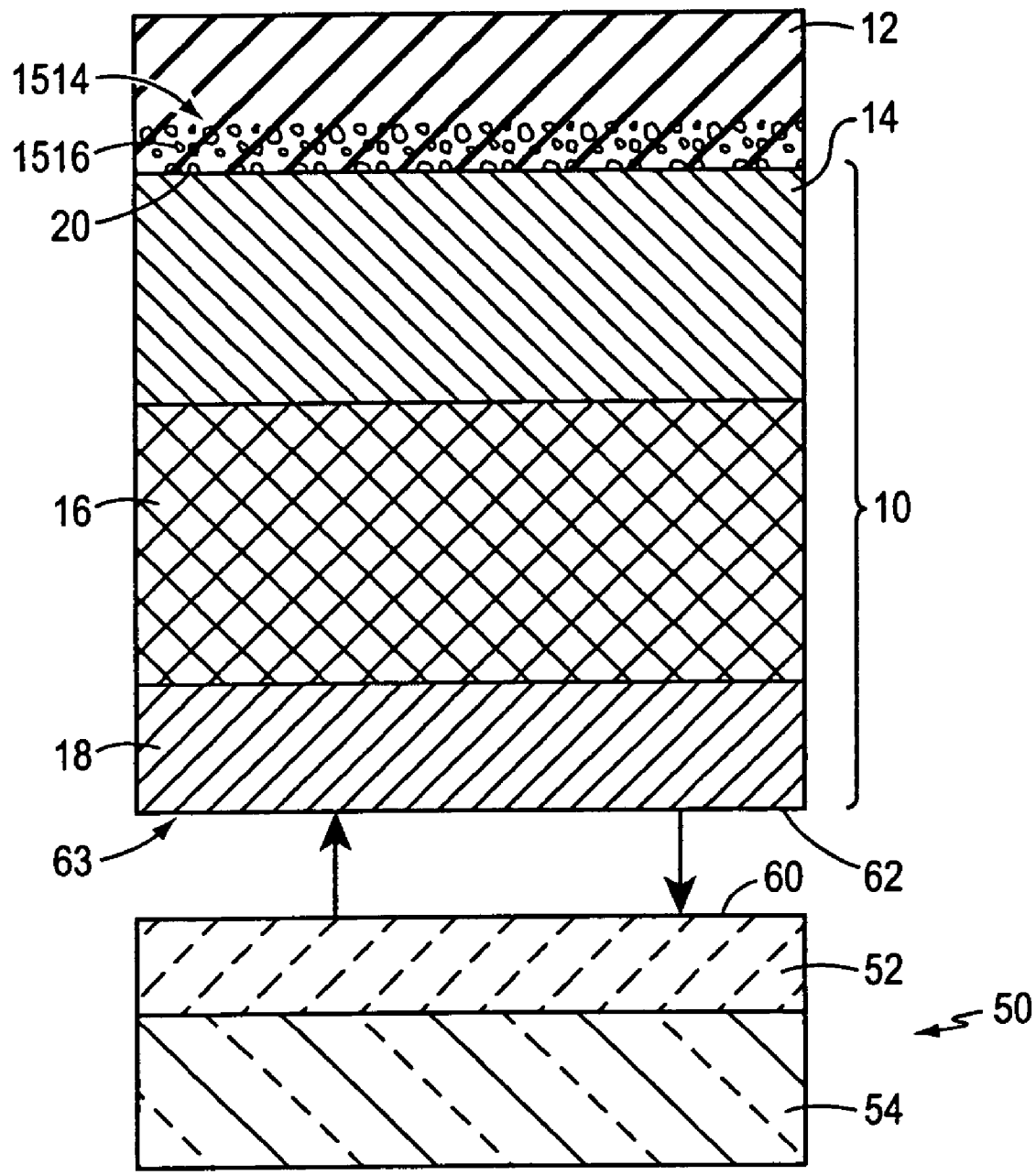

Referring to FIG. 40D, substrate 12 with layers 10 is bonded to handle wafer 50, including semiconductor substrate 54 and dielectric layer 52, as described with reference to FIG. 3. Prior to bonding, a dielectric layer may be formed on a top surface of layers 10 to facilitate the bonding process and to serve as an insulator layer in the final substrate structure.

Figure 40E:
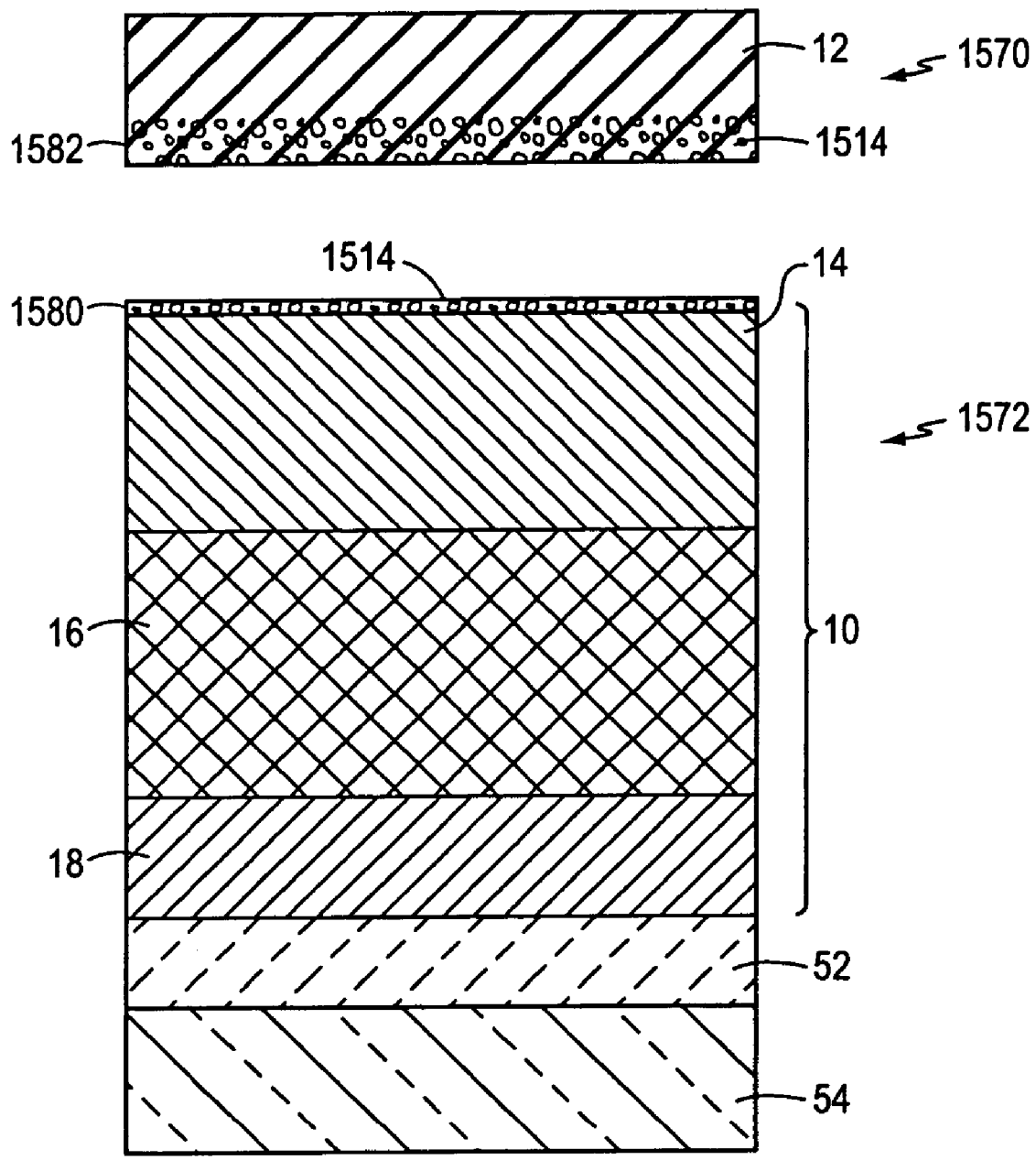

Referring to FIG. 40E as well as to FIG. 40D, a split is induced at cleave plane 20 by, for example, cleaving porous layer 1516 by a water or an air jet. The split results in the formation of two separate wafers 1570, 1572. One of these wafers (1572) has graded layer 14 and relaxed layer 16 (see FIG. 40*c*) disposed over strained layer 18, with a first portion 1580 of substrate 12 disposed over graded layer 14. First portion 1580 of substrate 12 may be just trace amounts of material surrounding pores 1514. Strained layer 18 is in contact with dielectric layer 52 on semiconductor substrate 54. The other of these wafers (1570) includes a second portion 1582 of substrate 12, including the bulk of substrate 12 with perhaps trace amounts of material surrounding pores 1514.

Referring to FIG. 6 as well as to FIG. 40E, first portion 1580 of substrate 12 is removed from graded layer 14 by a wet chemical cleaning process utilizing, for example a mixture of hydrogen peroxide ($H_2O_2$) and HF. Graded layer 14 and relaxed layer 16 are removed in any one of the methods described for the removal of relaxed layer portion 80 with reference to FIGS. 4 and 5. Removal of graded and relaxed layers 14, 16 results in the formation of SSOI substrate 100.

Figure 41A:
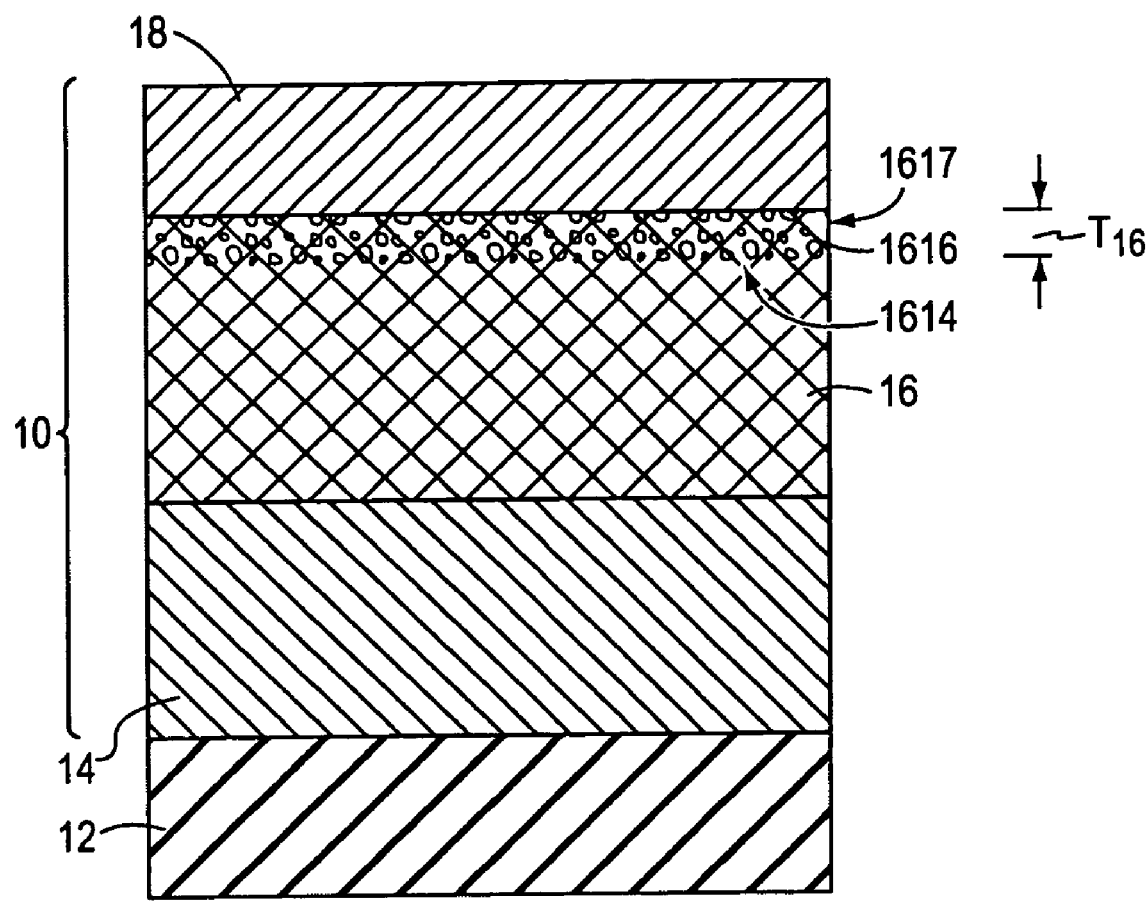

Referring to FIG. 41A, SSOI substrate 100 (see FIG. 6) may also be formed by the use of porous intermediate layers. For example, plurality of layers 10 may be formed over substrate 12, layers 10 including graded layer 14, relaxed layer 16, and strained layer 18 (see FIG. 1A). Prior to the formation of strained layer 18, a plurality of pores 1614 may be formed in a top portion of relaxed layer 16, thereby defining a porous layer 1616 in a top portion 1617 of relaxed layer 16. Pores 1614 may be formed by the methods described above with reference to the formation of pores 1514 in FIG. 40B. Porous layer 1616 may have a thickness $T_{16}$ of, e.g., 1–5 µm. Strained layer 18 may then be formed directly over porous layer 1616. Pores 1614 define cleave plane 20 in porous layer 1616.

Figure 41B:
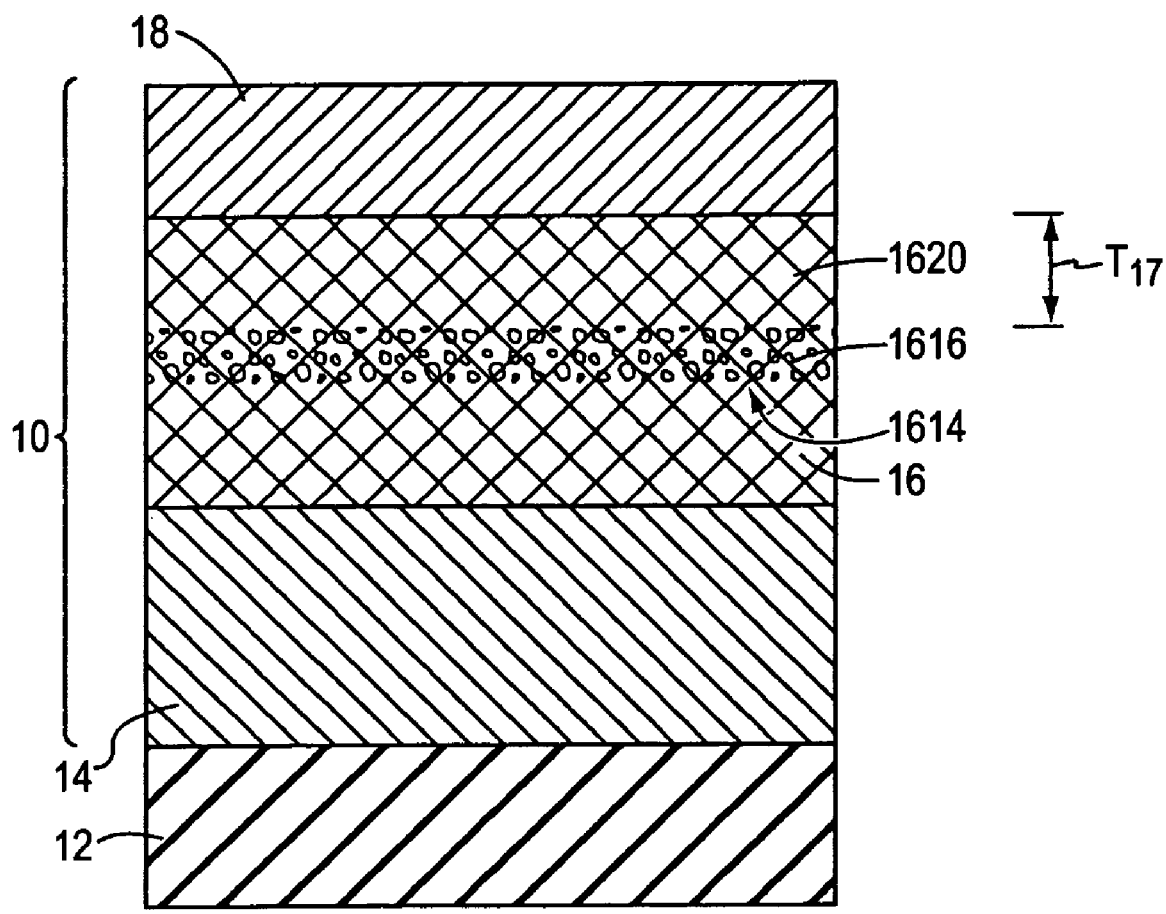

Referring to FIG. 41B, in an alternative embodiment, after the formation of porous layer 1616 in a portion of relaxed layer 16, a second relaxed layer 1620 may be formed over relaxed layer 16 including porous layer 1616. Second relaxed layer 1620 may include the same material from which relaxed layer 16 is formed, e.g., uniform $Si_{1-x}Ge_x$ having a Ge content of, for example, 10–80% (i.e., x=0.1–0.8) and having a thickness $T_{17}$ of, e.g., 5–100 nm. In some embodiments, $Si_{1-x}Ge_x$ may include $Si_{0.70}Ge_{0.30}$ and $T_{17}$ may be approximately 50 nm. Second relaxed layer 1620 may be fully relaxed, as determined by triple axis X-ray diffraction, and may have a threading dislocation density of <1×10$^6$/cm$^2$, as determined by etch pit density (EPD) analysis. Strained layer 18 may be formed over second relaxed layer 1620. Pores 1614 define cleave plane 20 in porous layer 1616.

Figure 41C:
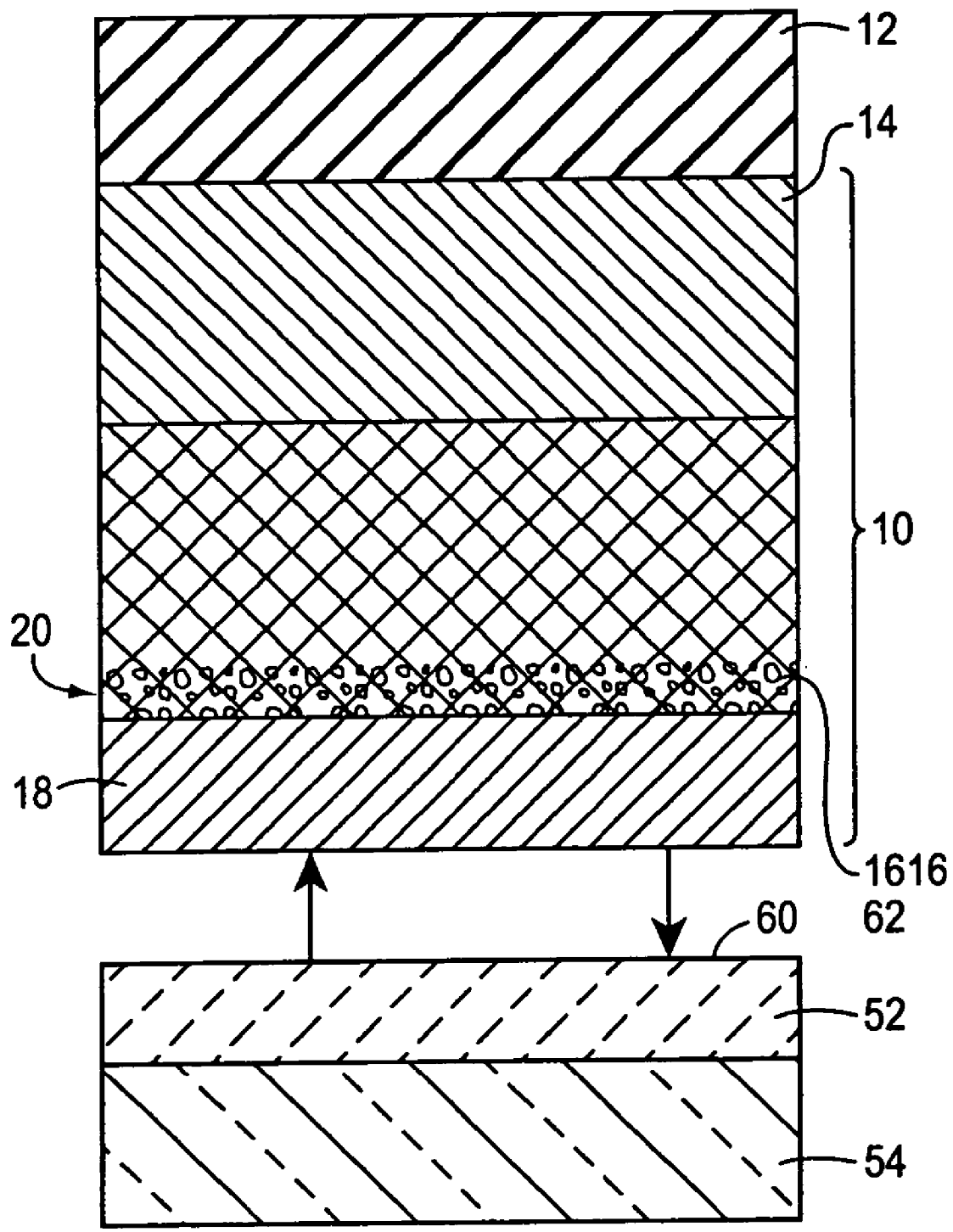

Referring to FIG. 41C, substrate 12 with layers 10 is bonded to handle wafer 50, including semiconductor substrate 54 and dielectric layer 52, as described with reference to FIG. 3.

Figure 41D:
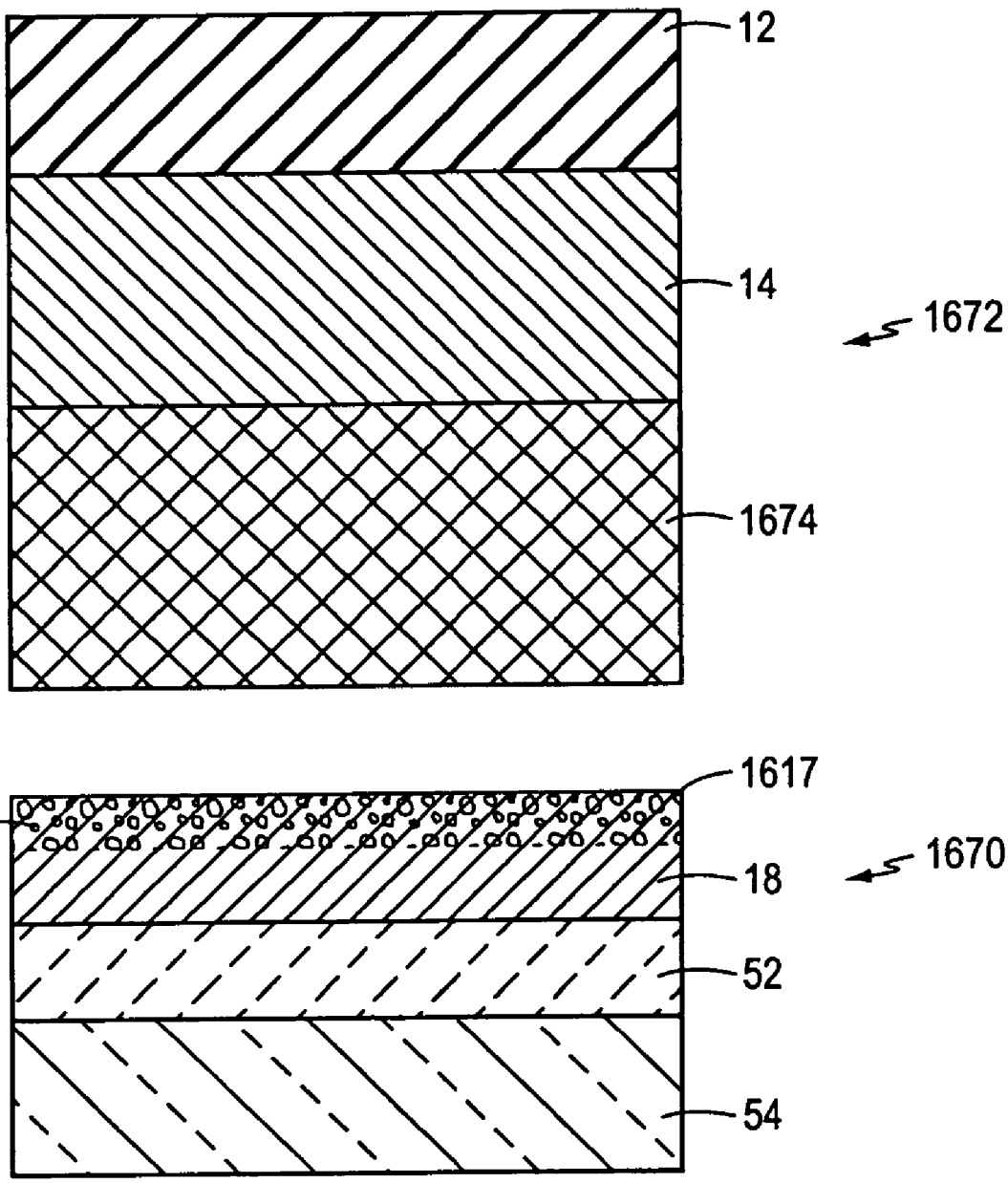

Referring to FIG. 41D as well as to FIG. 41C, a split is induced at cleave plane 20 by, for example, cleaving porous layer 1616 by a water or an air jet. The split results in the formation of two separate wafers 1670, 1672. One of these wafers (1670) has top portion 1617 of relaxed layer 16 (see FIG. 41A) disposed over strained layer 18. Strained layer 18 is in contact with dielectric layer 52 on semiconductor substrate 54. The other of these wafers (1672) includes the substrate 12, graded layer 14, and a bottom portion 1674 of relaxed layer 16.

Referring to FIG. 6 as well as to FIG. 41D, top portion 1617 of relaxed layer 16 is removed in any one of the methods described for the removal of relaxed layer portion 80 with reference to FIGS. 4 and 5. Removal of top portion 1617 of relaxed layer 16 results in the formation of SSOI substrate 100.

The bonding of strained silicon layer 18 to dielectric layer 52 has been experimentally demonstrated. For example, strained layer 18 having a thickness of 54 nanometers (nm) along with ~350 nm of $Si_{0.70}Ge_{0.30}$ have been transferred by hydrogen exfoliation to Si handle wafer 50 having dielectric layer 52 formed from thermal $SiO_2$ with a thickness of approximately 100 nm. The implant conditions were a dose of 4×10$^{16}$ ions/cm$^3$ of $H_2^+$ at 75 keV. The anneal procedure was 1 hour at 550° C. to split the SiGe layer, followed by a 1 hour, 800° C. strengthening anneal. The integrity of strained Si layer 18 and good bonding to dielectric layer 52 after layer transfer and anneal were confirmed with cross-sectional transmission electron microscopy (XTEM). An SSOI structure 100 was characterized by XTEM and analyzed via Raman spectroscopy to determine the strain level of the transferred strained Si layer 18. An XTEM image of the transferred intermediate SiGe/strained Si/SiO$_2$ structure showed transfer of the 54 nm strained Si layer 18 and ~350 nm of the $Si_{0.70}Ge_{0.30}$ relaxed layer 16. Strained Si layer 18 had a good integrity and bonded well to SiO$_2$ 54 layer after the annealing process.

XTEM micrographs confirmed the complete removal of relaxed SiGe layer 16 after oxidation and HF etching. The final structure includes strained Si layer 18 having a thickness of 49 nm on dielectric layer 52 including SiO$_2$ and having a thickness of 100 nm.

Raman spectroscopy data enabled a comparison of the bonded and cleaved structure before and after SiGe layer 16 removal. Based on peak positions the compostion of the relaxed SiGe layer and strain in the Si layer may be calculated. See, for example, J. C. Tsang, et al., J. Appl. Phys. 75 (12) p. 8098 (1994), incorporated herein by reference. The fabricated SSOI structure 100 had a clear strained Si peak visible at ~511/cm. Thus, the SSOI structure 100 maintained greater than 1% tensile strain in the absence of the relaxed SiGe layer 16. In addition, the absence of Ge—Ge, Si—Ge, and Si—Si relaxed SiGe Raman peaks in the SSOI structure confirmed the complete removal of SiGe layer 16.

In addition, the thermal stability of the strained Si layer was evaluated after a 3 minute 1000° C. rapid thermal anneal (RTA) to simulate an aggregate thermal budget of a CMOS process. A Raman spectroscopy comparision was made of SSOI structure 100 as processed and after the RTA step. A scan of the as-bonded and cleaved sample prior to SiGe layer removal was used for comparision. Throughout the SSOI structure 100 fabrication processs and subsequent anneal, the strained Si peak was visible and the peak position did not shift. Thus, the strain in SSOI structure 100 was stable and was not diminished by thermal processing. Furthermore, bubbles or flaking of the strained Si surface 18 were not observed by Nomarski optical microscopy after the RTA, indicating good mechanical stability of SSOI structure 100.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method for forming a structure, the method comprising:
   providing a substrate having a dielectric layer disposed thereon, and a first strained semiconductor layer disposed in contact with the dielectric layer; and
   forming a fin-field-effect transistor on the substrate by:
      patterning the first strained semiconductor layer to define a source region, a drain region, and at least one fin disposed between the source and the drain regions,
      forming a dielectric layer, at least a portion of the dielectric layer being disposed over the fin, and
      forming a gate over the dielectric layer portion disposed over the fin.

2. The method of claim 1, wherein the first strained semiconductor layer comprises at least one of a group II, a group III, a group IV, a group V, or a group VI element.

3. The method of claim 1, wherein the strained semiconductor layer is tensilely strained.

4. The method of claim 3, wherein the strained semiconductor layer comprises tensilely strained silicon.

5. The method of claim 1, wherein the strained semiconductor layer is compressively strained.

6. The method of claim 5, wherein the strained semiconductor layer comprises compressively strained germanium.

* * * * *